US012426427B2

United States Patent
Choi et al.

(10) Patent No.: US 12,426,427 B2
(45) Date of Patent: Sep. 23, 2025

(54) DISPLAY DEVICE

(71) Applicant: Samsung Display Co., LTD., Yongin-si (KR)

(72) Inventors: Jin Woo Choi, Seoul (KR); Min Woo Kim, Hwaseong-si (KR); Sung Kook Park, Suwon-si (KR); Jin Taek Park, Seoul (KR); Sung Eun Baek, Suwon-si (KR); Dae Ho Song, Hwaseong-si (KR); Hyung Il Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 517 days.

(21) Appl. No.: 17/670,304

(22) Filed: Feb. 11, 2022

(65) Prior Publication Data

US 2022/0352246 A1 Nov. 3, 2022

(30) Foreign Application Priority Data

Apr. 30, 2021 (KR) ........................ 10-2021-0056635

(51) Int. Cl.
*H10H 29/14* (2025.01)
*H10H 20/814* (2025.01)
(Continued)

(52) U.S. Cl.
CPC ........ *H10H 29/142* (2025.01); *H10H 20/814* (2025.01); *H10H 20/8312* (2025.01); *H10H 20/8514* (2025.01)

(58) Field of Classification Search
CPC ..... H01L 33/10; H01L 33/382; H01L 33/505; H01L 33/44; H01L 33/508;
(Continued)

(56) References Cited

U.S. PATENT DOCUMENTS

2015/0362165 A1\* 12/2015 Chu .................. H01L 33/32
362/235
2019/0088820 A1\* 3/2019 Danesh .................. H01L 25/13
(Continued)

FOREIGN PATENT DOCUMENTS

JP 2021035604 A \* 3/2021 ............. H01L 33/62
KR 2020-0127777 A 11/2020
(Continued)

OTHER PUBLICATIONS

Choi et al., Light emitting diode (LED) display device, Mar. 10, 2021, machine translation of KR 20210026150 A, pp. 1-18. (Year: 2021).\*

*Primary Examiner* — Natalia A Gondarenko
(74) *Attorney, Agent, or Firm* — Womble Bond Dickinson (US) LLP

(57) ABSTRACT

A display device includes a first substrate, a plurality of light-emitting elements on the first substrate and spaced from each other, wherein each of the plurality of light-emitting elements extends in a thickness direction of the first substrate, a common electrode on the first substrate and the plurality of light-emitting elements, a first insulating layer on the common electrode and the plurality of light-emitting elements, and a first reflective layer on side surfaces of the plurality of light-emitting elements with the first insulating layer therebetween, wherein the common electrode is in contact with a portion of the side surface of each of the plurality of light-emitting elements.

25 Claims, 38 Drawing Sheets

(51) Int. Cl.
*H10H 20/831* (2025.01)
*H10H 20/851* (2025.01)

(58) Field of Classification Search
CPC ..... H01L 2933/0058; H01L 2933/0041; H01L 2933/0091; H01L 25/0753; H01L 27/124; H01L 27/156; H01L 33/36; H01L 33/38; H01L 33/385; H01L 33/387; H01L 33/405; H01L 33/46; H01L 33/48; H01L 33/483; H01L 33/50; H01L 33/60; H01L 33/62; H01L 27/12–1255; H01L 27/1214–1296; H01L 27/1248; H01L 27/1262; H01L 29/1604; H01L 29/78663; G02B 5/201; G02F 1/1368; G02F 1/133345; G02F 1/1334; G02F 1/133512; G02F 1/133514; G02F 1/133723; G02F 1/136; G02F 1/136213; G02F 1/136227; G02F 1/136286; G02F 1/13685; H10H 20/032; H10H 20/81; H10H 20/813; H10H 20/814; H10H 20/82; H10H 20/83–835; H10H 20/831; H10H 20/8314; H10H 20/832; H10H 29/032; H10H 29/82; H10H 29/832–8325; H10H 29/842–8421; H10H 29/855–856; H10H 29/882; H10H 20/84–841; H10H 20/882; H10H 20/855–856; H10H 20/825; H10H 20/034; H10H 20/0363; H10D 86/0227
USPC .................................. 257/72; 362/235, 227
See application file for complete search history.

(56) References Cited

U.S. PATENT DOCUMENTS

| | | | | |
|---|---|---|---|---|
| 2020/0343410 | A1* | 10/2020 | Iguchi | ................ H01L 25/0753 |
| 2021/0020619 | A1* | 1/2021 | Iguchi | ................... H01L 33/405 |
| 2021/0407977 | A1* | 12/2021 | Tian | ................... H01L 25/0753 |
| 2022/0165921 | A1 | 5/2022 | Choi et al. | |
| 2024/0136491 | A1* | 4/2024 | Miura | ..................... H01L 33/58 |

FOREIGN PATENT DOCUMENTS

| | | | | |
|---|---|---|---|---|
| KR | 2021-0005454 A | | 1/2021 | |
| KR | 2021026150 A | * | 3/2021 | ............. H01L 33/50 |
| KR | 2022-0070141 A | | 5/2022 | |

* cited by examiner

DISPLAY DEVICE

CROSS-REFERENCE TO RELATED APPLICATION

This application claims priority to and the benefit of Korean Patent Application No. 10-2021-0056635 filed on Apr. 30, 2021 in the Korean Intellectual Property Office, the entire content of which is incorporated by reference herein.

BACKGROUND

1. Field

The present disclosure relates to a display device.

2. Description of Related Art

As information society develops, demand for a display device for displaying an image is increasing in various forms. The display device may include a planarized panel display device such as a liquid crystal display device, a field emission display device, or a light-emitting display device. The light-emitting display device may include an organic light-emitting display device including an organic light-emitting diode (OLED) element as a light-emitting element, an inorganic light-emitting display device including an inorganic semiconductor element as a light-emitting element, or may have an ultra-small light-emitting diode or a micro light-emitting diode element as a light-emitting element.

Recently, a head mounted display (HMD) including the light emitting display device is being developed. The head mounted display is a spectacle-type monitor device for virtual reality (VR) or augmented reality (AR) which a user wears in a form of glasses or a helmet, and which has a focal point at a position closer to user's eyes.

A high-resolution ultra-small light-emitting diode display panel including an ultra-small light-emitting diode element is applied to the head mounted display. Because the ultra-small light-emitting diode element emits a single color, the ultra-small light-emitting diode display panel may include a wavelength conversion layer to convert a wavelength of light emitting from the ultra-small light-emitting diode element to display various colors.

SUMMARY

Aspects and features of embodiments of the present disclosure are to provide an ultra-high resolution display device which may prevent light beams from adjacent light-emitting areas from being mixed with each other.

Aspects and features of the present disclosure are not limited to the above-mentioned aspects and features. Other aspects and features of embodiments of the present disclosure that are not mentioned may be understood based on following descriptions, and may be more clearly understood based on embodiments according to the present disclosure. Further, it will be easily understood that the concepts as well as aspects of embodiments of the present disclosure may be realized using apparatuses and/or methods as disclosed in the claims and combinations thereof.

According to one or more embodiments of the present disclosure, the display device includes a first substrate, a plurality of light-emitting elements on the first substrate and spaced from each other, wherein each of the plurality of light-emitting elements extends in a thickness direction of the first substrate, a common electrode on the first substrate and the plurality of light-emitting elements, a first insulating layer on the common electrode and the plurality of light-emitting elements, and a first reflective layer on side surfaces of the plurality of light-emitting elements with the first insulating layer therebetween, wherein the common electrode is in contact with a portion of the side surface of each of the plurality of light-emitting elements.

In one or more embodiments, the common electrode acts as a common layer commonly connected to the plurality of light-emitting elements.

In one or more embodiments, the common electrode and the first reflective layer include a same material.

In one or more embodiments, each of the plurality of light-emitting elements includes a first semiconductor layer, an active layer on the first semiconductor layer, a second semiconductor layer on the active layer, and a third semiconductor layer on the second semiconductor layer.

In one or more embodiments, the common electrode is in contact with a side surface of the second semiconductor layer and a side surface of the third semiconductor layer.

In one or more embodiments, the first insulating layer is on a side surface of each of the first semiconductor layer, the active layer, the second semiconductor layer, and the common electrode, wherein the first insulating layer covers at least a portion of the common electrode.

In one or more embodiments, the device further includes a second substrate opposite to the first substrate, wherein the second substrate includes a plurality of pixel circuits including at least one transistor, pixel electrodes located on and connected to corresponding ones of the plurality of pixel circuits, a circuit insulating layer located between the plurality of pixel circuits and the pixel electrodes, and a plurality of contact electrodes located on the plurality of the pixel electrodes.

In one or more embodiments, the device further includes a plurality of connection electrodes, each of the plurality of connection electrodes being located between the first semiconductor layer and a corresponding one of the plurality of contact electrodes, wherein each of the plurality of contact electrodes is in contact with a corresponding one of the plurality of connection electrodes.

In one or more embodiments, the device further includes a common contact electrode on a pixel electrode of the plurality of pixel electrodes, and a common connection electrode on the common contact electrode, wherein the common contact electrode and the common connection electrode are in contact with each other.

In one or more embodiments, the first substrate has a plurality of holes defined therein, wherein the plurality of holes respectively overlap the plurality of light-emitting elements.

In one or more embodiments, the device further includes wavelength conversion layers respectively located in the plurality of holes, and a plurality of color filters respectively located on the wavelength conversion layers.

In one or more embodiments, the plurality of holes includes a first hole, a second hole, and a third hole spaced from each other, wherein the plurality of color filters includes a first color filter to transmit therethrough first light emitted from the plurality of light-emitting elements, a second color filter to transmit therethrough second light having a wavelength band different from a wavelength band of the first light, and a third color filter to transmit therethrough third light having a wavelength band different from a wavelength band of each of the first light and the second light.

In one or more embodiments, the first color filter overlaps the first hole, the second color filter overlaps the second hole, and the third color filter overlaps the third hole.

In one or more embodiments, each of the wavelength conversion layers is configured to convert a portion of the first light into fourth light, and to output fifth light, wherein in each of the plurality of wavelength conversion layers, the first light and the fourth light are mixed with each other to produce the fifth light, wherein the first color filter is configured to convert the fifth light from the plurality of wavelength conversion layers to the first light, wherein the second color filter is configured to convert the fifth light from the plurality of wavelength conversion layers to the second light, and wherein the third color filter is configured to convert the fifth light from the plurality of wavelength conversion layers to the third light.

In one or more embodiments, the wavelength conversion layers include a light-transmissive pattern for transmitting the first light therethrough, a first wavelength conversion pattern for converting the first light to the second light, and a second wavelength conversion pattern for converting the first light to the third light, wherein the light-transmissive pattern overlaps the first color filter and is located in the first hole, wherein the first wavelength conversion pattern overlaps the second color filter and is located in the second hole, and wherein the second wavelength conversion pattern overlaps the third color filter and is located in the third hole.

In one or more embodiments, the device further includes a second reflective layer on a side surface of each of the plurality of holes, wherein the second reflective layer is around each of the wavelength conversion layers.

In one or more embodiments, the device further includes a first protective layer between the first substrate and the color filters, wherein one surface of the first protective layer is in contact with the wavelength conversion layers and the first substrate, while an opposite surface of the first protective layer is in contact with the color filters.

In one or more embodiments, the plurality of color filters are located in corresponding ones of the plurality of holes.

According to one or more embodiments of the present disclosure, the display device includes a partitioning wall having a plurality of openings defined therein, wherein the plurality of openings define a plurality of light-emitting areas, a plurality of wavelength conversion layers, each of the plurality of wavelength conversion layers being located in a corresponding one of the plurality of openings, a plurality of light-emitting elements on the partitioning wall and spaced from each other, a common electrode on the partitioning wall and the plurality of light-emitting elements, a first insulating layer on the common electrode and the plurality of light-emitting elements, and a first reflective layer on side surfaces of each of the plurality of light-emitting elements with the first insulating layer therebetween, wherein the common electrode overlaps the partitioning wall and does not overlap the plurality of openings, and contacts at least a portion of the side surfaces of each of the plurality of light-emitting elements.

In one or more embodiments, the partitioning wall includes a metal or an organic insulating material.

In one or more embodiments, the common electrode does not overlap the plurality of wavelength conversion layers and is in contact with the partitioning wall.

In one or more embodiments, the device further includes a plurality of color filters on a surface of the partitioning wall that is opposite to one surface of the partition wall on which the plurality of light-emitting elements are located, wherein one surface of each of the plurality of wavelength conversion layers is contact with corresponding ones of the plurality of light-emitting elements while an opposite surface of each of the plurality of wavelength conversion layers is in contact with a corresponding ones of the plurality of color filters.

In one or more embodiments, each of the plurality of light-emitting elements includes a first semiconductor layer, an active layer on the first semiconductor layer, a second semiconductor layer on the active layer, and a third semiconductor layer on the second semiconductor layer In one or more embodiments, each of the plurality of wavelength conversion layers is in contact with the third semiconductor layer, wherein the common electrode is in contact with the second semiconductor layer and the third semiconductor layer.

The display device according to the embodiments of the present disclosure may include the common electrode surrounding the light-emitting element, thereby not only applying the common voltage to the light-emitting element, but also preventing light beams from one light-emitting area from being emitted to another light-emitting area adjacent thereto and thus being mixed with light beam in the adjacent light-emitting area.

Further, the display device according to the embodiments of the present disclosure may have the plurality of holes defined in the base substrate. Thus, the plurality of holes having a high aspect ratio may be easily formed using high aspect ratio etching. Accordingly, the ultra-high resolution light-emitting areas may be formed. Thus, the ultra-high resolution display device having the ultra-high resolution light-emitting areas may be manufactured.

Further, the display device according to the embodiments of the present disclosure may include the wavelength conversion layers respectively including the light-transmissive pattern, the first wavelength conversion pattern and the second wavelength conversion pattern, thereby improving light emission efficiency of each of blue light, green light, and red light.

Further, the display device according to the embodiments of the present disclosure may include the first protective layer between the color filter and the wavelength conversion layer, thereby preventing the color filter from being damaged in a subsequent process.

Further, in the display device according to the embodiments of the present disclosure, the hole having a large depth may be formed. Thus, the color filter and the wavelength conversion layer may be disposed in the hole. Thus, alignment between the color filter and the wavelength conversion layer may be accurate. A thickness of the wavelength conversion layer may increase, thereby improving wavelength conversion efficiency.

Effects, aspects, and features of embodiments of the present disclosure are not limited to the above-mentioned effects, aspects, and features, and other effects, aspects, and features that may not be mentioned will be clearly understood by those skilled in the art from following descriptions.

BRIEF DESCRIPTION OF DRAWINGS

The above and other aspects and features of embodiments of the present disclosure will become more apparent by describing in detail embodiments thereof with reference to the attached drawings, in which.

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, one or more embodiments will be described with reference to the accompanying drawings.

Figure 1:
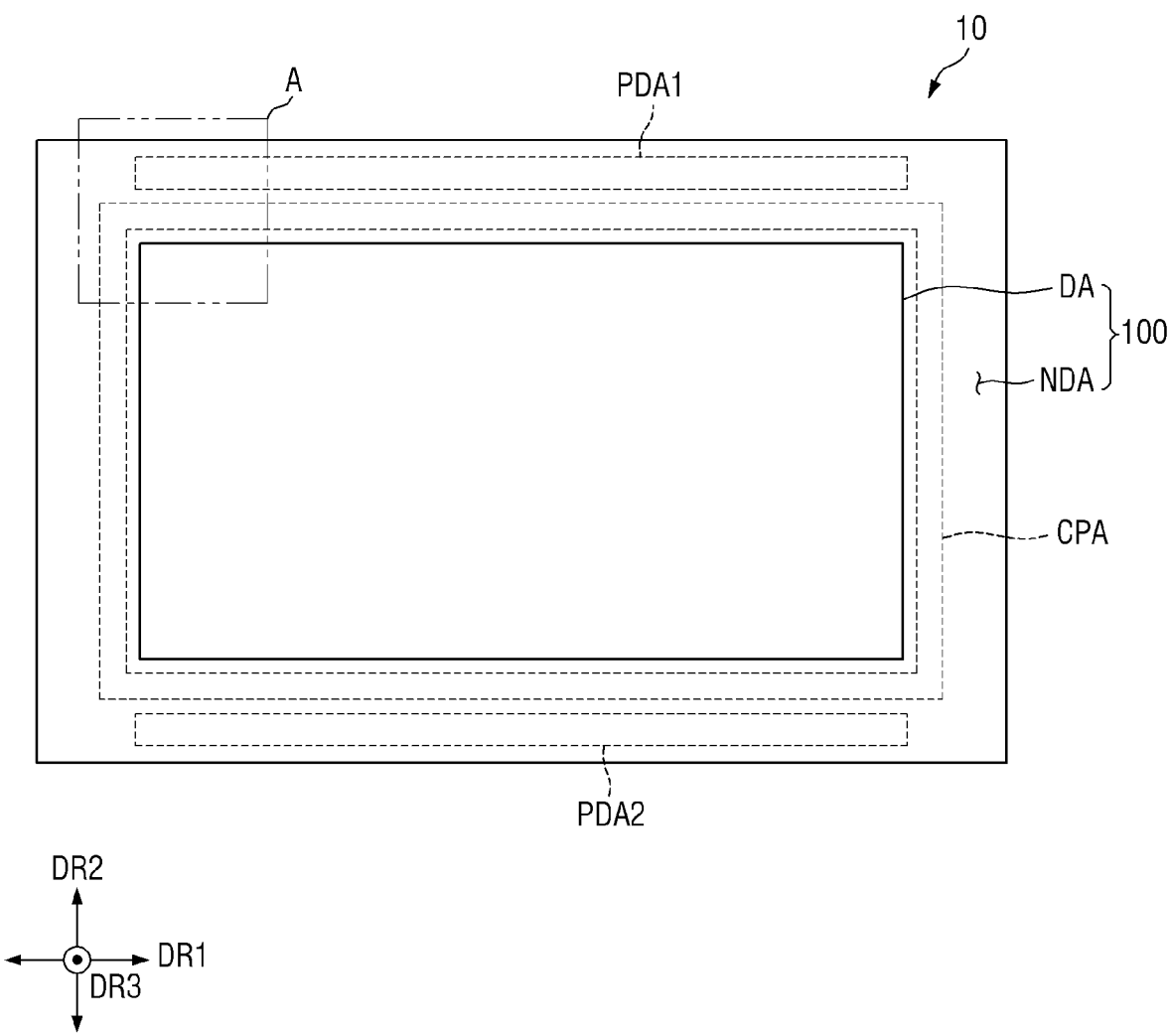
FIG. 1 is a layout diagram showing a display device according to one or more embodiments.
Figure 2:
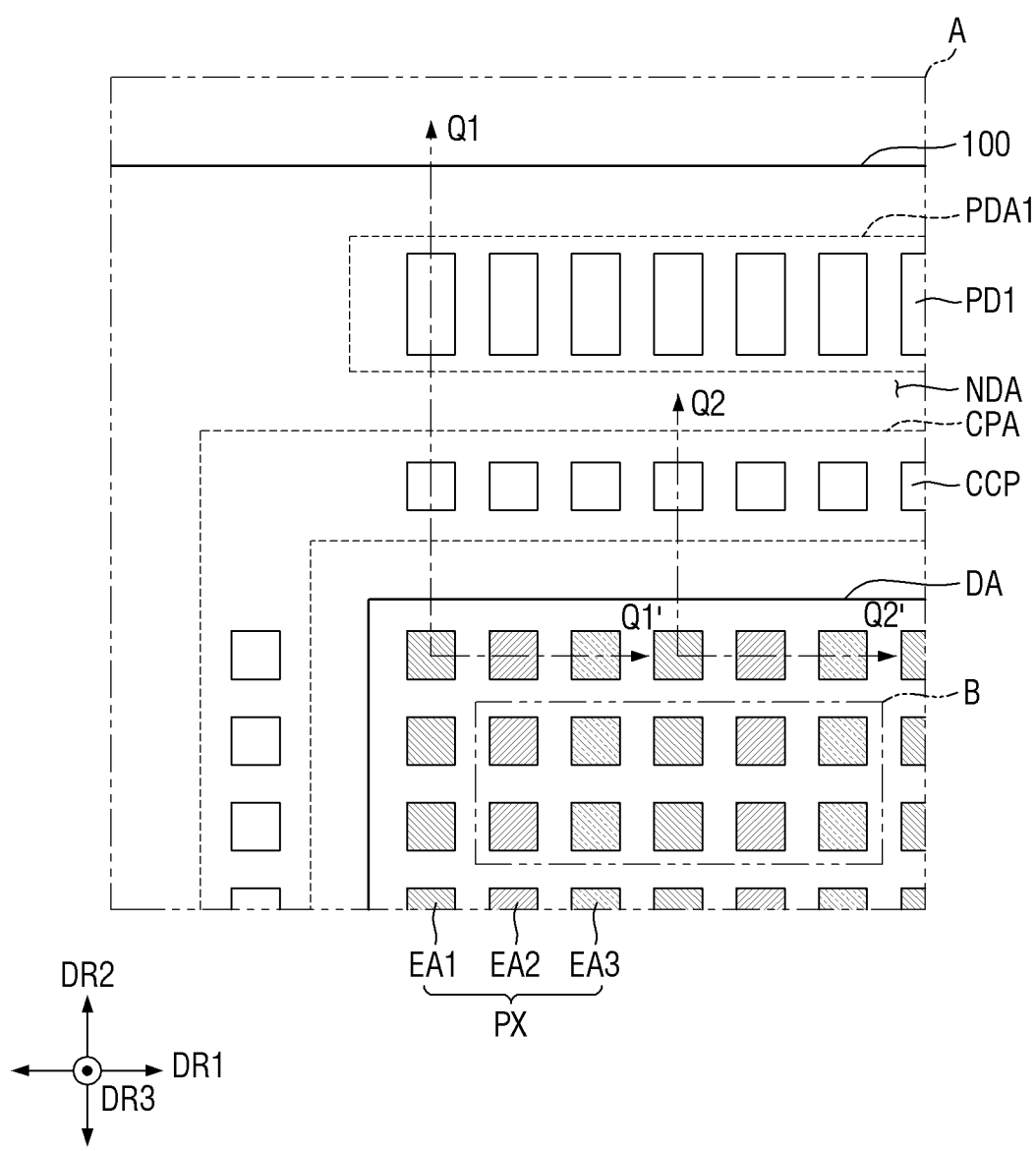
FIG. 2 is a detailed layout diagram showing an area A of FIG. 1.
Figure 3:
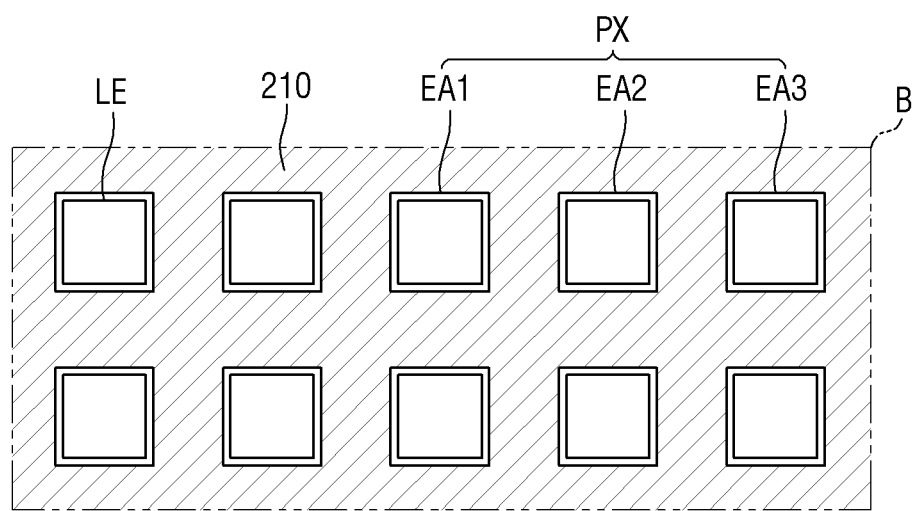
FIG. 3 is a layout diagram showing pixels of a display panel according to one or more embodiments.
Figure 3:
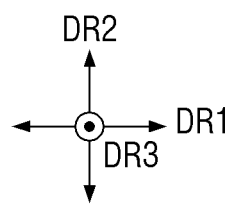

FIG. 1 is a layout diagram showing a display device according to one or more embodiments. FIG. 2 is a detailed layout diagram showing an area A of FIG. 1. FIG. 3 is a layout diagram showing pixels of a display panel according to one or more embodiments.

Referring to FIG. 1 to FIG. 3, an example in which a display device according to one or more embodiments is embodied as an ultra-small light-emitting diode display device (or a micro light-emitting diode display device) including an ultra-small light-emitting diode (or a micro light-emitting diode) as a light-emitting element will be described. However, the present disclosure is not limited thereto.

Referring to FIG. 1 to FIG. 3, an example in which a display device according to one or more embodiments has a Light Emitting Diode on Silicon (LEDoS) structure in which light-emitting diode elements are disposed on a semiconductor circuit board formed using a semiconductor process will be described. However, the present disclosure is not limited thereto.

Further, in FIG. 1 to FIG. 3, a first direction DR1 indicates a longitudinal or horizontal direction of a display panel 100, a second direction DR2 indicates a transverse or vertical direction of the display panel 100, and a third direction DR3 indicates a thickness direction of the display panel 100. In this case, "left", "right", "upper", and "lower" indicate directions of the display panel 100 in a plan view. For example, "right" indicates one side in the first direction DR1, "left" indicates the opposite side in the first direction DR1, "upper" indicates one side in the second direction DR2, and "lower" indicates the opposite side in the second direction DR2. Further, "top" refers to one side in the third direction DR3, and "bottom" refers to the opposite side in the third direction DR3.

Referring to FIG. 1 to FIG. 3, a display device 10 according to one or more embodiments includes the display panel 100 including a display area DA and a non-display area NDA.

The display panel 100 may have a rectangular planar shape having a long side in the first direction DR1 and a short side in the second direction DR2. However, the planar shape of the display panel 100 may not be limited thereto but may have a polygonal shape other than the rectangular shape, or a circular, oval, or irregular planar shape.

The display area DA may be an area in which an image is displayed, and the non-display area NDA may be an area in which an image is not displayed. A planar shape of the display area DA may correspond to the planar shape of the display panel 100. FIG. 1 illustrates that the planar shape of the display area DA is a rectangle. The display area DA may be disposed in an inner area of the display panel 100. The non-display area NDA may be disposed around the display area DA along the edge or periphery of the display area DA. The non-display area NDA may be disposed to surround the display area DA.

The display area DA of the display panel 100 may include a plurality of pixels PX. A pixel PX may be defined as a minimum light-emitting unit in which white light is displayed.

Each of the plurality of pixels PX may include a plurality of light-emitting areas EA1, EA2, and EA3. In one or more embodiments of the present disclosure, it is illustrated that each of the plurality of pixels PX includes three light-emitting areas EA1, EA2, and EA3. However, the present disclosure is not limited thereto. For example, each of the plurality of pixels PX may include four light-emitting areas.

Each of the plurality of light-emitting areas EA1, EA2, and EA3 may include a light-emitting element LE emitting first light. The light-emitting element LE has been illustrated to have a rectangular planar shape. However, the present disclosure is not limited thereto. For example, the light-emitting element LE may have a polygonal planar shape other than the rectangular planar shape, or a circular planar shape, an oval planar shape, or an irregular planar shape.

Each of the first light-emitting areas EA1 refers to an area emitting the first light. Each of the first light-emitting areas EA1 may emit the first light emitting from the light-emitting element LE as it is. The first light may be light of a blue wavelength band. The blue wavelength band may be approximately in a range of 370 nm to 460 nm. However, the present disclosure is not limited thereto.

Each of the second light-emitting areas EA2 refers to an area emitting second light. Each of the second light-emitting areas EA2 may convert the first light emitting from the light-emitting element LE into the second light and may output the second light. The second light may be light of a green wavelength band. The green wavelength band may be approximately in a range of 480 nm to 560 nm. However, the present disclosure is not limited thereto.

Each of the third light-emitting areas EA3 refers to an area emitting third light. Each of the third light-emitting areas EA3 may convert the first light emitting from the light-emitting element LE into the third light and output the same. The third light may be light of a red wavelength band. The red wavelength band may be approximately in a range of 600 nm to 750 nm. However, the present disclosure is not limited thereto.

The first light-emitting areas EA1, the second light-emitting areas EA2, and the third light-emitting areas EA3 may be alternately arranged with each other along the first direction DR1. For example, the first light-emitting area EA1, the second light-emitting area EA2, and the third light-emitting area EA3 may be arranged in this order along the first direction DR1.

The first light-emitting areas EA1 may be arranged along the second direction DR2. The second light-emitting areas EA2 may be arranged along the second direction DR2. The third light-emitting areas EA3 may be arranged along the second direction DR2.

Figure 5:
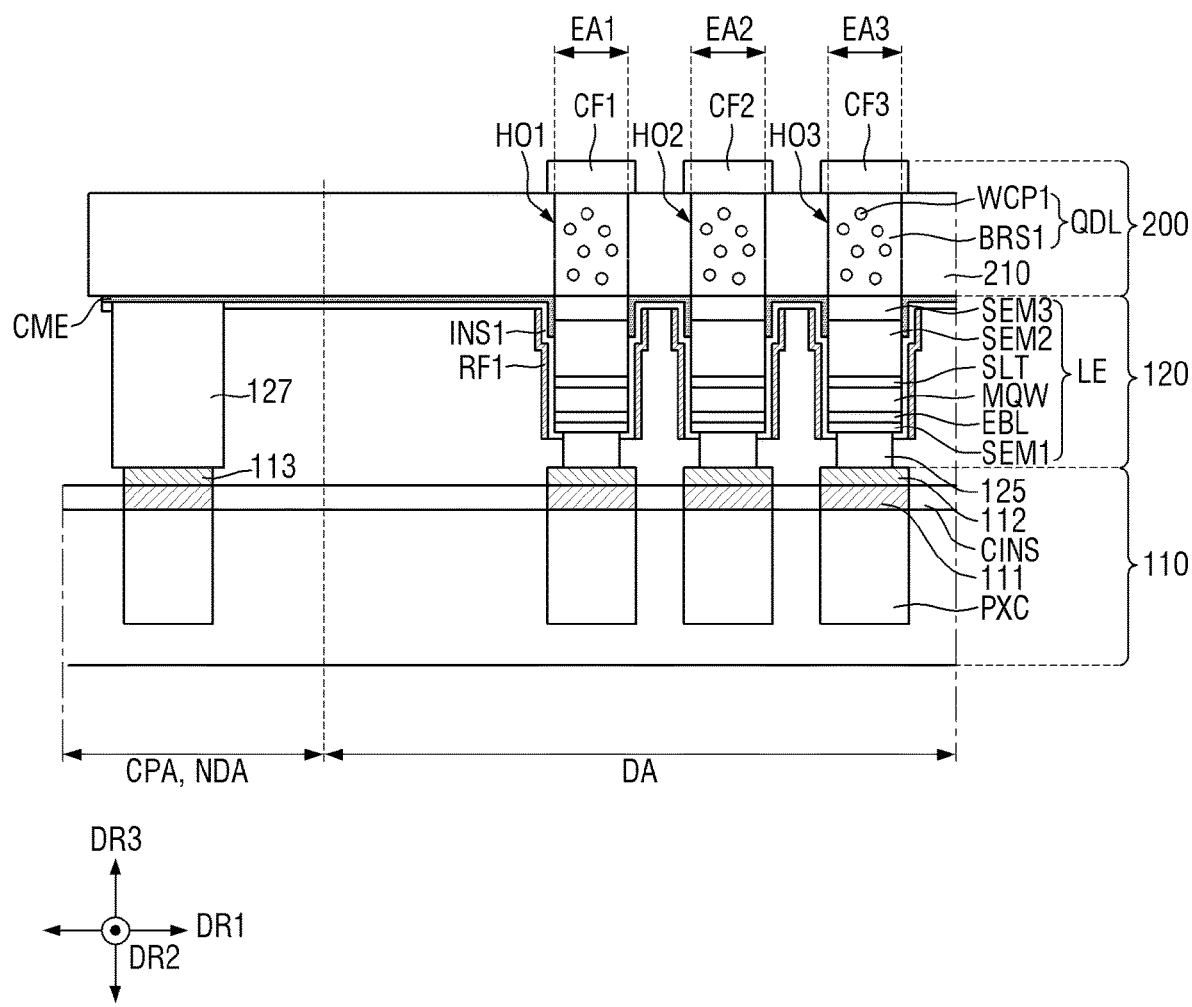
FIG. 5 is a cross-sectional view showing one example of the display panel taken along the line Q2-Q2' in FIG. 2.

Each of the plurality of light-emitting areas EA1, EA2, and EA3 may be defined in a corresponding manner to each of a plurality of holes HO formed in a base substrate 210 (e.g., see FIG. 5). Each of the plurality of holes HO may be around (e.g., surround) each light-emitting element LE in a plan view. Each of the plurality of holes HO may be spaced from each light-emitting element LE. Each of the plurality of holes HO may have a dot shape.

Although FIG. 2 and FIG. 3 illustrate that each of the plurality of light-emitting areas EA1, EA2, and EA3 defined in a corresponding manner to each of the plurality of holes HO has a rectangular planar shape, the present disclosure is not limited thereto. For example, each of the plurality of light-emitting areas EA1, EA2, and EA3 defined in a corresponding manner to each of the plurality of holes HO may have a polygonal planar shape other than the rectangular planar shape or a circular, oval, or irregular planar shape.

The non-display area NDA may include a first pad area PDA1 and a second pad area PDA2.

The first pad area PDA1 may be disposed in the non-display area NDA. The first pad area PDA1 may be disposed in an upper area of the display panel 100 in the second direction DR2. The first pad area PDA1 may include first pads PD1 connected to an external circuit board (e.g., CB of FIG. 4).

The second pad area PDA2 may be disposed in the non-display area NDA. The second pad area PDA2 may be disposed in a lower area of the display panel 100 in the second direction DR2. The second pad area PDA2 may include second pads to be connected to the external circuit board (e.g., CB of FIG. 4). In one or more embodiments, the second pad area PDA2 may be omitted.

Further, the non-display area NDA may further include a common electrode connective area CPA around (e.g., surrounding) the display area DA.

The common electrode connective area CPA may be disposed in the non-display area NDA, and may be disposed between the first pad area PDA1 and the display area DA and between the second pad area PDA2 and the display area DA. Further, the common electrode connective area CPA may be disposed on one side and the opposite side in the first direction DR1 of the display area DA, and disposed on one side and the opposite side in the second direction DR2 of the display area DA. The common electrode connective area CPA may include a plurality of connection electrodes CCP to be connected to the semiconductor circuit board.

Although FIG. 1 illustrates that the common electrode connective area CPA is around (e.g., surrounds) an entirety of the display area DA, the present disclosure is not limited thereto. For example, the common electrode connective area CPA may be disposed only on one side, both sides, or at least three sides of the display area DA.

Figure 4:
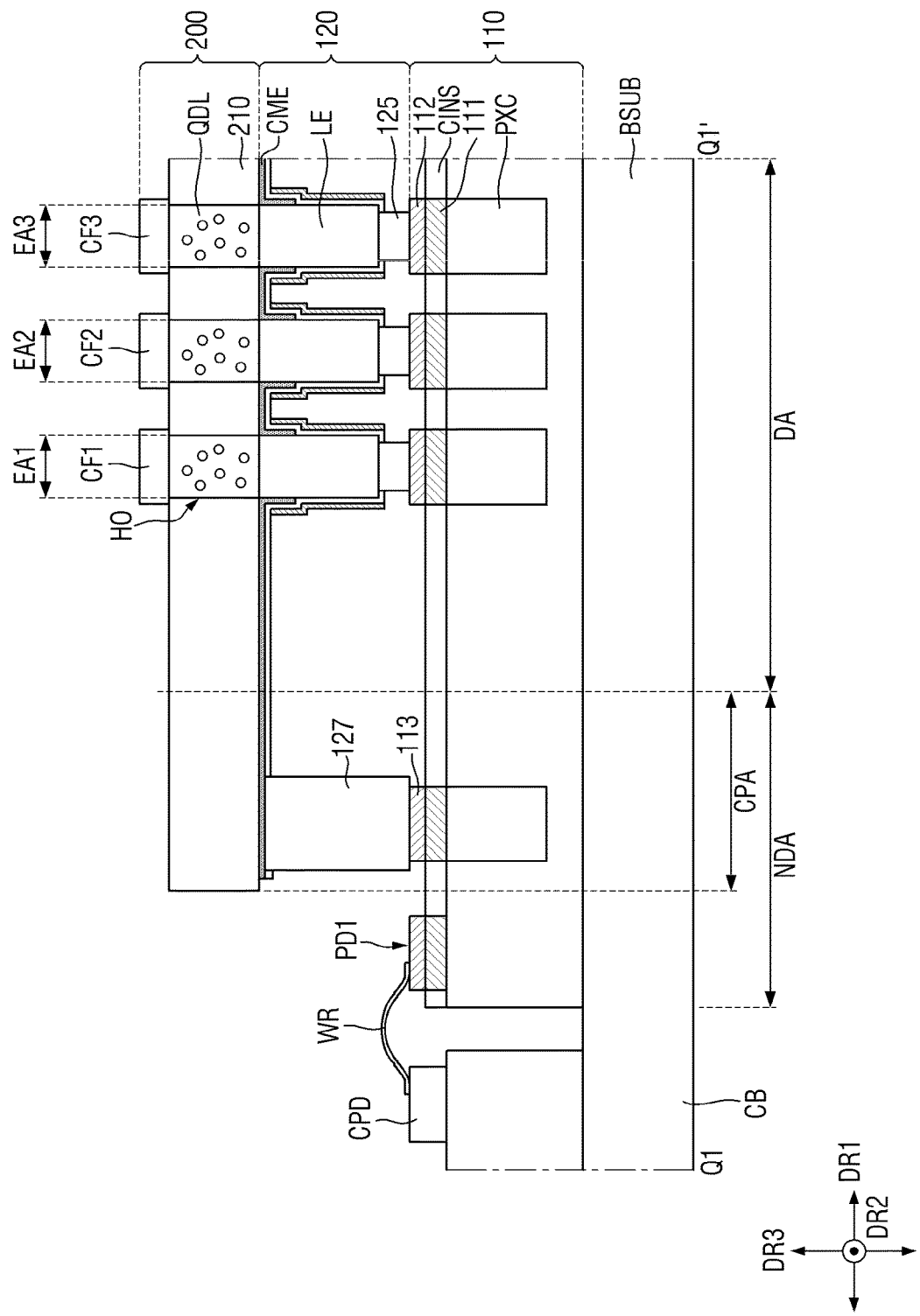
FIG. 4 is a cross-sectional view showing one example of a display panel taken along the line Q1-Q1' in FIG. 2.
Figure 6:
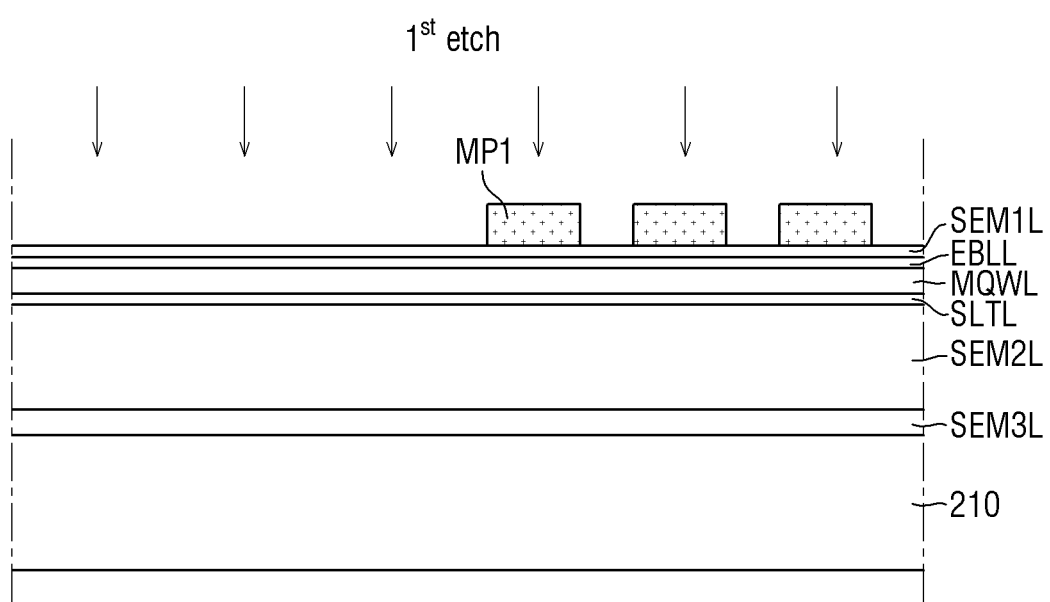
FIG. 6 is a plan view showing one example of a light-emitting element layer of a display panel according to one or more embodiments.
Figure 7:
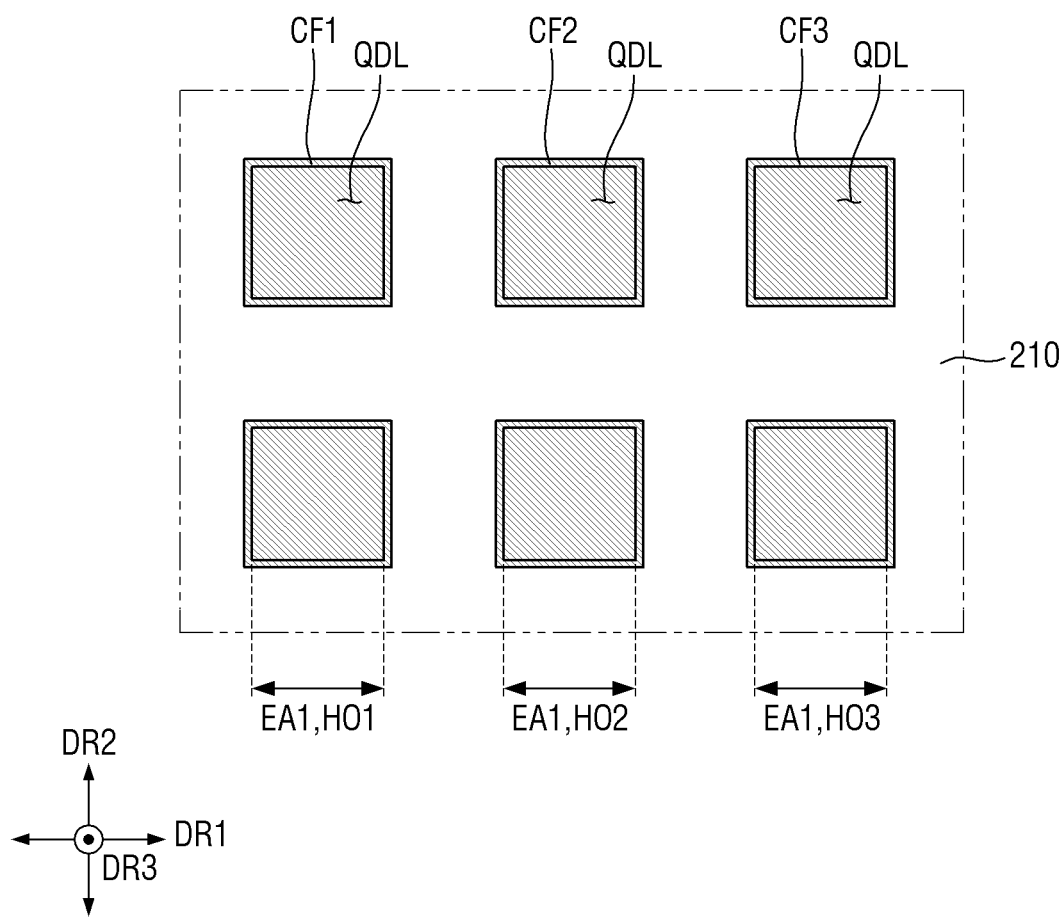
FIG. 7 is a plan view showing one example of a wavelength conversion substrate of a display panel according to one or more embodiments.
Figure 8:
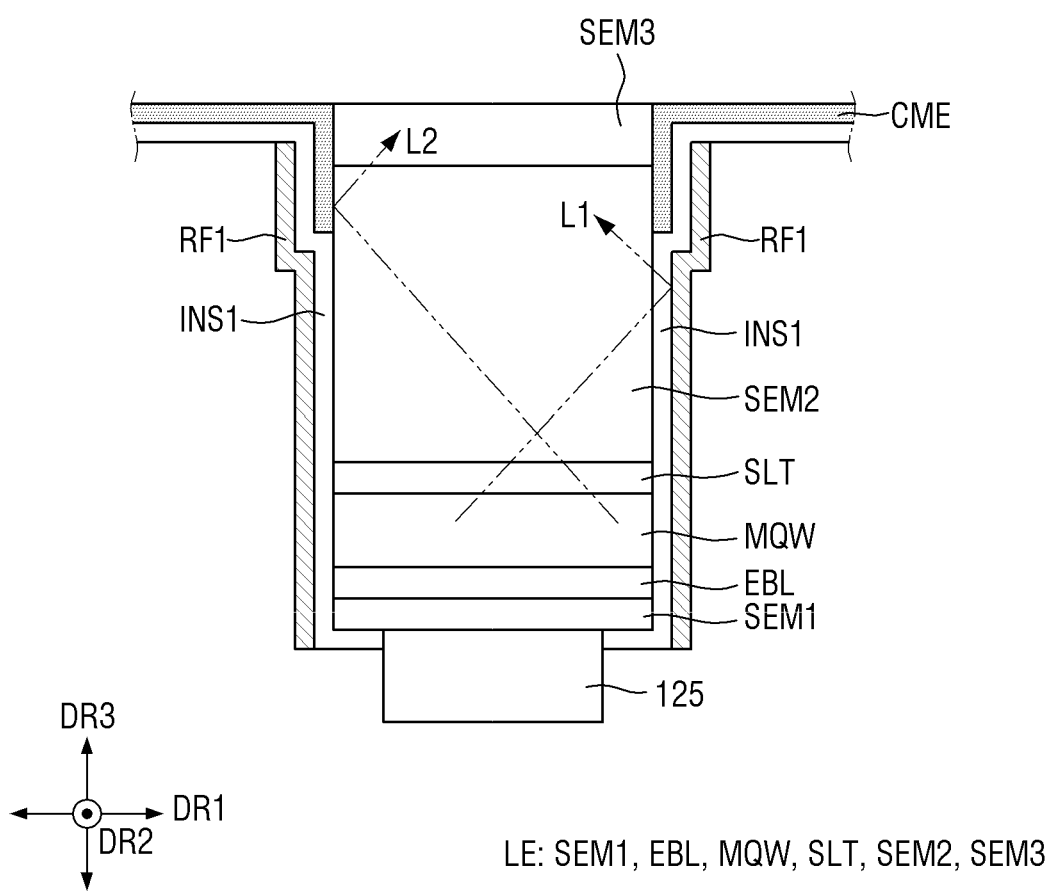
FIG. 8 is a cross-sectional view showing one example of a light-emitting element of a display panel according to one or more embodiments.

FIG. 4 is a cross-sectional view showing one example of a display panel taken along the line Q1-Q1' in FIG. 2. FIG. 5 is a cross-sectional view showing one example of a display panel taken along the line Q2-Q2' in FIG. 2. FIG. 6 is a plan view showing one example of a light-emitting element layer of a display panel according to one or more embodiments. FIG. 7 is a plan view showing one example of a wavelength conversion substrate of a display panel according to one or more embodiments. FIG. 8 is a cross-sectional view showing one example of a light-emitting element of a display panel according to one or more embodiments.

Referring to FIG. 4 to FIG. 8, the display panel 100 according to one or more embodiments may include a semiconductor circuit board 110, a light-emitting element layer 120, and a wavelength conversion substrate 200.

The semiconductor circuit board 110 may include a plurality of pixel circuits PXC, pixel electrodes 111, contact electrodes 112, the first pads PD1, a common contact electrode 113, and a circuit insulating layer CINS.

The semiconductor circuit board 110 may be embodied as a silicon wafer substrate formed using a semiconductor process, and may be referred to as a first substrate.

The plurality of pixel circuits PXC of the semiconductor circuit board 110 may be formed using a semiconductor process.

The plurality of pixel circuits PXC may be disposed in the display area DA and the non-display area NDA. Each of the plurality of pixel circuits PXC may be connected to a corresponding pixel electrode 111. That is, the plurality of pixel circuits PXC and the plurality of pixel electrodes 111 may be connected to each other in a one-to-one correspondence manner. Each of the plurality of pixel circuits PXC may overlap each light-emitting element LE in the third direction DR3.

Each of the plurality of pixel circuits PXC may include at least one transistor formed using a semiconductor process. Further, each of the plurality of pixel circuits PXC may further include at least one capacitor formed using a semiconductor process. Each of the plurality of pixel circuits PXC may include, for example, a CMOS circuit. The CMOS circuit includes a combination of nMOSFET and pMOSFET to maximize or to increase an synergy effect therebetween and has low power consumption and is suitable in improving an integration. Each of the plurality of pixel circuits PXC may apply a pixel voltage or an anode voltage to each pixel electrode 111.

The circuit insulating layer CINS may be disposed on the plurality of pixel circuits PXC.

The circuit insulating layer CINS may protect the plurality of pixel circuits PXC and may planarize steps of the plurality of pixel circuits PXC. The circuit insulating layer CINS may expose each of the pixel electrodes 111 so that each of the pixel electrodes 111 may be connected to the light-emitting element layer 120. The circuit insulating layer CINS may include an inorganic insulating material such as silicon oxide ($SiO_x$), silicon nitride ($SiN_x$), silicon oxynitride ($SiO_xN_y$), aluminum oxide ($Al_xO_y$), aluminum nitride (AlN), and the like.

Each of the plurality of pixel electrodes 111 may be disposed on a corresponding pixel circuit PXC. Each of the pixel electrodes 111 may be exposed toward each pixel circuit PXC. Each of the pixel electrodes 111 may be integrally formed with each of the pixel circuits PXC. Each of the pixel electrodes 111 may receive the pixel voltage or the anode voltage from each of the pixel circuits PXC. Each of the pixel electrodes 111 may include a metal material such as aluminum (Al).

Each of the contact electrodes 112 may be disposed on each pixel electrode 111 corresponding thereto. Each of the contact electrodes 112 may include a metal material for bonding each of the pixel electrodes 111 and each of the light-emitting elements LE to each other. For example, each of the contact electrodes 112 may include at least one of gold (Au), copper (Cu), aluminum (Al), and tin (Sn). Alternatively, each of the contact electrodes 112 may include a first layer including one of gold (Au), copper (Cu), aluminum (Al), and tin (Sn) and a second layer including another of gold (Au), copper (Cu), aluminum (Al), and tin (Sn).

The common contact electrode 113 may be disposed in the common electrode connective area CPA of the non-display area NDA. The common contact electrode 113 may be around (e.g., surround) the display area DA. The common contact electrode 113 may be connected to one of the first pads PD1 of the first pad area PDA1 via a circuit formed in the non-display area NDA and may receive a common voltage therefrom. The common contact electrode 113 may be made of the same material as that of the contact electrode 112. That is, the common contact electrode 113 and the contact electrode 112 may be formed using the same process.

Each of the first pad PD1 may be connected to each of pad electrodes CPD of the circuit board CB via a conductive connective member such as a corresponding wire WR. That is, the first pads PD1, the wires WR, and the pad electrode CPD of the circuit board CB may be connected to each other in an one-to-one manner. The semiconductor circuit board 110 and the circuit board CB may be disposed on a support substrate BSUB. However, the present disclosure is not limited thereto. In one or more embodiments, the support substrate BSUB may be omitted.

The circuit board CB may be embodied as a flexible film such as a flexible printed circuit board (FPCB), a printed circuit board (PCB), a flexible printed circuit (FPC), or a chip on film (COF).

In one example, each of the second pads of the second pad area PDA2 may be substantially the same as each of the first pads PD1 described in conjunction with FIGS. 4 and 5. A description thereof is omitted.

The light-emitting element layer 120 may include light-emitting elements LE, a common electrode CME, a first insulating layer INS1, a connection electrode 125, a common connection electrode 127, and a first reflective layer RF1.

The light-emitting element layer 120 may be disposed on one face (e.g., one surface) of the base substrate 210 of the wavelength conversion substrate 200. The light-emitting element layer 120 may include the light-emitting elements LE respectively corresponding to the first light-emitting area EA1, the second light-emitting area EA2, and the third light-emitting area EA3 defined in a corresponding manner to each of the plurality of holes HO defined in the base substrate 210. Each light-emitting element LE may be disposed in each of the first light-emitting area EA1, the second light-emitting area EA2, and the third light-emitting area EA3.

Each light-emitting element LE may be disposed on each contact electrode 112 and in each of the first light-emitting area EA1, the second light-emitting area EA2, and the third light-emitting area EA3. The light-emitting element LE may be embodied as a vertical light-emitting diode element extending in the third direction DR3. That is, a length in the third direction DR3 of the light-emitting element LE may be larger than a length in a horizontal direction thereof. The length in the horizontal direction indicates a length in the first direction DR1 or a length in the second direction DR2. For example, the length in the third direction DR3 of the light-emitting element LE may be approximately in a range of 1 to 5 μm.

The light-emitting element LE may be embodied as a micro light-emitting diode element. The light-emitting element LE may include a connection electrode 125, a first semiconductor layer SEM1, an electron blocking layer EBL, an active layer MQW, a superlattice layer SLT, a second semiconductor layer SEM2, and a third semiconductor layer SEM3 which are arranged along the thickness direction of the base substrate 210, that is, along the third direction DR3. The connection electrode 125, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3.

As shown in FIG. 8, the light-emitting element LE may have a cylindrical shape, a disk-shape, or a rod-shape in which a width is larger than a height. However, the present disclosure is not limited thereto. For example, the light-emitting element LE may have various shapes including a shape of a rod, a wire, a tube, etc., a shape of a cube, a cuboid, or a polygonal prism such as a hexagonal prism, or a shape extending in one direction but having a partially inclined outer face (e.g., a partially inclined outer surface).

Each connection electrode 125 may be disposed on each contact electrode 112. Each connection electrode 125 may adhere to each contact electrode 112 and thus serve to apply a light emission signal to each light-emitting element LE. The connection electrode 125 may be embodied as an ohmic connection electrode. However, the present disclosure is not limited thereto. The connection electrode 125 may be embodied as a Schottky connection electrode. The light-emitting element LE may include at least one connection electrode 125. FIG. 8 shows that the light-emitting element LE includes one connection electrode 125. However, the present disclosure is not limited thereto. In some cases, the light-emitting element LE may include a larger number of connection electrodes 125 or the connection electrode 125 may be omitted. Description of the light-emitting element LE which will be made later may be equally applied to a case where the number of connection electrodes 125 varies or a case where the light-emitting element LE further includes another component.

In the display device 10 according to one or more embodiments, the connection electrode 125 may reduce a resistance between the light-emitting element LE and the contact electrode when the light-emitting element LE is electrically connected to the contact electrode. The connection electrode 125 may include a conductive metal. For example, the connection electrode 125 may include at least one of gold (Au), copper (Cu), tin (Sn), titanium (Ti), aluminum (Al), and silver (Ag). For example, the connection electrode 125 may include 9:1 alloy, 8:2 alloy or 7:3 alloy of gold and tin, or an alloy (SAC305) of copper, silver and tin.

The first semiconductor layer SEM1 may be disposed on the connection electrode 125. The first semiconductor layer SEM1 may be a p-type semiconductor, and may include a semiconductor material of a chemical formula $Al_xGa_yIn_{1-x-y}N$ ($0 \leq x \leq 1$, $0 \leq y \leq 1$, $0 \leq x+y \leq 1$). For example, the first semiconductor layer SEM1 may be made of at least one of AlGaInN, GaN, AlGaN, InGaN, AlN, or InN doped with p-type dopants. The first semiconductor layer SEM1 may be doped with a p-type dopant. The p-type dopant may be Mg, Zn, Ca, Se, Ba, or the like. For example, the first semiconductor layer SEM1 may be made of p-GaN doped with p-type Mg. A thickness of the first semiconductor layer SEM1 may in a range of 30 nm to 200 nm, but may not be limited thereto.

The electron blocking layer EBL may be disposed on the first semiconductor layer SEM1. The electron blocking layer EBL may function to inhibit or prevent excessive electrons from flowing into the active layer MQW. For example, the electron blocking layer EBL may be made of p-AlGaN doped with p-type Mg. A thickness of the electron blocking layer EBL may be in a range of 10 nm to 50 nm, but may not be limited thereto. Further, in one or more embodiments, the electron blocking layer EBL may be omitted.

The active layer MQW may be disposed on the electron blocking layer EBL. The active layer MQW may emit light via combinations between electrons and holes using an electric signal applied through the first semiconductor layer SEM1 and the second semiconductor layer SEM2. The active layer MQW may emit the first light having a central wavelength band in a range of 450 nm to 495 nm, that is, light in a blue wavelength band.

The active layer MQW may include a material having a single or multi quantum well structure. When the active layer MQW includes a material having a multi-quantum well structure, a plurality of well layers and a plurality of barrier layers may be alternately stacked one on top of another. In this connection, the well layer may be made of InGaN, and the barrier layer may be made of GaN or AlGaN. However, the present disclosure is not limited thereto. A thickness of the well layer may be approximately in a range of 1 nm to 4 nm, and a thickness of the barrier layer may be in a range of 3 nm to 10 nm.

Alternatively, the active layer MQW may have a structure in which a semiconductor material having a large bandgap energy and a semiconductor material having a small bandgap energy are alternately stacked one on top of another. The active layer MQW may include Groups III to V semiconductor materials depending on a wavelength band of light emitting therefrom. The light emitting from the active layer MQW is not limited to the first light (having blue wavelength band). In some cases, the light emitting from the active layer MQW may be the second light (e.g., light having a green wavelength band) or the third light (e.g., light having a red wavelength band).

The superlattice layer SLT may be disposed on the active layer MQW. The superlattice layer SLT may function to relieve stress between the second semiconductor layer SEM2 and the active layer MQW. For example, the superlattice layer SLT may be made of InGaN or GaN. A thickness of the superlattice layer SLT may be approximately in a range of 50 nm to 200 nm. In one or more embodiments, the superlattice layer SLT may be omitted.

The second semiconductor layer SEM2 may be disposed on the superlattice layer SLT. The second semiconductor layer SEM2 may be embodied as an n-type semiconductor. The second semiconductor layer SEM2 may include a semiconductor material having a chemical formula $Al_xGa_yIn_{1-x-y}N$ ($0 \leq x \leq 1$, $0 \leq y \leq 1$, $0 \leq x+y \leq 1$). For example, the second semiconductor layer SEM2 may be made of at least one of AlGaInN, GaN, AlGaN, InGaN, AlN, or InN doped with n-type dopants. The second semiconductor layer SEM2 may be doped with an n-type dopant. The n-type dopant may be Si, Ge, Sn, or the like. For example, the second semiconductor layer SEM2 may be made of n-GaN doped with n-type Si. A thickness of the second semiconductor layer SEM2 may in a range of 2 μm to 4 μm, but may not be limited thereto.

The third semiconductor layer SEM3 may be disposed on the second semiconductor layer SEM2. The third semiconductor layer SEM3 may be disposed between the second semiconductor layer SEM2 and the base substrate 210. The third semiconductor layer SEM3 may include an undoped semiconductor. The third semiconductor layer SEM3 may include a material which is the same as that of the second semiconductor SEM2 but is undoped with an n-type or p-type dopant. In one or more embodiments, the third semiconductor layer SEM3 may include at least one of InAlGaN, GaN, AlGaN, InGaN, AlN or InN as undoped. However, the present disclosure is not limited thereto.

The common electrode CME may be disposed on the base substrate 210. For example, the common electrode CME may be disposed on one face (e.g., one surface) of the base substrate 210 on which the light-emitting element LE is formed, and may be disposed throughout the display area DA and the non-display area NDA. The common electrode CME may not overlap each of the light-emitting areas EA1, EA2, and EA3 in the display area DA and thus may not interfere with light emission therefrom.

The common electrode CME may be disposed directly on one face (e.g., one surface) of the base substrate 210 and may be disposed directly on a side face (e.g., a side surface) of each of the plurality of light-emitting elements LE. The common electrode CME may directly contact a partial side face (e.g., a partial side surface) of the second semiconductor layer SEM2 and an entire side face (e.g., an entire side surface) of the third semiconductor layer SEM3 as a partial side face of the light-emitting element LE. As shown in FIG. 6, the common electrode CME may be embodied as a common layer that is around (e.g., surrounds) each of the plurality of light-emitting elements LE and is commonly connected to the plurality of light-emitting elements LE. The conductive second semiconductor layer SEM2 has an individual patterned structure in each light-emitting element LE. Thus, the common electrode CME may directly contact the side face (e.g., the side surface) of the second semiconductor layer SEM2 of each light-emitting element LE so that the common voltage is applied to each light-emitting element LE.

The common electrode CME may be around (e.g., may surround) the side face of each of the third semiconductor layer SEM3 and the second semiconductor layer SEM2, and thus may reflect light incident from the active layer MQW of the light-emitting element LE, thereby preventing leakage of the light from the active layer MQW of the light-emitting element LE. The common electrode CME serves to reflect a portion of light emitting from the light-emitting element LE which travels not upwardly but laterally. That is, the common electrode CME may reflect the light to guide the light to be outputted out of each of the light-emitting areas EA1, EA2, and EA3, thereby prevent light from one of the light-emitting areas EA1, EA2, and EA3 from leaking into adjacent one(s) of the light-emitting areas EA1, EA2, and EA3 and from being mixed with light therein.

The common electrode CME may be disposed over an entire area of the base substrate 210 and may apply the common voltage to the light-emitting elements LE. Thus, the common electrode CME may be made of a material having low resistance. Further, the common electrode CME may include a material having high reflectivity to easily reflect light therefrom. For example, the common electrode CME may include the same material as that of the first reflective layer RF1 which will be described later, and may include a metal material having high reflectivity such as aluminum (Al) and silver (Ag). A thickness of the common electrode CME may be about 0.1 µm, but may not be limited thereto.

The above-described light-emitting element LE may receive the pixel voltage or the anode voltage of the pixel electrode 111 via the connection electrode 125, and may receive the common voltage via the common electrode CME. The light-emitting element LE may emit light at a desired luminance level (e.g., a predefined luminance level) based on a voltage difference between the pixel voltage and the common voltage.

The first insulating layer INS1 may be disposed on a bottom face and a side face (e.g., a side surface) of the common electrode CME, a side face (e.g., a side surface) of each of the light-emitting elements LE, and a side face of the connection electrode 125. The first insulating layer INS1 may insulate the common electrode CME, the light-emitting elements LE, and the connection electrode 125 from other layers.

As shown in FIG. 6, the first insulating layer INS1 may be disposed to be around (e.g., surround) each of the light-emitting elements LE. The first insulating layer INS1 may include an inorganic insulating material such as silicon oxide ($SiO_x$), silicon nitride ($SiN_x$), silicon oxynitride ($SiO_xN_y$), aluminum oxide ($Al_xO_y$), aluminum nitride (AlN), or the like. A thickness of the first insulating layer INS1 may be approximately 0.1 µm. However, the present disclosure is not limited thereto.

The first reflective layer RF1 plays a role of reflecting light beams emitting from the light-emitting element LE and then traveling not toward a top of the display panel but in a lateral direction thereof. The first reflective layer RF1 may be disposed in the display area DA and the non-display area NDA. The first reflective layer RF1 may not overlap each of the first light-emitting area EA1, the second light-emitting area EA2, and the third light-emitting area EA3 in the display area DA.

The first reflective layer RF1 may be disposed on the side faces (e.g., the side surfaces) of the first insulating layer INS1, and the side faces (e.g., the side surfaces) of each of the light-emitting elements LE. The first reflective layer RF1 may be disposed directly on the first insulating layer INS1. In this connection, the first reflective layer RF1 may be disposed directly on the side face (e.g., the side surface) of the first insulating layer INS1. The first reflective layer RF1 may be spaced from the common connection electrode 127, the connection electrode 125, and the light-emitting elements LE.

As shown in FIG. 6, each first reflective layer RF1 may be disposed to be around (e.g., surround) each of the light-emitting elements LE in the display area DA. Each of the light-emitting elements LE may be surrounded with the first insulating layer INS1, while the first insulating layer INS1 may be surrounded with the first reflective layer RF1. The first reflective layers RF1 respectively surrounding the light-emitting elements LE may be spaced from each other. In this connection, each first reflective layer RF1 surrounding a corresponding light-emitting element LE may be spaced from a first reflective layer RF1 surrounding a light-emitting element LE adjacent to the corresponding light-emitting element LE. That is, the first reflective layers RF1 may be arranged and be spaced from each other in the first direction DR1 and the second direction DR2. Although a planar shape of each of the first reflective layer RF1 and the first insulating layer INS1 is shown as a rectangular closed loop shape in the drawings, the present disclosure is not limited thereto. The planar shape of each of the first reflective layer RF1 and the first insulating layer INS1 may have various shapes depending on a planar shape of the light-emitting element LE.

The first reflective layer RF1 may include a highly reflective metal material such as aluminum (Al). A thickness of the first reflective layer RF1 may be approximately 0.1 µm. However, the present disclosure is not limited thereto.

Referring to FIG. 8, light may emit from the active layer MQW of the light-emitting element LE. First light L1 thereof emitting laterally may be reflected from the first reflective layer RF1 and then may travel upward. Further, second light L2 thereof emitting laterally at a different angle from that of the first light L1 may be reflected from the common electrode CME and then travel upward.

In one or more embodiments, including the common electrode CME as well as the first reflective layer RF1 may prevent light beams from one of the light-emitting areas EA1, EA2, and EA3 from invading into adjacent one(s) of the light-emitting areas EA1, EA2, and EA3 thereto and from being mixed with light beams therein.

The common connection electrode 127 may be disposed in the common electrode connective area CPA of the non-display area NDA. The common connection electrode 127 may be disposed on one face (e.g., one surface) of the common electrode CME. The common connection electrode 127 may serve to transmit a common voltage signal from the common contact electrode 113 to the light-emitting elements LE. The common connection electrode 127 may be made of the same material as that of the connection electrode 125. In order for common connection electrode 127 to be connected to the common contact electrode 113, a thickness thereof in the third direction DR3 may be increased. The thickness of the common connection electrode 127 may be greater than that of the connection electrode 125.

In one example, the wavelength conversion substrate 200 may be disposed on the light-emitting element layer 120. The wavelength conversion substrate 200 may include the base substrate 210, a wavelength conversion layer QDL and color filters CF1, CF2, and CF3.

The base substrate 210 may act as a second substrate facing (or opposing) toward (or opposing) the semiconductor circuit board 110 as the first substrate. The base substrate 210 may support the wavelength conversion substrate 200. The light-emitting areas EA1, EA2, and EA3 may be defined on the base substrate 210. The base substrate 210 may face (or oppose) toward the semiconductor circuit board 110. The base substrate 210 may include a transparent substrate such as sapphire substrate (Al$_2$O$_3$), a silicon substrate, a glass substrate, etc. However, the present disclosure is not limited thereto. The base substrate 210 may include a conductive substrate made of GaN, SiC, ZnO, Si, GaP, or GaAs. Hereinafter, an example in which the base substrate 210 is embodied as the sapphire (Al$_2$O$_3$) substrate will be described. However, the present disclosure is not limited thereto. A thickness of the base substrate 210 is not particularly limited. However, in one example, a thickness of the base substrate 210 may be in a range of 400 μm to 1500 μm.

The plurality of holes HO; HO1, HO2, and HO3 may be defined in the base substrate 210. As shown in FIGS. 5 and 7, the plurality of holes HO may define and distinguish the first light-emitting area EA1, the second light-emitting area EA2, and the third light-emitting area EA3 from each other. The base substrate 210 may extend in the first direction DR1 and the second direction DR2, and may be formed in a grid pattern over the entire display area DA. Each of the plurality of holes HO may have a dot planar shape. The plurality of holes HO may be arranged over the entire display area DA. Further, the plurality of holes HO may overlap the display area DA and may not overlap the non-display area NDA.

The plurality of holes HO may include a first hole HO1 overlapping the first light-emitting area EA1, a second hole HO2 overlapping the second light-emitting area EA2, and a third hole HO3 overlapping the third light-emitting area EA3. In this connection, the plurality of holes HO may correspond to the plurality of light-emitting areas EA1, EA2, and EA3, respectively. That is, the first hole HO1 may correspond to the first light-emitting area EA1, the second hole HO2 may correspond to the second light-emitting area EA2, and the third hole HO3 may correspond to the third light-emitting area EA3.

The plurality of holes HO1, HO2, and HO3 defined in the base substrate 210 may define the light-emitting areas EA1, EA2, and EA3, respectively, and may serve to provide spaces in which the wavelength conversion layer QDL to be described later is received such that the wavelength conversion layer QDL is located in the spaces. To this end, the base substrate 210 in which the plurality of holes HO are defined may have a suitable thickness (e.g., a predefined thickness). For example, the thickness of the base substrate 210 may be in a range of 1 μm to 10 μm.

As described above, the plurality of holes HO may be defined in the base substrate 210. The base substrate 210 may include, for example, sapphire or silicon. The base substrate 210 including sapphire or silicon may be etched using a deep reactive ion etching (DRIE) scheme such that the hole has a high aspect ratio. Thus, the plurality of holes HO having a high aspect ratio may be easily formed. Accordingly, the plurality of holes HO may realize ultra-high resolution light-emitting areas EA1, EA2, and EA3. Thus, an ultra-high resolution display device 10 may be manufactured.

The wavelength conversion layer QDL may be disposed in each of the plurality of holes HO. The wavelength conversion layer QDL may convert or shift a peak wavelength of incident light thereto to a specific peak wavelength different therefrom and may output light having the specific peak wavelength. The wavelength conversion layer QDL may convert a portion of the first light of the blue color emitting from the light-emitting element LE into fourth light of a yellow color. The wavelength conversion layer QDL may mix the first light and the fourth light with each other and may emit fifth light of a white color. The fifth light may be converted to the first light through the first color filter CF1. The fifth light may be converted to the second light through the second color filter CF2. The fifth light may be converted to the third light through the third color filter CF3.

The wavelength conversion layer QDL may be disposed in each of the plurality of holes HO. The wavelength conversion layers QDL may be arranged and spaced from each other. That is, each of the wavelength conversion layers QDL may be formed in a dot-shaped island pattern. For example, the wavelength conversion layer QDL may be disposed in each of the first hole HO1, the second hole HO2, and the third hole HO3, and may correspond thereto in an one-to-one manner. Further, each wavelength conversion layer QDL may overlap each of the first light-emitting area EA1, the second light-emitting area EA2, and the third light-emitting area EA3. In one or more embodiments, each of the wavelength conversion layers QDL may overlap an entirety of each of the first light-emitting area EA1, the second light-emitting area EA2, and the third light-emitting area EA3.

In one or more embodiments, the wavelength conversion layer QDL may include a first base resin BRS1 and first wavelength conversion particles WCP1. The first base resin BRS1 may include a light-transmissive organic material. For example, the first base resin BRS1 may include an epoxy-based resin, an acrylic-based resin, a cardo-based resin or an imide-based resin.

In one or more embodiments, the first wavelength conversion particles WCP1 may convert the first light incident thereto from the light-emitting element LE to the fourth light. For example, the first wavelength conversion particles WCP1 may convert light of the blue wavelength band into light of a yellow wavelength band. The first wavelength conversion particle WCP1 may include a quantum dot (QD), a quantum rod, a fluorescent material, or a phosphorescent material. For example, a quantum dot may refer to a particulate material that emits light of a specific color as electrons transition from a conduction band to a valence band.

The quantum dot may be made of a semiconductor nanocrystal material. The quantum dot may have a specific bandgap based on a composition and a size thereof to absorb light and then emit light having a unique wavelength. Examples of the semiconductor nanocrystal material of the quantum dot may include Group IV nanocrystal, Group II-VI compound nanocrystal, Group III-V compound nanocrystal, Group IV-VI nanocrystal, or combinations thereof.

A Group II-VI compound may be selected from a group consisting of a binary compound selected from a group consisting of CdSe, CdTe, ZnS, ZnSe, ZnTe, ZnO, HgS, HgSe, HgTe, MgSe, MgS, and mixtures thereof; a ternary compound selected from a group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures of thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures of thereof.

The Group III-V compound may be selected from a group consisting of a binary compound selected from a group consisting of GaN, GaP, GaAs, GaSb, AlN, AlP, AlAs, AlSb, InN, InP, InAs, InSb, and mixtures thereof; a ternary compound selected from a group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof; and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The Group IV-VI compound may be selected from a group consisting of a binary compound selected from a group consisting of SnS, SnSe, SnTe, PbS, PbSe, PbTe, and mixtures thereof; a ternary compound selected from a group consisting of SnSeS, SnSeTe, SnSTe, PbSeS, PbSeTe, PbSTe, SnPbS, SnPbSe, SnPbTe, and mixtures thereof; and a quaternary compound selected from a group consisting of SnPbSSe, SnPbSeTe, SnPbSTe, and mixtures thereof. The Group IV element may be selected from a group consisting of Si, Ge, and mixtures thereof. The Group IV compound may be a binary compound selected from a group consisting of SiC, SiGe, and mixtures thereof.

In this connection, the binary compound, the ternary compound, or the quaternary compound may be contained at a uniform concentration and in the particle. Alternatively, the binary compound, the ternary compound, and the quaternary compound may be contained at the same concentration and in the particle. Alternatively, the binary compound, the ternary compound, or the quaternary compound may be contained at a concentration gradient manner and in the particle. Alternatively, the binary compound, the ternary compound, and the quaternary compound may be contained at the same concentration and in the same particle. Further, the first wavelength conversion particle may have a core/shell structure in which one quantum dot is around (e.g. surrounds) another quantum dot. An interface between the core and the shell may have a concentration gradient in which a concentration of an element present in the shell decreases as it goes toward a center.

In one or more embodiments, the quantum dot may have a core-shell structure including a core including the aforementioned nanocrystal and a shell surrounding the core. The shell of the quantum dot may serve as a protective layer to prevent chemical denaturation of the core to maintain semiconductor characteristics thereof and/or as a charging layer to impart electrophoresis ability to the quantum dot. The shell may be composed of a single layer or multiple layers. Examples of the shell of the quantum dot may include an oxide of a metal or a non-metal, a semiconductor compound, or a combination thereof.

For example, the oxide of the metal or the non-metal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$. However, the present disclosure is not limited thereto.

Further, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc. However, the present disclosure is not limited thereto.

The wavelength conversion layer QDL may further include a scattering material to scatter the light from the light-emitting element LE in random directions. The scattering material may have a refractive index different from that of the first base resin BRS1 such that an optical interface may be formed between the scattering material and the first base resin BRS1. For example, the scattering material may be embodied as light scattering particles. The scattering material is not particularly limited as long as the scattering material is capable of scattering at least a portion of light transmitting therethrough. For example, the scattering material may be embodied as metal oxide particles or organic particles. The metal oxide may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). The organic particle may be made of an acrylic-based resin or an urethane-based resin. The scattering material may scatter the light in a random direction regardless of an incidence direction of the incident light thereto while not substantially converting the wavelength of the light.

The larger a thickness of the wavelength conversion layer QDL in the third direction DR3, the higher a content of the first wavelength conversion particles WCP1 included in the wavelength conversion layer QDL. Thus, the optical conversion efficiency of the wavelength conversion layer QDL may be improved. Therefore, the thickness of the wavelength conversion layer QDL is preferably controlled in consideration of the optical conversion efficiency of the wavelength conversion layer QDL.

The wavelength conversion layer QDL of the above-described wavelength conversion substrate 200 may convert a portion of the first light emitting from the light-emitting element LE into the fourth light. The wavelength conversion layer QDL may mix the first light and the fourth light with each other and may emit the fifth light of the white color. The first color filter CF1 which will be described later may transmit therethrough only the first light from the fifth light emitting from the wavelength conversion layer QDL. The second color filter CF2 which will be described later may transmit therethrough only the second light from the fifth light emitting from the wavelength conversion layer QDL. The third color filter CF3 which will be described later may transmit therethrough only the third light from the fifth light emitting from the wavelength conversion layer QDL. Accordingly, the light emitting from the wavelength conversion substrate 200 may be composed of the blue light beam as the first light, the green light beam as the second light, and the red light beam as the third light. In this manner, a full color may be realized.

The plurality of color filters CF1, CF2, and CF3 may be disposed on the base substrate 210. The plurality of color filters CF1, CF2, and CF3 may be disposed on the base substrate 210 and may overlap the plurality of holes HO and the plurality of the wavelength conversion layers QDL, respectively. The plurality of color filters CF1, CF2, and CF3 may include the first color filter CF1, the second color filter CF2, and the third color filter CF3.

The first color filter CF1 may overlap the first light-emitting area EA1. Further, the first color filter CF1 may be disposed on the first hole HO1 of the base substrate 210 and overlap the first hole HO1. The first color filter CF1 may transmit the first light emitting from the light-emitting element LE therethrough, and may absorb or block the second light and the third light. For example, the first color filter CF1 may transmit light of the blue wavelength band therethrough, and may absorb or block light beams of other wavelength bands such as green and red wavelength bands.

The second color filter CF2 may overlap the second light-emitting area EA2. Further, the second color filter CF2 may be disposed on the second hole HO2 of the base substrate 210 and overlap the second hole HO2. The second color filter CF2 may transmit the second light therethrough and absorb or block the first light and the third light. For example, the second color filter CF2 transmits light of the green wavelength band therethrough, and may absorb or block light beams of other wavelength bands such as blue and red wavelength bands.

The third color filter CF3 may overlap the third light-emitting area EA3. Further, the third color filter CF3 may be disposed on the third hole HO3 of the base substrate 210 and may overlap the third hole HO3. The third color filter CF3 may transmit the third light therethrough and absorb or block the first light and the second light. For example, the third color filter CF3 transmits light of the red wavelength band therethrough, and may absorb or block light beams of other wavelength bands such as blue and green wavelength bands.

As shown in FIG. 7, a planar area of each of the plurality of color filters CF1, CF2, and CF3 may be larger than a planar area of each of the plurality of light-emitting areas EA1, EA2 and EA3 and may be larger than a planar area of each of the plurality of holes HO1, HO2, and HO3. For example, the planar area of the first color filter CF1 may be larger than each of the planar area of the first light-emitting area EA1 and the planar area of the first hole HO1. The planar area of the second color filter CF2 may be larger than each of the planar area of the second light-emitting area EA2 and the planar area of the second hole HO2. The planar area of the third color filter CF3 may be larger than each of the planar area of the third light-emitting area EA3 and the planar area of the third hole HO3. However, the present disclosure is not limited thereto. The planar area of each of the plurality of color filters CF1, CF2, and CF3 may be equal to the planar area of each of the plurality of light-emitting areas EA1, EA2, and EA3 and the plurality of holes HO1, HO2, and HO3.

As described above, in one or more embodiments, including the common electrode CME as well as the first reflective layer RF1 may prevent light beams from one of the light-emitting areas EA1, EA2, and EA3 from invading into another of the light-emitting areas EA1, EA2, and EA3 adjacent thereto and from being mixed with light beams therein. In the display device 10 according to one or more embodiments, the plurality of holes HO may be defined in the base substrate 210, and thus, the ultra-high resolution light-emitting areas EA1, EA2, and EA3 may be formed. Accordingly, the ultra-high resolution display device 10 having the ultra-high resolution light-emitting areas EA1, EA2, and EA3 may be implemented.

Hereinafter, a display device 10 according to one or more embodiments will be described with reference to other drawings.

Figure 9:
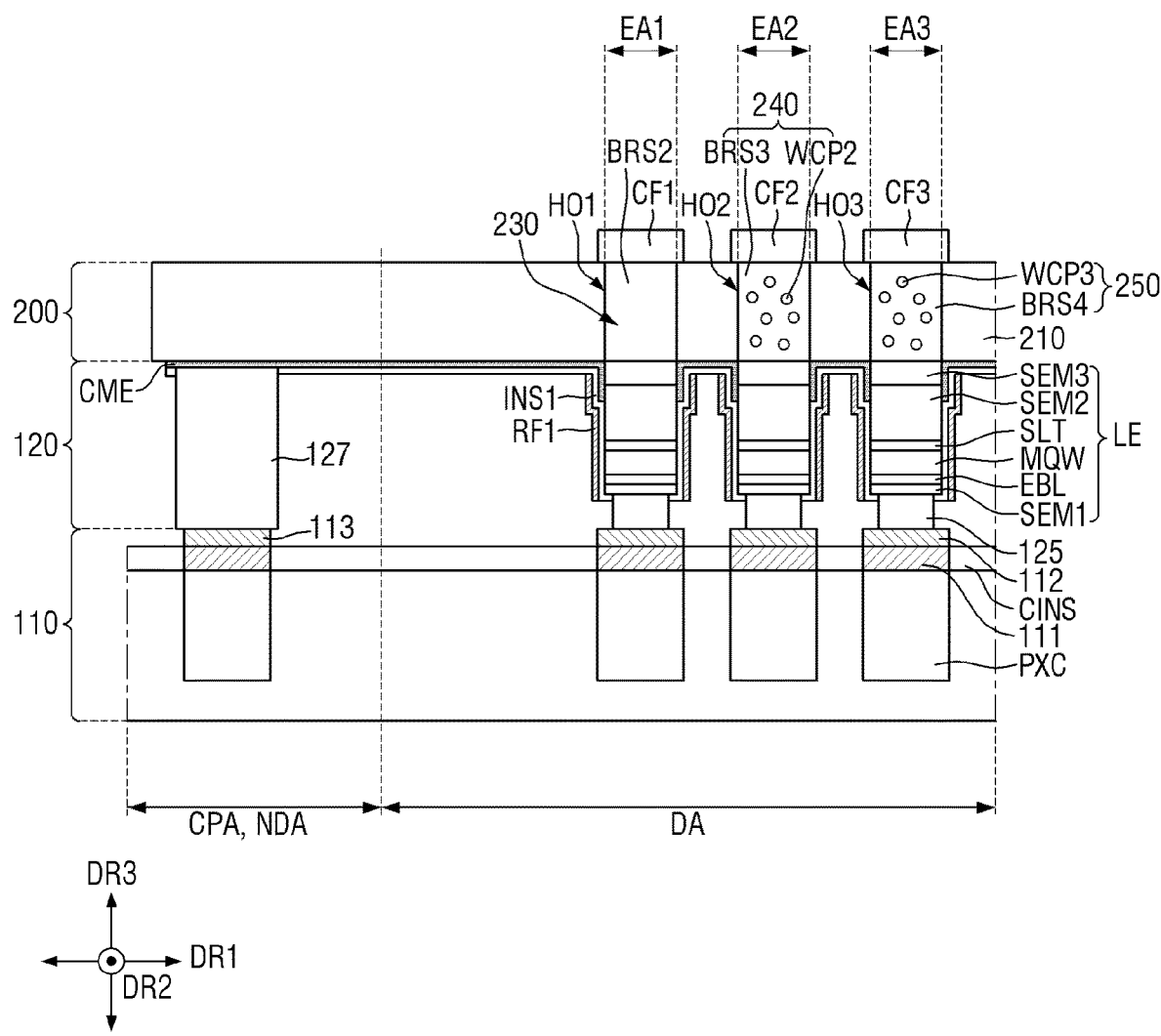
FIG. 9 is a cross-sectional view showing a display panel according to one or more embodiments.

Referring to FIG. 9, a configuration of the wavelength conversion layer QDL of the display device 10 may be modified. This embodiment is different from the embodiment of FIG. 4 to FIG. 8 as described above in that the wavelength conversion layer QDL of this embodiment includes a light-transmissive pattern 230, a first wavelength conversion pattern 240, and a second wavelength conversion pattern 250. Hereinafter, the description of the same components therebetween will be simplified or omitted, and the differences therebetween will be described in detail.

The wavelength conversion layer QDL may include the light-transmissive pattern 230, the first wavelength conversion pattern 240, and the second wavelength conversion pattern 250.

The light-transmissive pattern 230 may be disposed in the first hole HO1, and may overlap each of the first light-emitting area EA1 and the first color filter CF1. The light-transmissive pattern 230 may transmit light incident thereto therethrough. The first light emitted from the light-emitting element LE disposed in the first light-emitting area EA1 may be blue light. The first light as the blue light may pass through the light-transmissive pattern 230 and may be output out of the first light-emitting area EA1.

In one or more embodiments, the light-transmissive pattern 230 may include a second base resin BRS2. The second base resin BRS2 may be made of a material having high light transmittance. In one or more embodiments, the second base resin BRS2 may be made of an organic material. The second base resin BRS2 may include substantially the same material as that of the above-mentioned first base resin BRS1. For example, the second base resin BRS2 may include an organic material such as an epoxy-based resin, an acrylic-based resin, a cardo-based resin or an imide-based resin.

The first wavelength conversion pattern 240 may be disposed in the second hole HO2, and may overlap each of the second light-emitting area EA2 and the second color filter CF2. The first wavelength conversion pattern 240 may convert or shift a peak wavelength of incident light thereto to a specific peak wavelength different therefrom and may output light having the specific peak wavelength. In one or more embodiments, the first wavelength conversion pattern 240 may convert the first light emitted from the light-emitting element LE in the second light-emitting area EA2 to the second light as green light having a peak wavelength in a range of about 510 nm to 550 nm and may emit the green light.

The first wavelength conversion pattern 240 may include a third base resin BRS3 and second wavelength conversion particles WCP2 dispersed in the third base resin BRS3.

The third base resin BRS3 may be made of a material having high light transmittance. In one or more embodiments, the third base resin BRS3 may be made of an organic material. The third base resin BRS3 may be made of the same material as that of the first base resin BRS1 or the second base resin BRS2, or may include at least one of the materials as the examples of the constituent material of the first base resin BRS1 or the second base resin BRS2.

The second wavelength conversion particles WCP2 may convert or shift a peak wavelength of incident light thereto to a specific peak wavelength different therefrom. In one or more embodiments, the second wavelength conversion particles WCP2 may convert the first color light as the blue light from the light-emitting element LE into green light having a peak wavelength in a range of about 510 nm to 550 nm and emit the green light.

An example of the second wavelength conversion particle WCP2 may include a quantum dot, a quantum rod, or phosphor. A more detailed description of the second wavelength conversion particle WCP2 is substantially the same as or similar to the description of the first wavelength conversion particle WCP1, and thus will be omitted.

A portion of the first light as the blue light emitting from the light-emitting element LE may not be converted to the second light as the green light by the second wavelength conversion particle WCP2, but may pass through the first wavelength conversion pattern 240. However, the portion of the first light that has not been converted to the green light may be blocked by the second color filter CF2. To the contrary, the green light into which a portion of the first light emitting from the light-emitting element LE has been converted by the first wavelength conversion pattern 240 may pass through the second color filter CF2 and may emit to an outside.

The second wavelength conversion pattern 250 may be disposed in the third hole HO3, and may overlap each of the third light-emitting area EA3 and the third color filter CF3. The second wavelength conversion pattern 250 may convert or shift a peak wavelength of light incident thereto into a specific peak wavelength different therefrom and may emit light having the specific peak wavelength. In one or more embodiments, the second wavelength conversion pattern 250 may convert the first light emitting from the light-emitting element LE in the third light-emitting area EA3 into the third light as red light having a peak wavelength in a range of about 610 nm to about 650 nm, and may emit the third light.

The second wavelength conversion pattern 250 may include a fourth base resin BRS4 and third wavelength conversion particles WCP3 dispersed in the fourth base resin BRS4. The fourth base resin BRS4 may be made of a material having high light transmittance. In one or more embodiments, the fourth base resin BRS4 may be made of an organic material. The fourth base resin BRS4 may be made of the same material as that of the above-mentioned first base resin BRS1, second base resin BRS2, and third base resin BRS3, or may include at least one of the materials as the examples of the constituent material of the first base resin BRS1 or the second base resin BRS2.

The third wavelength conversion particles WCP3 may convert or shift a peak wavelength of incident light thereto to a specific peak wavelength different therefrom. In one or more embodiments, the third wavelength conversion particles WCP3 may convert the first color light as the blue light from the light-emitting element LE into red light having a peak wavelength in a range of about 610 nm to 650 nm and emit the red light.

An example of the third wavelength conversion particle WCP3 may include a quantum dot, a quantum rod, or phosphor. A more detailed description of the third wavelength conversion particle WCP3 is substantially the same as or similar to the description of the first wavelength conversion particle WCP1, and thus will be omitted.

A portion of the first light as the blue light emitting from the light-emitting element LE may not be converted to the third light as the red light by the third wavelength conversion particle WCP3, but may pass through the second wavelength conversion pattern 250. However, the portion of the first light that has not been converted to the red light may be blocked with the third color filter CF3 disposed on the second wavelength conversion pattern 250. To the contrary, the red light into which a portion of the first light emitting from the light-emitting element LE has been converted by the second wavelength conversion pattern 250 may pass through the third color filter CF3 and may emit to an outside.

Each of the first wavelength conversion pattern 240 and the second wavelength conversion pattern 250 may further include the scattering material as described. However, the present disclosure is not limited thereto.

The display device 10 according to one or more embodiments as described above may include the wavelength conversion layer QDL including the light-transmissive pattern 230, the first wavelength conversion pattern 240, and the second wavelength conversion pattern 250, thereby improving light emission efficiency of each of the blue, green, and red light beams.

Figure 10:
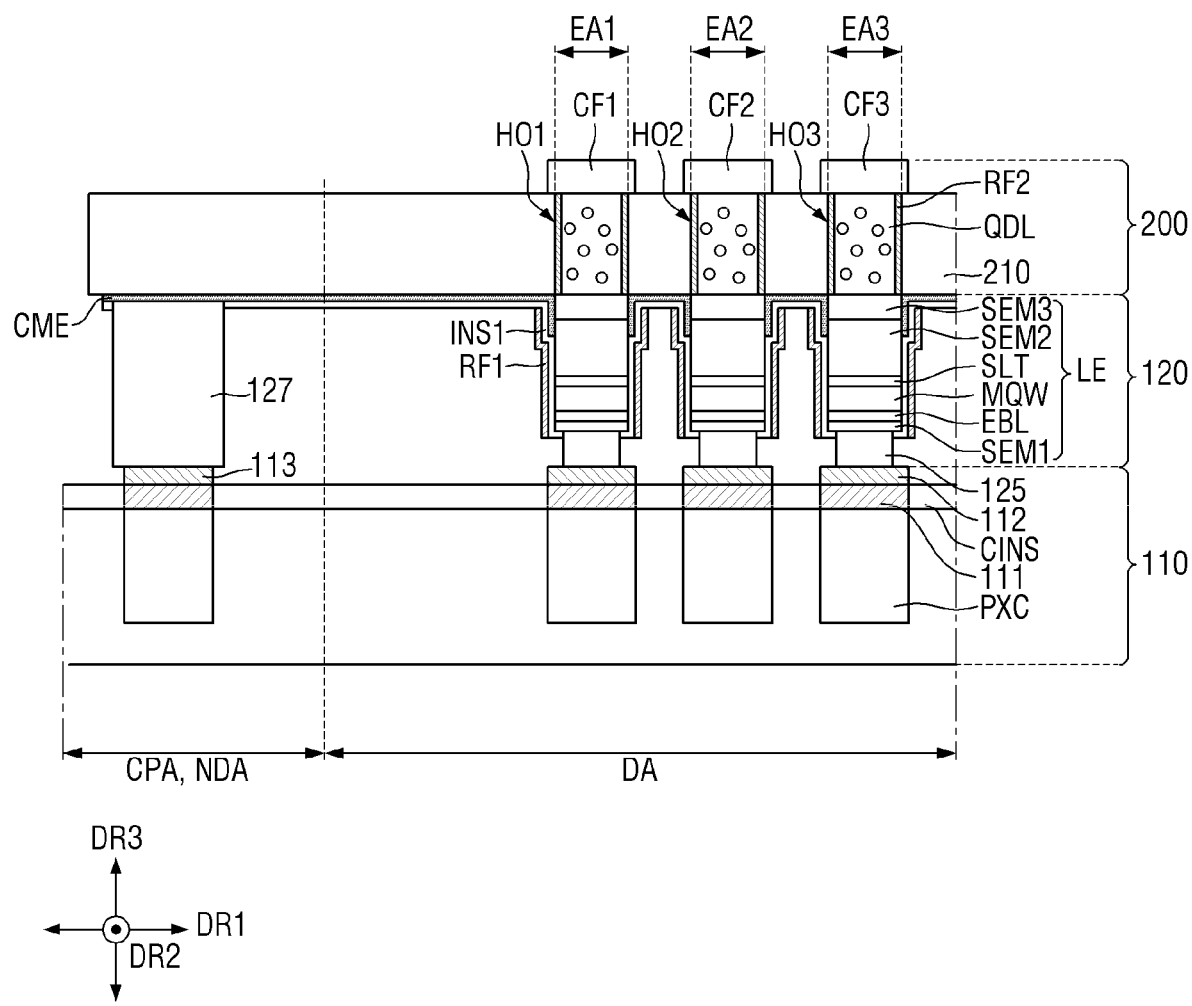
FIG. 10 is a cross-sectional view showing a display panel according to still one or more embodiments.

FIG. 10 is a cross-sectional view showing a display panel according to one or more embodiments.

Referring to FIG. 10, a display panel 100 of this embodiment is different from the embodiments of FIG. 4 to FIG. 9 as described above in that the display panel 100 of this embodiment further includes a second reflective layer RF2 on a side face (e.g., a side surface) of each of the plurality of holes HO. Hereinafter, the description of the same components therebetween will be simplified or omitted, and the differences therebetween will be described in detail.

The second reflective layer RF2 may be disposed on and along the plurality of holes HO. The second reflective layer RF2 may be disposed on the side face (e.g., the side surface) of each of the plurality of holes HO. The second reflective layer RF2 plays a role of reflecting light beams emitting from the light-emitting element LE and then traveling not toward a top of the display panel but in a lateral direction thereof. The second reflective layer RF2 may be disposed in the display area DA, and may overlap each of the first light-emitting area EA1, the second light-emitting area EA2, and the third light-emitting area EA3. However, the present disclosure is not limited thereto. The second reflective layer RF2 may not overlap each of the light-emitting areas EA1, EA2, and EA3 when a planar area of each of the plurality of holes HO is larger than a planar area of each of the light-emitting areas EA1, EA2, and EA3.

The second reflective layer RF2 may be around (e.g., surround) each of the wavelength conversion layers QDL in the display area DA so that a converted portion of light from the wavelength conversion layer QDL may emit toward a top of the display panel. Each second reflective layer RF2 around (e.g., surrounding) a corresponding wavelength conversion layer QDL of interest may be spaced from another second reflective layer RF2 around (e.g., surrounding) another wavelength conversion layer QDL adjacent to a corresponding wavelength conversion layer QDL of interest. That is, the second reflective layers RF2 may be arranged and may be spaced from each other in the first direction DR1 and the second direction DR2. For example, a planar shape of the second reflective layer RF2 may be a rectangular closed-loop shape. However, the present disclosure is not limited thereto. The planar shape of the second reflective layer RF2 may have various shapes based on the planar shape of each of the plurality of holes HO.

The second reflective layer RF2 may include the same material as that of the first reflective layer RF1 as described above. For example, the second reflective layer RF2 may include a highly reflective metal material such as aluminum (Al). A thickness of the second reflective layer RF2 may be approximately 0.1 µm. However, the present disclosure is not limited thereto.

In one or more embodiments, the display device may include each second reflective layer RF2 disposed on the side face (e.g., the side surface) of each of the plurality of holes HO and surrounding each wavelength conversion layer QDL, thereby preventing the converted portion of the light from the wavelength conversion layer QDL from invading into adjacent light-emitting areas. Accordingly, mixing between light beams of different colors may be prevented.

Figure 11:
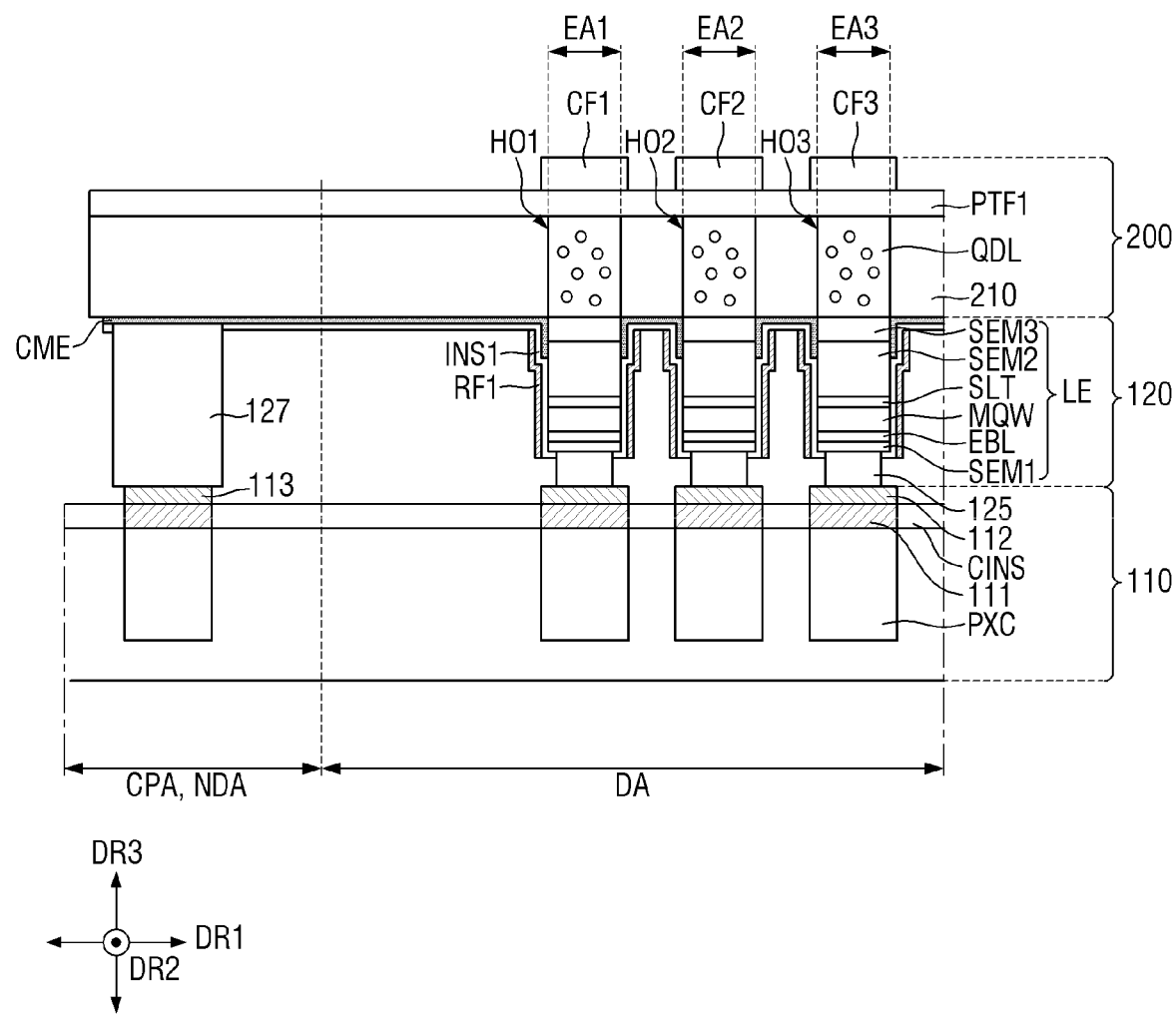
FIG. 11 is a cross-sectional view showing a display panel according to one or more embodiments.

FIG. 11 is a cross-sectional view showing a display panel according to one or more embodiments.

Referring to FIG. 11, a display panel 100 in this embodiment is different from the embodiments of FIG. 4 to FIG. 10 as described above in that the display panel 100 in this embodiment further includes a first protective layer PTF1 between the plurality of color filters CF1, CF2, and CF3 and the wavelength conversion layer QDL. Hereinafter, the description of the same components therebetween will be simplified or omitted, and the differences therebetween will be described in detail.

The first protective layer PTF1 may be disposed over an entirety of the display area DA and an entirety of the non-display area NDA, and may be disposed between the wavelength conversion layer QDL and the plurality of color filters CF1, CF2, and CF3. The first protective layer PTF1 may protect the plurality of color filters CF1, CF2, and CF3 from an etchant or the like in a subsequent process.

One face (e.g., one surface), for example, a top face (e.g., a top surface) of the first protective layer PTF1 may contact a bottom face of each of the plurality of color filters CF1, CF2, and CF3. The opposite face, for example, a bottom face of the first protective layer PTF1 may contact a top face of the base substrate 210 and a top face of the wavelength conversion layer QDL.

The first protective layer PTF1 may include an inorganic insulating material to protect the plurality of color filters CF1, CF2, and CF3. For example, the first protective layer PTF1 may include silicon oxide ($SiO_x$), silicon nitride ($SiN_x$), silicon oxynitride ($SiO_xN_y$), aluminum oxide ($Al_xO_y$), aluminum nitride (AlN), and the like. However, the present disclosure is not limited thereto. The first protective layer PTF1 may have a suitable thickness (e.g., a predetermined thickness) which may be in a range of 0.01 µm to 1 µm. However, the present disclosure is not limited thereto.

In one or more embodiments, the display device may include the first protective layer PTF1 disposed between the plurality of color filters CF1, CF2, and CF3 and the wavelength conversion layer QDL, thereby preventing the plurality of color filters CF1, CF2, and CF3 from being damaged in the subsequent process.

Figure 12:
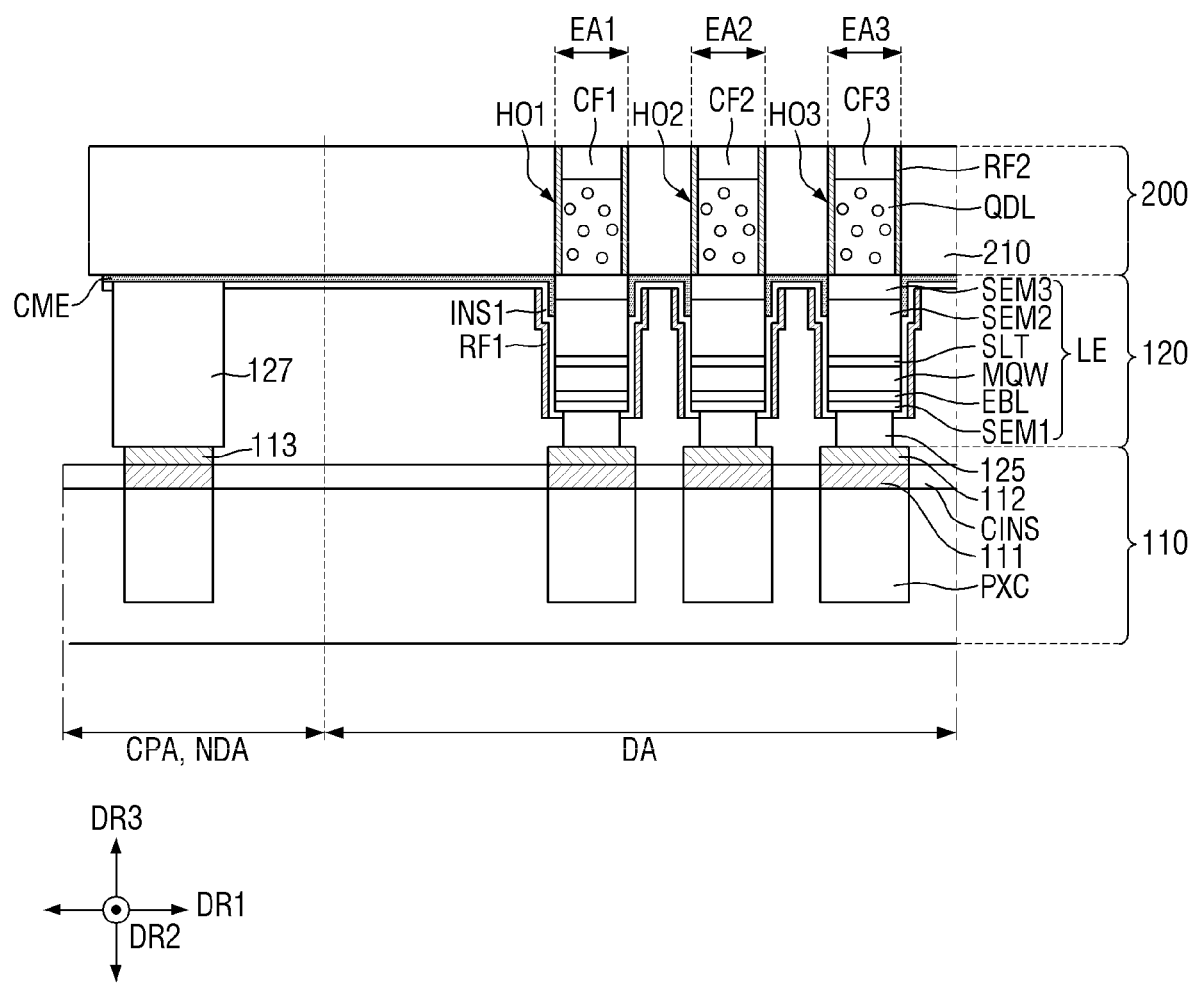
FIG. 12 is a cross-sectional view showing a display panel according to one or more embodiments.

FIG. 12 is a cross-sectional view showing a display panel according to one or more embodiments.

Referring to FIG. 12, a display panel 100 in this embodiment is different from the embodiments of FIG. 4 to FIG. 11 as described above in that in this embodiment, each of the color filters CF1, CF2, and CF3 is received in each of the plurality of holes HO of the base substrate 210. Hereinafter, the description of the same components therebetween will be simplified or omitted, and the differences therebetween will be described in detail.

The plurality of holes HO may have a depth greater than that of each hole of each of the above-described embodiments. Accordingly, each of the plurality of color filters CF1, CF2, and CF3 and each of the wavelength conversion layers QDL may be received to be located in each of the plurality of holes HO of the base substrate 210.

For example, the first color filter CF1, the second reflective layer RF2, and the wavelength conversion layer QDL may be received to be located in the first hole HO1 disposed in the first light-emitting area EA1. The first color filter CF1 may be in contact with a top face (e.g., a top surface) of the wavelength conversion layer QDL and the side faces (e.g., the side surfaces) of the second reflective layer RF2. The first color filter CF1 may fill the first hole HO1 such that the top face (e.g., the top surface) of the base substrate 210 and the top face (e.g., the top surface) of the first color filter CF1 may be coplanar with each other.

The second color filter CF2, the second reflective layer RF2, and the wavelength conversion layer QDL may be received to be located in the second hole HO2 disposed in the second light-emitting area EA2. The second color filter CF2 may be in contact with a top face (e.g., a top surface) of the wavelength conversion layer QDL and side faces (e.g., side surfaces) of the second reflective layer RF2. The second color filter CF2 may fill the second hole HO2 such that the top face (e.g., the top surface) of the base substrate 210 and a top face (e.g., a top surface) of the second color filter CF2 may be coplanar with each other.

The third color filter CF3, the second reflective layer RF2, and the wavelength conversion layer QDL may be received to be located in the third hole HO3 disposed in the third light-emitting area EA3. The third color filter CF3 may be in contact with a top face (e.g., a top surface) of the wavelength conversion layer QDL and side faces (e.g., side surfaces) of the second reflective layer RF2. The third color filter CF3 may fill the third hole HO3 such that the top face (e.g., the top surface) of the base substrate 210 and a top face (e.g., a top surface) of the third color filter CF3 may be coplanar with each other. However, the present disclosure is not limited thereto. Each of the color filters CF1, CF2, and CF3 may protrude upwardly beyond the top face (e.g., the top surface) of the base substrate 210. Alternatively, a vertical level of the top face (e.g., the top surface) of each of the color filters CF1, CF2, and CF3 may be lower than a vertical level of the top face (e.g., the top surface) of the base substrate 210.

In one or more embodiments, the depth of each of the plurality of holes HO of the base substrate 210 may be larger such that each of the plurality of color filters CF1, CF2, and CF3 and each wavelength conversion layer QDL may be received to be located in each of the plurality of holes HO. Thus, each of the plurality of color filters CF1, CF2, and CF3 and each wavelength conversion layer QDL may be easily aligned and the manufacturing process thereof may be easily achieved.

In the above-described embodiment, a case in which the second reflective layer RF2 is formed on each of the plurality of holes HO has been described by way of example. However, in one or more embodiments, the second reflective layer RF2 may be omitted.

Figure 13:
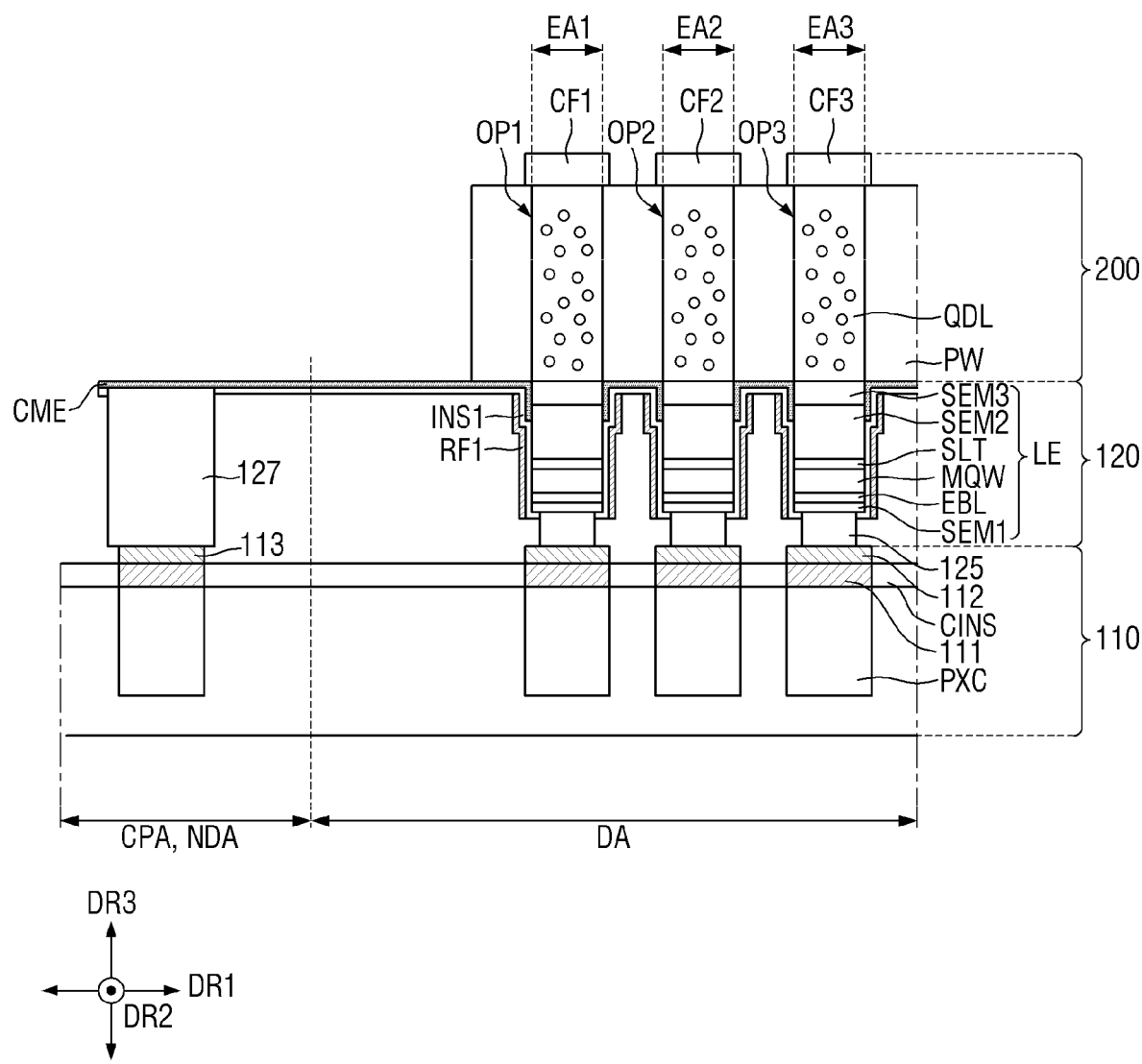
FIG. 13 is a cross-sectional view showing a display panel according to one or more embodiments.

FIG. 13 is a cross-sectional view showing a display panel according to one or more embodiments.

Figure 14:
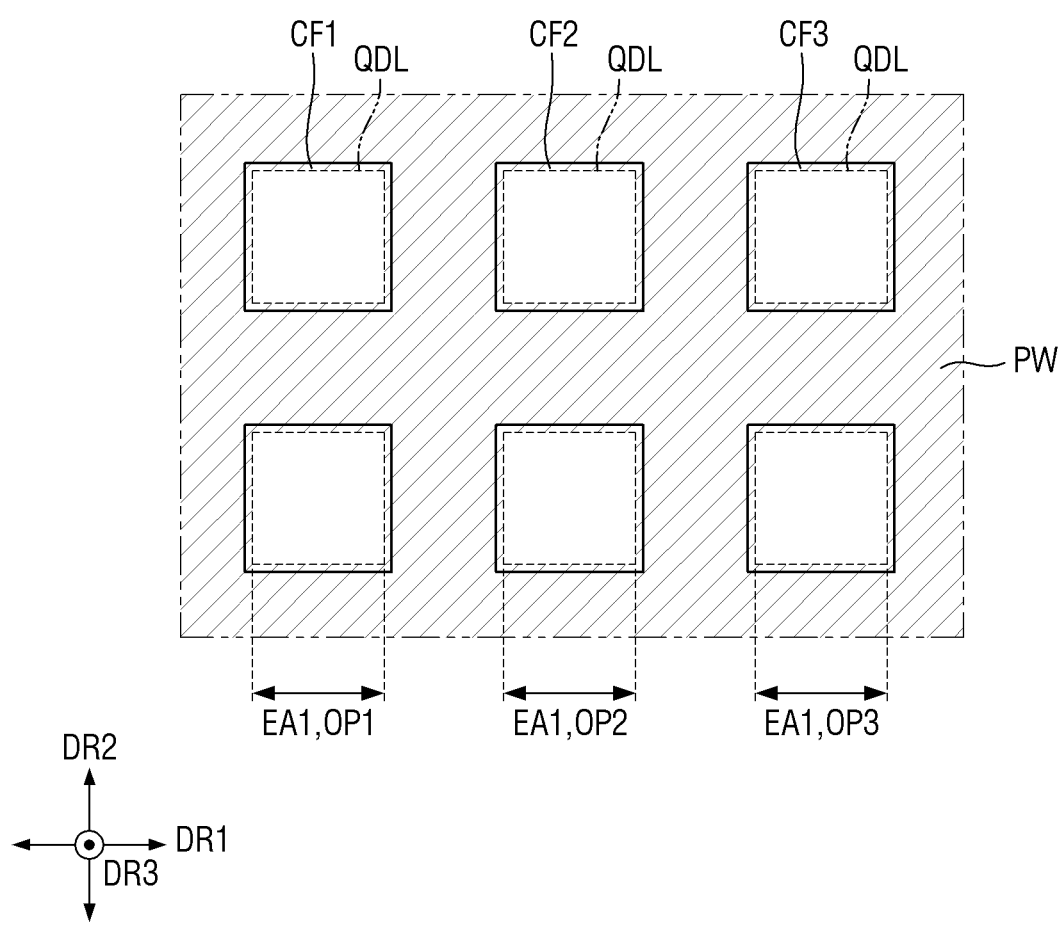
FIG. 14 is a plan view schematically showing a plurality of light-emitting areas.

FIG. 14 is a plan view schematically showing a plurality of light-emitting areas.

Referring to FIG. 13 and FIG. 14, a display panel 100 of this embodiment is different from the above-described embodiments of FIG. 4 to FIG. 12 in that the display panel 100 of this embodiment is free of the base substrate 210, and further includes a partitioning wall PW having a plurality of openings OP1, OP2, and OP3 defined therein, and the wavelength conversion layer QDL is received to be located in each of the plurality of openings OP1, OP2, and OP3. Hereinafter, the description of the same components therebetween will be simplified or omitted, and the differences therebetween will be described in detail.

The wavelength conversion substrate 200 may further include the partitioning wall PW. The partitioning wall PW may be disposed on the common electrode CME of the display area DA, and may define each of the plurality of light-emitting areas EA1, EA2, and EA2. The partitioning wall PW may extend in the first direction DR1 and the second direction DR2, and may be formed in a grid pattern throughout the display area DA. Further, the partitioning wall PW may overlap the display area DA and may not overlap the non-display area NDA.

The partitioning wall PW may have the plurality of openings OP1, OP2, and OP3 defined therein respectively exposing the underlying light-emitting elements LE. The plurality of openings OP1, OP2, and OP3 may include a first opening OP1 overlapping the first light-emitting area EA1, a second opening OP2 overlapping the second light-emitting area EA2, and a third opening OP3 overlapping the third light-emitting area EA3. In this connection, the plurality of openings OP1, OP2, and OP3 may correspond to the plurality of light-emitting areas EA1, EA2, and EA3, respectively. That is, the first opening OP1 may correspond to the first light-emitting area EA1, the second opening OP2 may correspond to the second light-emitting area EA2, and the third opening OP3 may correspond to the third light-emitting area EA3.

The partitioning wall PW may serve to provide a space in which the wavelength conversion layer QDL is received to be located. To this end, the partitioning wall PW may have a suitable thickness (e.g., a predefined thickness). For example, a thickness of the partitioning wall PW may be in a range of 1 μm to 10 μm. The partitioning wall PW may include a metal or an organic insulating material so that the suitable thickness (e.g., a predefined thickness) may be secured. The metal may include a material which may be subjected to plating, for example, gold (Au). In one example, the organic insulating material may include an epoxy-based resin, an acrylic-based resin, a cardo-based resin, or an imide-based resin.

Each wavelength conversion layer QDL may be received to be located in each of the plurality of openings OP1, OP2, and OP3 defined in the partitioning wall PW. Each wavelength conversion layer QDL may be received to be located in each of the first opening OP1, the second opening OP2, and the third opening OP3 so as to fill each of the openings OP1, OP2, and OP3. A top face (e.g., a top surface) of each wavelength conversion layer QDL may be coplanar with a top face (e.g., a top surface) of the partitioning wall PW. However, the present disclosure is not limited thereto. A top face (e.g., a top surface) of at least one wavelength conversion layer QDL may be higher than a top face (e.g., a top surface) of each of the other wavelength conversion layers QDL or higher than the top face (e.g., the top surface) of the partitioning wall PW. A bottom face (e.g., a bottom surface) of each wavelength conversion layer QDL may be in contact with the third semiconductor layer SEM3 of each light-emitting element LE, while the top face (e.g., the top surface) thereof may be in contact with each of the color filters CF1, CF2, and CF3.

The plurality of color filters CF1, CF2, and CF3 may be disposed on the partitioning wall PW. Each of the plurality of color filters CF1, CF2, and CF3 may be disposed on an opposite face (e.g., an opposite surface) of the partitioning wall PW to one face (e.g., one surface) on which each of the plurality of light-emitting elements LE is formed. The plurality of color filters CF1, CF2, and CF3 may correspond to the plurality of openings OP1, OP2, and OP3, respectively. For example, the first color filter CF1 may overlap the first opening OP1, the second color filter CF2 may overlap the second opening OP2, and the third color filter CF3 may overlap the third opening OP3.

As shown in FIG. 14, a planar area of each of the plurality of color filters CF1, CF2, and CF3 may be larger than a planar area of each of the plurality of openings OP1, OP2, and OP3. For example, the planar area of the first color filter CF1 may be larger than the planar area of the first opening OP1. The planar area of the second color filter CF2 may be larger than the planar area of the second opening OP2. The planar area of the third color filter CF3 may be larger than the planar area of the third opening OP3. However, the present disclosure is not limited thereto. The planar area of each of the plurality of color filters CF1, CF2, and CF3 may be equal to the planar area of each of the plurality of openings OP1, OP2, and OP3.

In one or more embodiments, the plurality of light-emitting elements LE may be disposed under the wavelength conversion layer QDL (see, FIG. 13), or the partitioning wall PW and may be spaced from each other. The common electrode CME may be disposed on the partitioning wall PW and on each of the plurality of light-emitting elements LE. The common electrode CME may overlap the partitioning wall PW and contact a bottom face (e.g., a bottom surface) of the partitioning wall PW. The common electrode CME may not overlap each of the plurality of openings OP1, OP2, OP3 and the wavelength conversion layer QDL.

Further, the common electrode CME may contact a portion of a side face (e.g., a side surface) of each of the plurality of light-emitting elements LE. For example, the common electrode CME may contact a portion of the side face (e.g., the side surface) of the second semiconductor layer SEM2 and an entire side face (e.g., an entire side surface) of the third semiconductor layer SEM3 of each of the plurality of light-emitting elements LE. As a result, the common electrode CME may be electrically connected to the plurality of light-emitting elements LE to transmit the common voltage to the light-emitting elements LE.

In one or more embodiments, instead of the base substrate, the partitioning wall PW may be formed which has a vertical dimension sized such that a space where the wavelength conversion layer QDL may be disposed is defined. This may increase an amount of the wavelength conversion layer QDL such that the wavelength conversion efficiency may be improved.

In the above-described embodiment, a case in which each wavelength conversion layer QDL is disposed in each of the plurality of openings OP1, OP2, and OP3 of the partitioning wall PW is described by way of example. The present disclosure is not limited thereto. Each of the plurality of openings OP1, OP2, and OP3 may further receive each of the color filters CF1, CF2, and CF3.

Hereinafter, a manufacturing process of the display device 10 according to one or more embodiments will be described with reference to other drawings.

Figure 15:
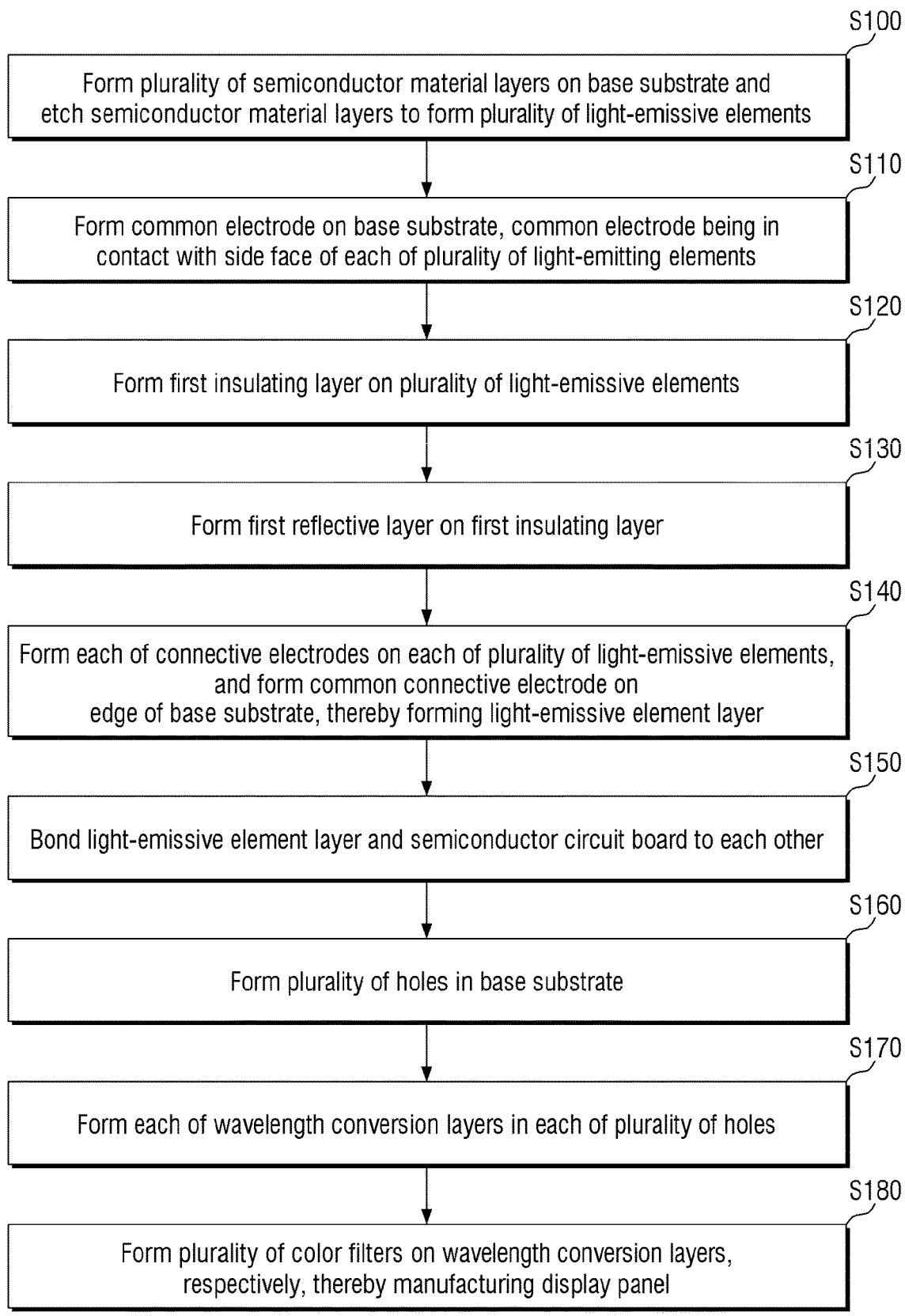
FIG. 15 is a flowchart showing a method for manufacturing a display panel according to one or more embodiments.

FIG. 15 is a flowchart showing a method for manufacturing a display panel according to one or more embodiments. FIG. 16 to FIG. 27 are cross-sectional views to illustrate the method for manufacturing the display panel according to one or more embodiments.

FIG. 16 to FIG. 27 show cross-sectional views of intermediate structures according to a formation order of layers of the display panel 100 of the display device 10, respectively. FIG. 17 to FIG. 27 mainly illustrate a manufacturing process of the light-emitting element layer 120 and the wavelength conversion substrate 200 and may correspond to the cross-sectional view of FIG. 5. Hereinafter, the method for manufacturing the display panel shown in FIG. 16 to FIG. 27 will be described in conjunction with FIG. 15.

Figure 16:
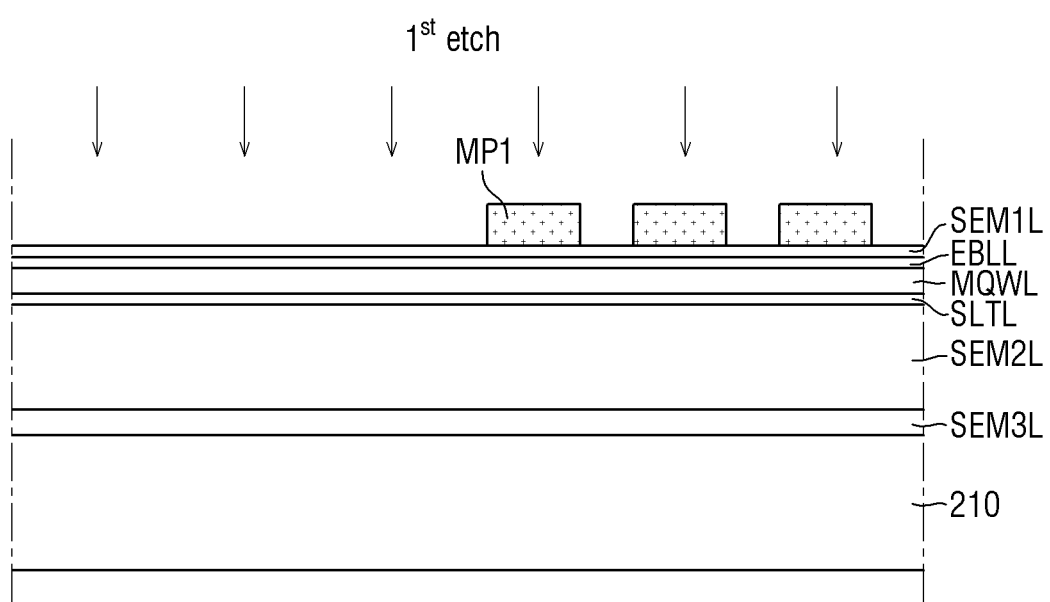
FIG. 16 to FIG. 27 are cross-sectional views for illustrating a method for manufacturing a display panel according to one or more embodiments.

Referring to FIG. 16, a plurality of semiconductor material layers SEM3, SEM2L, SLTL, MQWL, EBLL, and SEM1L are formed on the base substrate 210 (S100 in FIG. 15).

First, the base substrate 210 is provided. The base substrate 210 may be a sapphire substrate ($Al_2O_3$) or a silicon wafer including silicon. However, the present disclosure is not limited thereto. In one or more embodiments, a case where the base substrate 210 is embodied as the sapphire substrate will be described by way of example.

The plurality of semiconductor material layers SEM3L, SEM2L, SLTL, MQWL, EBLL, and SEM1L are formed on the base substrate 210. The plurality of semiconductor material layers may be grown using an epitaxial method and may be formed by growing a seed crystal. In this connection, each of the semiconductor material layers may be formed using electron beam deposition, physical vapor deposition (PVD), chemical vapor deposition (CVD), plasma laser deposition (PLD), dual-type thermal evaporation, sputtering, metal organic chemical vapor deposition (MOCVD), etc. In one or more embodiments, the metal-organic chemical vapor deposition (MOCVD) may be employed. However, the present disclosure is not limited thereto.

A precursor material for forming the plurality of semiconductor material layers may not be particularly limited and may be selected from a group of materials used conventionally for forming a target material. In one example, the precursor material may be a metal precursor including an alkyl group such as a methyl group or an ethyl group. For example, the precursor material may be a compound such as trimethyl gallium ($Ga(CH_3)_3$), trimethyl aluminum ($Al(CH_3)_3$), triethyl phosphate ($(C_2H_5)_3PO_4$). However, the present disclosure is not limited thereto.

For example, the third semiconductor material layer SEM3L is formed on the base substrate 210. Although the drawing shows that one third semiconductor layer SEM3L is stacked, the present disclosure is not limited thereto. A plurality of third semiconductor layers SEM3L may be formed. The third semiconductor material layer SEM3L may be disposed to reduce a difference between lattice constants of the second semiconductor material layer SEM2L and the base substrate 210. In one example, the third semiconductor material layer SEM3L may include a semiconductor material which is undoped with an n-type or p-type dopant. In one or more embodiments, the third semiconductor material layer SEM3L may be made of at least one of InAlGaN, GaN, AlGaN, InGaN, AlN and InN as undoped. However, the present disclosure is not limited thereto.

Using the above-described method, a second semiconductor material layer SEM2L, a superlattice material layer SLTL, an active material layer MQWL, an electron blocking material layer EBLL, and a first semiconductor material layer SEM1L are sequentially formed on the third semiconductor material layer SEM3L.

Subsequently, the plurality of semiconductor material layers SEM3L, SEM2L, SLTL, MQWL, EBLL, and SEM1L are etched to form the plurality of light-emitting elements LE.

For example, a plurality of first mask patterns MP1 is formed on the first semiconductor material layer SEM1L. The first mask pattern MP1 may be embodied as a hard mask including an inorganic material or a photoresist mask including an organic material. The first mask pattern MP1 may prevent the underlying semiconductor material layers SEM3L, SEM2L, SLTL, MQWL, EBLL, and SEM1L from being etched. Subsequently, a portion of each of the plurality of semiconductor material layers may be etched using each of the plurality of first mask patterns MP1 as a mask ($1^{st}$ etch). Thus, the plurality of light-emitting elements LE are formed.

Figure 17:
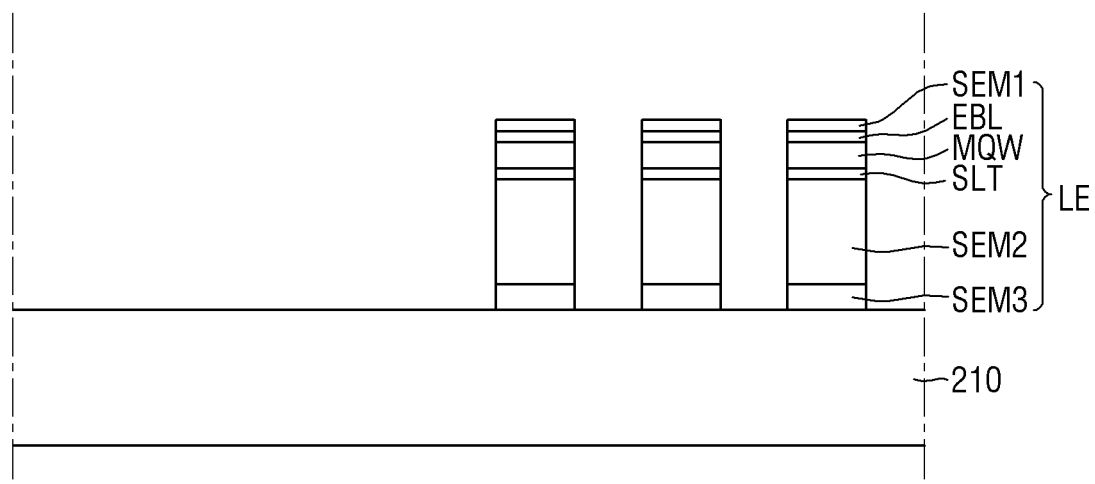

As shown in FIG. 17, on the base substrate 210, a portion of each of the plurality of semiconductor material layers SEM3L, SEM2L, SLTL, MQWL, EBLL, and SEM1L that does not overlap the first mask pattern MP1 is etched and removed, while a portion thereof overlapping the first mask pattern MP1 is not etched. Accordingly, the unetched portion may act as each of the plurality of light-emitting elements LE.

The semiconductor material layers may be etched using a conventional method. For example, a process of etching the semiconductor material layers may include dry etching, wet etching, reactive ion etching (RIE), deep reactive ion etching (DRIE), inductively coupled plasma reactive ion etching (ICP-RIE), etc. The dry etching may realize anisotropic etching and thus may be suitable for vertical etching. When the above-described etching method is used, an etchant may be $Cl_2$ or $O_2$. However, the present disclosure is not limited thereto.

A portion of each of the plurality of semiconductor material layers SEM3L, SEM2L, SLTL, MQWL, EBLL, and SEM1L overlapping the first mask pattern MP1 may not be etched but may constitute each of the plurality of light-emitting elements LE. As a result, the plurality of light-emitting elements LE may be formed such that each of the plurality of light-emitting elements LE may include the third semiconductor layer SEM3, the second semiconductor layer SEM2, the superlattice layer SLT, the active layer MQW, the electron blocking layer EBL, and the first semiconductor layer SEM1.

Subsequently, the common electrode CME in contact with a portion of the side face (e.g., the side surface) of each of the plurality of light-emitting elements LE is formed on the base substrate 210 (S110 in FIG. 15).

Figure 18:
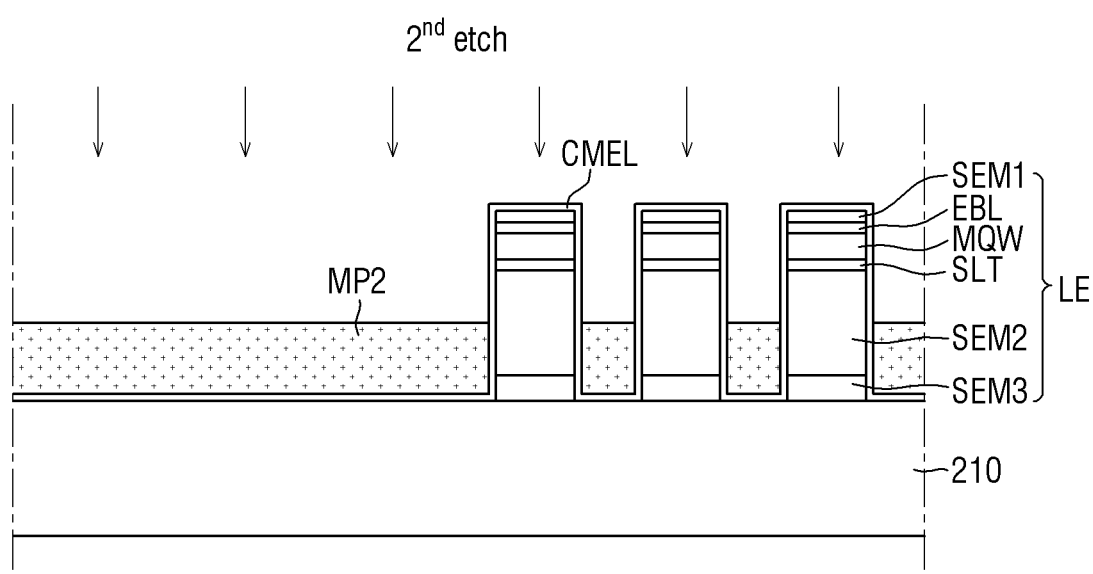
Figure 19:
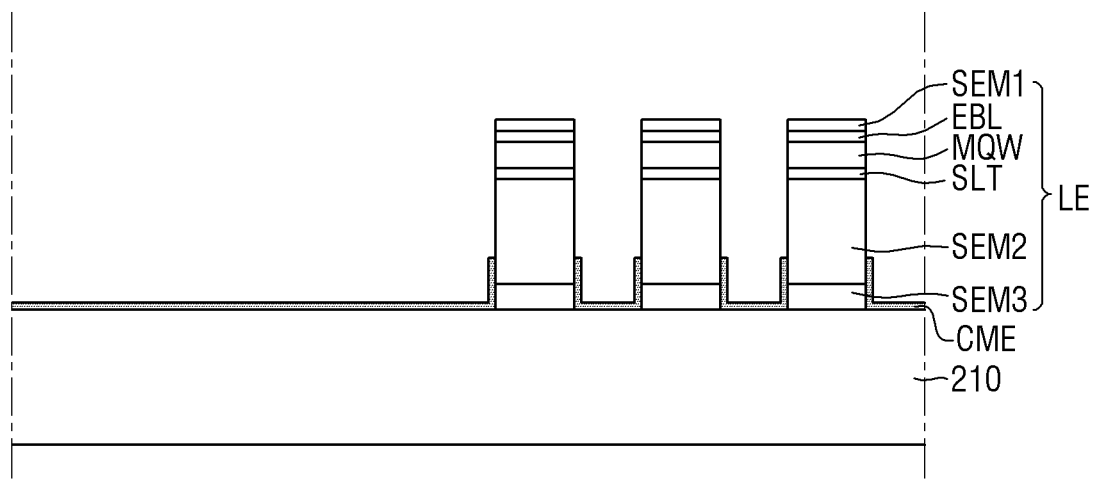

Referring to FIG. 18 and FIG. 19, a common electrode material layer CMEL is formed on the base substrate 210. The common electrode material layer CMEL may entirely cover the plurality of light-emitting elements LE and the base substrate 210. The common electrode material layer CMEL may include a highly reflective metal such as aluminum (Al). The common electrode material layer CMEL may be formed using a metal deposition method such as sputtering as described above.

Thereafter, a second mask pattern MP2 is formed on the base substrate 210. The second mask pattern MP2 is formed on the base substrate 210 so as not to overlap each of the light-emitting elements LE. The second mask pattern MP2 may be disposed between the light-emitting elements LE and may cover an underlying portion of the common electrode material layer CMEL.

Then, a portion of the common electrode material layer CMEL is etched ($2^{nd}$ etch) using the second mask pattern MP2 as a mask.

On the base substrate 210, a portion of the common electrode material layer CMEL that does not overlap with the second mask pattern MP2 is etched and removed, while a portion thereof overlapping the second mask pattern MP2 is not etched and thus acts as the common electrode CME.

The common electrode material layer CMEL may be etched using a wet etching method as described above. In this case, a time of the etching process may be adjusted so that the common electrode material layer CMEL remains on the entire side face (e.g., the entire the side surface) of the third semiconductor layer SEM3 and the partial side face (e.g., the partial side surface) of the second semiconductor layer SEM2 of the light-emitting element LE. Accordingly, the common electrode CME may be formed on the top face (e.g., the top surface) of the base substrate 210 and the entire side face (e.g., the entire side surface) of the third semiconductor layer SEM3 and the partial side face (e.g., the partial side surface) of the second semiconductor layer SEM2 of the light-emitting element LE.

Subsequently, the first insulating layer INS1 is formed on the base substrate 210 including the plurality of light-emitting elements LE (S120 in FIG. 15).

Figure 20:
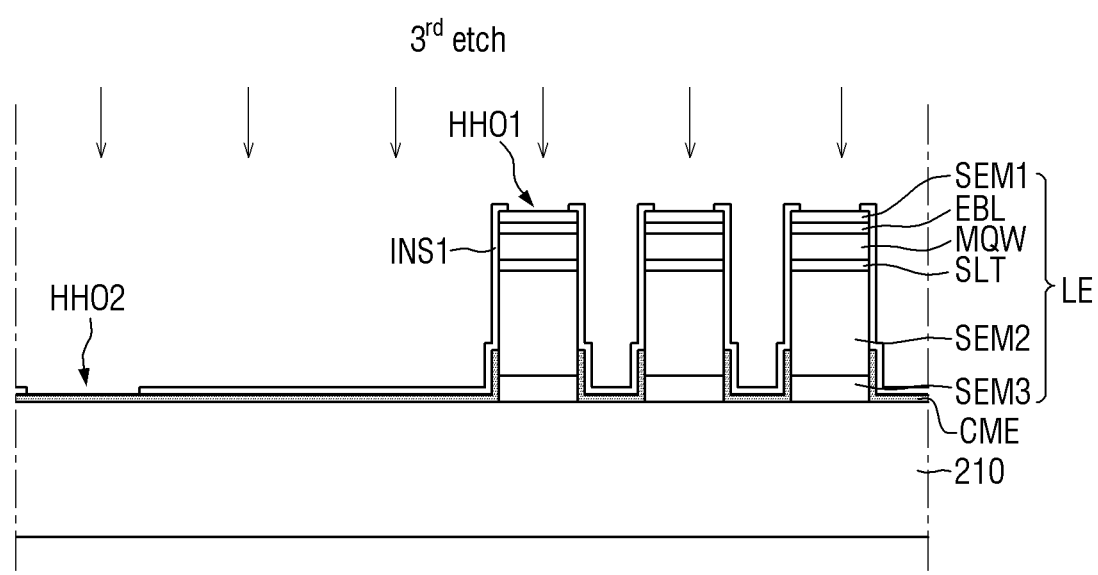
Figure 21:
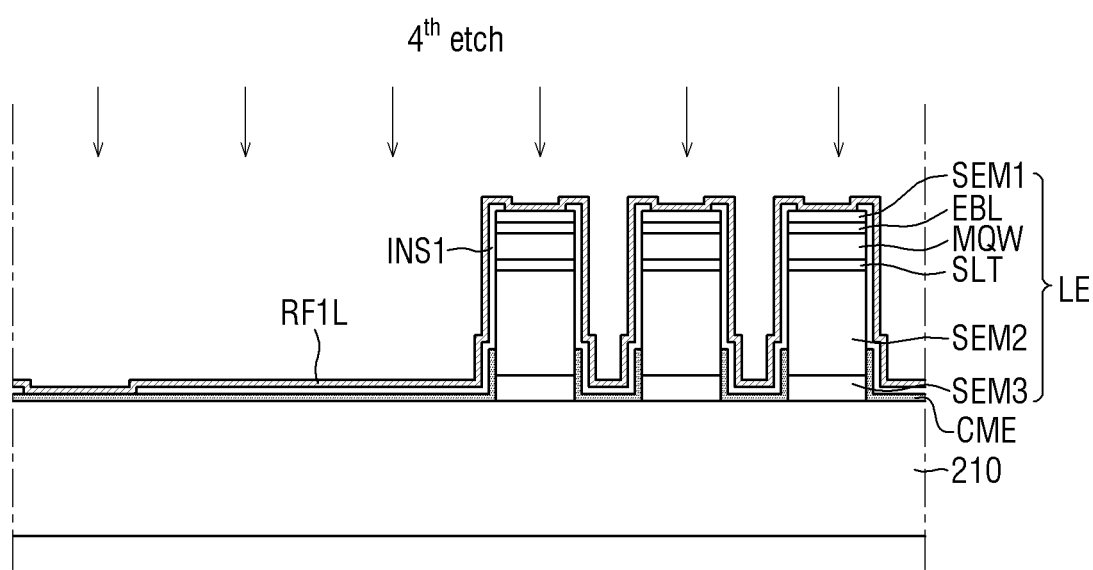

Referring to FIG. 20, a first insulating material layer is formed on the base substrate 210 and is etched to form the first insulating layer INS1. The first insulating material layer may be formed by applying an insulating material on the base substrate 210 or immersing the base substrate 210 in an insulating material solution. In one example, the first insulating material layer may be formed using atomic layer deposition (ALD).

Then, the first insulating material layer INS1 may be partially etched and removed ($3^{rd}$ etch) so that a top face (e.g., a top surface) of each of the plurality of light-emitting elements LE and a top face (e.g., a top surface) of a portion of the common electrode CME disposed on the edge of the base substrate 210 are exposed. Contact holes HHO1 and HHO2 respectively exposing a top face (e.g., a top surface) of the first semiconductor layer SME1 and a portion of a top face (e.g., a top surface) of the common electrode CME may be formed in the first insulating layer INS1. The first insulating material layer may be removed using the above-described etching method.

Subsequently, the first reflective layer RF1 is formed on the first insulating layer INS1 (S130 in FIG. 15).

For example, a first reflective material layer RF1L is formed on the base substrate 210 on which the first insulating layer INS1 is formed. The first reflective material layer RF1L may include a highly reflective metal such as aluminum (Al). The first reflective material layer RF1L may be formed using a metal deposition method such as sputtering as described above. The first reflective material layer RF1L may be formed along an entirety of the first insulating layer INS1 and an entirety of the light-emitting element LE.

Figure 22:
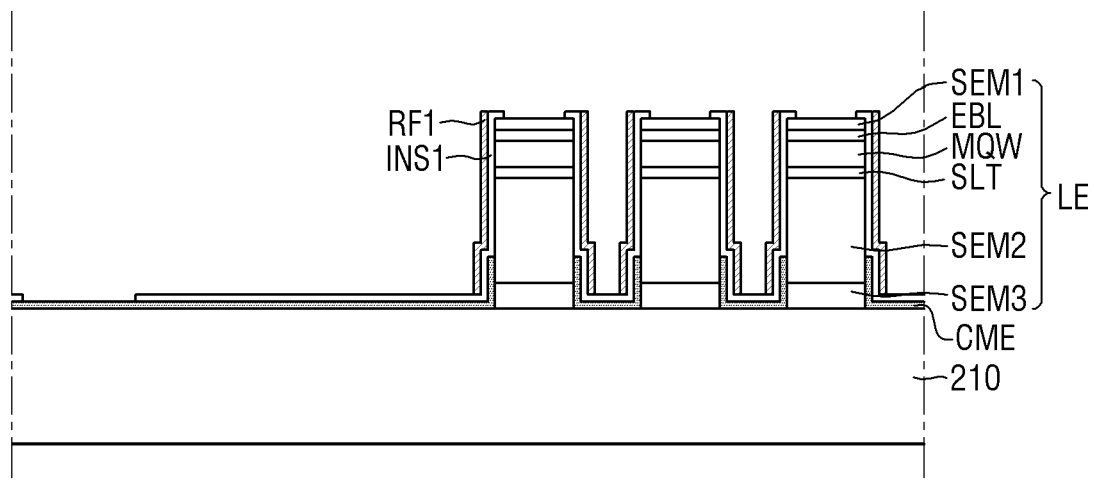

Subsequently, referring to FIG. 22, the first reflective material layer RF1L is etched ($4^{th}$ etch) to form the first reflective layer RF1. When a large voltage difference is generated in the etching process, and a suitable etching gas (e.g., a predefined etching gas) EG2 is used in the etching process, a horizontal portion of the first reflective material layer RF1L extending in parallel with a plane of the base substrate 210 may be removed. To the contrary, a vertical portion of the first reflective material layer RF1L extending in a perpendicular manner to the plane of the base substrate 210, for example, extending along the side face (e.g., the side surface) of the light-emitting element LE may not be removed.

Accordingly, the first reflective layer RF1 may be disposed on a side face (e.g., a side surface) of a portion of the first insulating layer INS1 disposed on the side face (e.g., the side surface) of each of the plurality of light-emitting element LE. That is, the first reflective layer RF1 may be disposed on vertical faces (e.g., vertical surfaces) perpendicular to a top plane of the base substrate 210.

Subsequently, each of the connection electrodes 125 is formed on each of the plurality of light-emitting elements LE. The common connection electrode 127 is formed on an exposed portion of the common electrode CME on the edge of the base substrate 210. Thus, the light-emitting element layer 120 is formed (S140 in FIG. 15).

Figure 23:
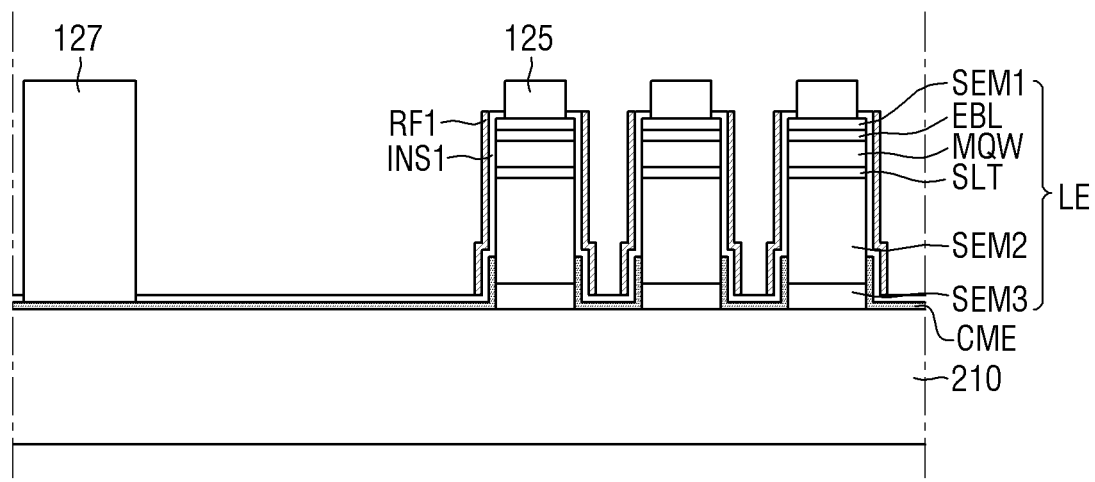

Referring to FIG. 23, a common connection electrode material layer is formed on the base substrate 210 and is etched such that each of the connection electrodes 125 is formed on a top face (e.g., a top surface) of each of the plurality of light-emitting element LE that are not covered with the first insulating layer INS1. The connection electrode 125 may be formed directly on the top face (e.g., the top surface) of the first semiconductor layer SEM1 of the light-emitting element LE. The common connection electrode 127 is formed on the exposed portion of the common electrode CME which is disposed on the edge of the base substrate 210 and is not covered with the first insulating layer INS1. The common connection electrode 127 may be formed directly on a top face (e.g., a top surface) of the portion of the common electrode CME which is disposed on the edge of the base substrate 210 and is not covered with the first insulating layer INS1.

Each of the connection electrode 125 and the common connection electrode 127 may include a transparent conductive material. Each of the connection electrode 125 and the common connection electrode 127 may include a transparent conductive oxide (TCO) such as ITO (Indium Tin Oxide) or IZO (Indium Zinc Oxide).

Subsequently, the light-emitting element layer 120 is bonded to the semiconductor circuit board 110 (S150 in FIG. 15).

Figure 24:
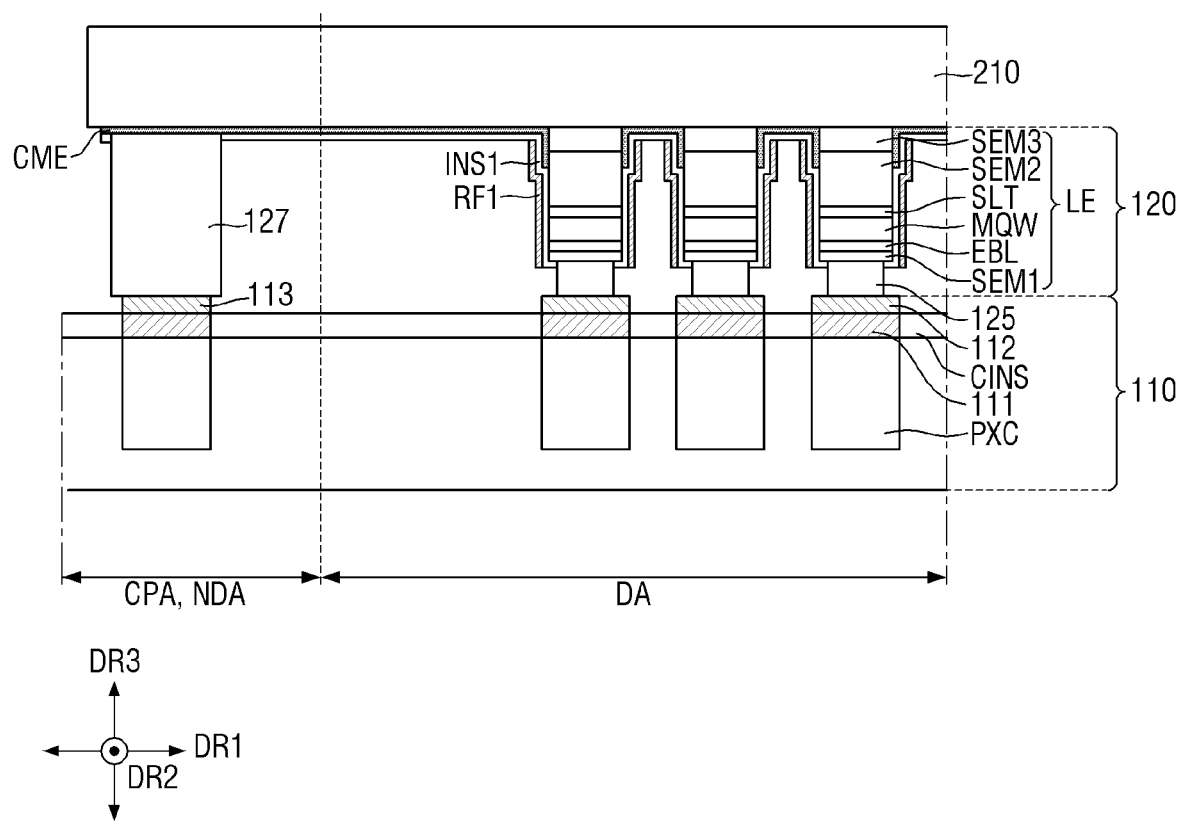

Referring to FIG. 24, first, the method prepares the semiconductor circuit board 110. The semiconductor circuit board 110 may include the plurality of pixel circuits PXC, the circuit insulating layer CINS, the pixel electrodes 111, the contact electrodes 112, and the common contact electrode 113.

For example, the pixel electrodes 111 are formed on the semiconductor circuit board 110 on which the plurality of pixel circuits PXC are formed. The circuit insulating layer CINS is formed to planarize the steps of the pixel electrodes 111. Then, a contact electrode material layer is deposited on the pixel electrodes 111 and then is etched to form the contact electrodes 112 and the common contact electrode 113. The contact electrode material layer may include gold (Au), copper (Cu), aluminum (Al), or tin (Sn).

Subsequently, the light-emitting element layer 120 and the semiconductor circuit board 110 are aligned with each other, and the semiconductor circuit board 110 and the light-emitting element layer 120 are bonded to each other.

For example, the contact electrodes 112 of the semiconductor circuit board 110 and the connection electrodes 125 of the light-emitting element layer 120 are brought into respective contact with each other. Further, the common contact electrode 113 of the semiconductor circuit board 110 and the common connection electrode 127 of the light-emitting element layer 120 are brought into contact with each other. Then, the semiconductor circuit board 110 and the light-emitting element layer 120 are bonded to each other by respectively melt-bonding the contact electrodes 112 and 113 and the connection electrodes 125 and 127, respectively, with each other at a suitable temperature (e.g., a predefined temperature).

Subsequently, the plurality of holes HO1, HO2, and HO3 are formed in the base substrate 210 (S160 in FIG. 15).

Figure 25:
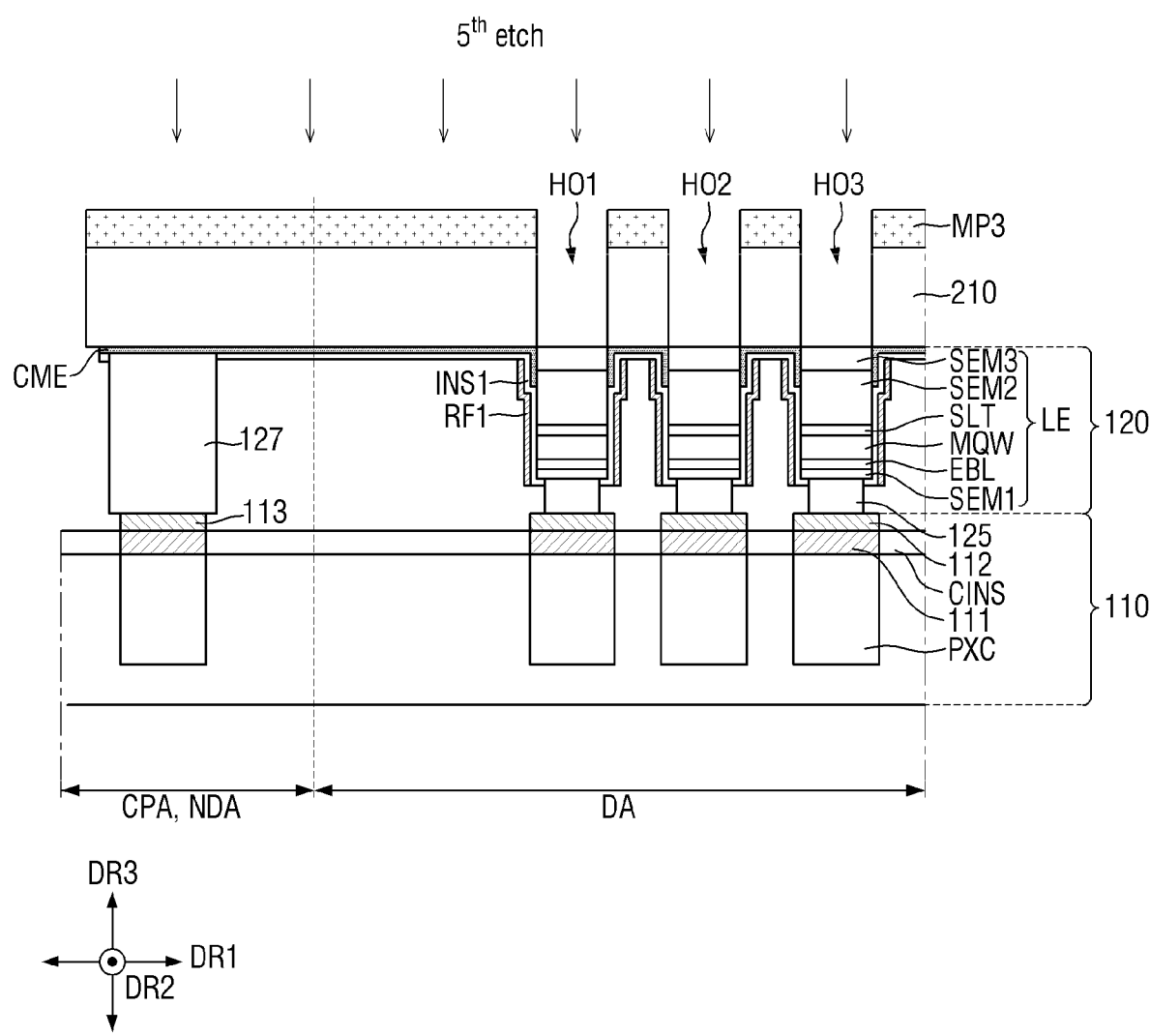

Referring to FIG. 25, a third mask pattern MP3 is formed on the base substrate 210. The third mask pattern MP3 may include the same material as that of the first mask pattern MP1 as described above. The third mask pattern MP3 may act as a mask for forming the plurality of holes HO1, HO2, and HO3 in the base substrate 210. Using the third mask pattern MP3 as a mask, the base substrate 210 is etched ($5^{th}$ etch) to form the plurality of holes HO1, HO2, and HO3. The etching process for forming the plurality of holes HO1, HO2, and HO3 may be identical with the etching process of the semiconductor material layer as described above.

The base substrate 210 may be etched using a deep reactive ion etching (DRIE) scheme such that a hole of a high aspect ratio may be formed. Thus, the plurality of holes HO1, HO2, and HO3 having a high aspect ratio may be formed using the deep reactive ion etching (DRIE). Accordingly, because the plurality of holes HO1, HO2, and HO3 respectively define the plurality of light-emitting areas EA1, EA2, and EA3, the ultra-high resolution display device 10 may be manufactured.

Subsequently, each of the wavelength conversion layers QDL is formed in each of the plurality of holes HO1, HO2, and HO3 (S170 in FIG. 15).

Figure 26:
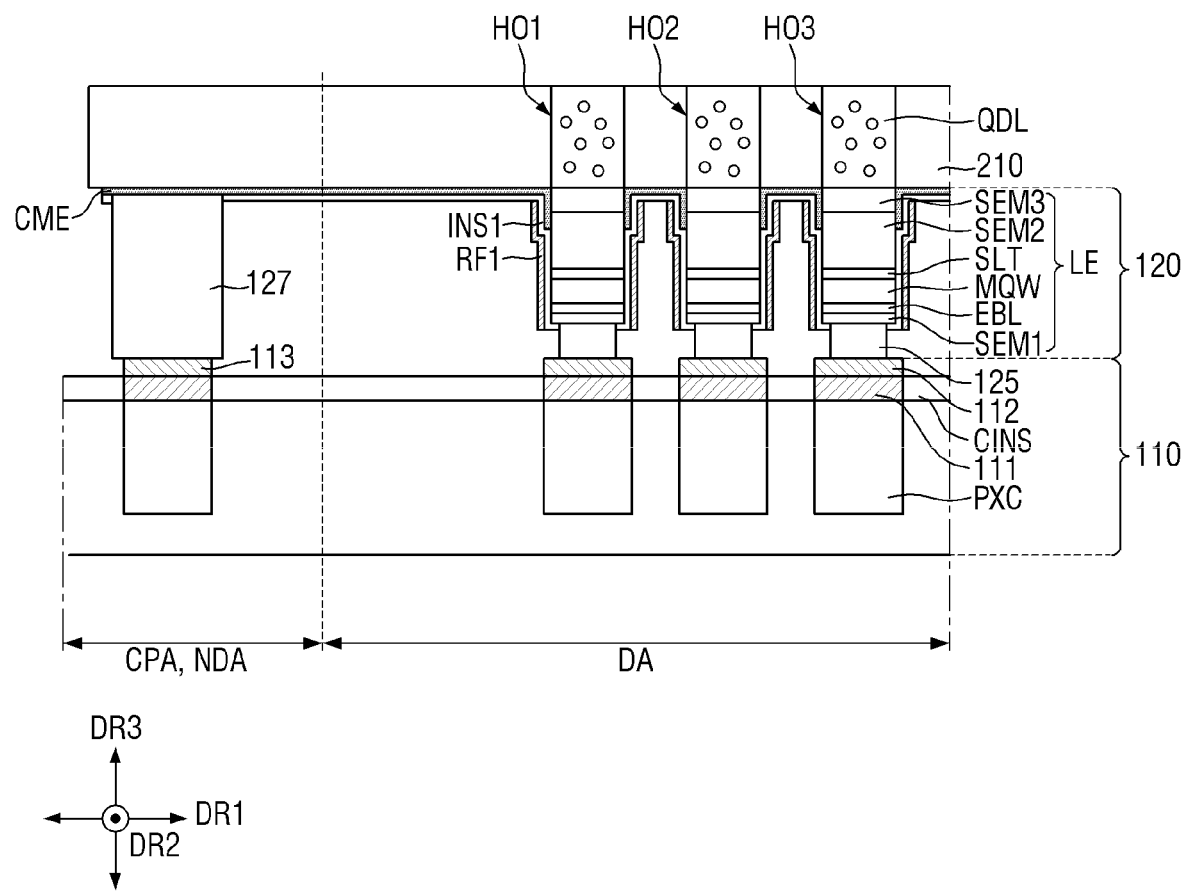

Referring to FIG. 26, each of the wavelength conversion layers QDL may fill each of the plurality of holes HO1, HO2, and HO3. The wavelength conversion layer QDL may be formed using a solution process such as inkjet printing, imprinting, etc. However, the present disclosure is not limited thereto. Each of the wavelength conversion layers QDL may be received in each of the plurality of holes HO1, HO2, and HO3 and may overlap each of the plurality of light-emitting areas EA1, EA2, and EA3.

Subsequently, the plurality of color filters CF1, CF2, and CF3 are formed on the wavelength conversion layers QDL, respectively (S180 in FIG. 15).

Figure 27:
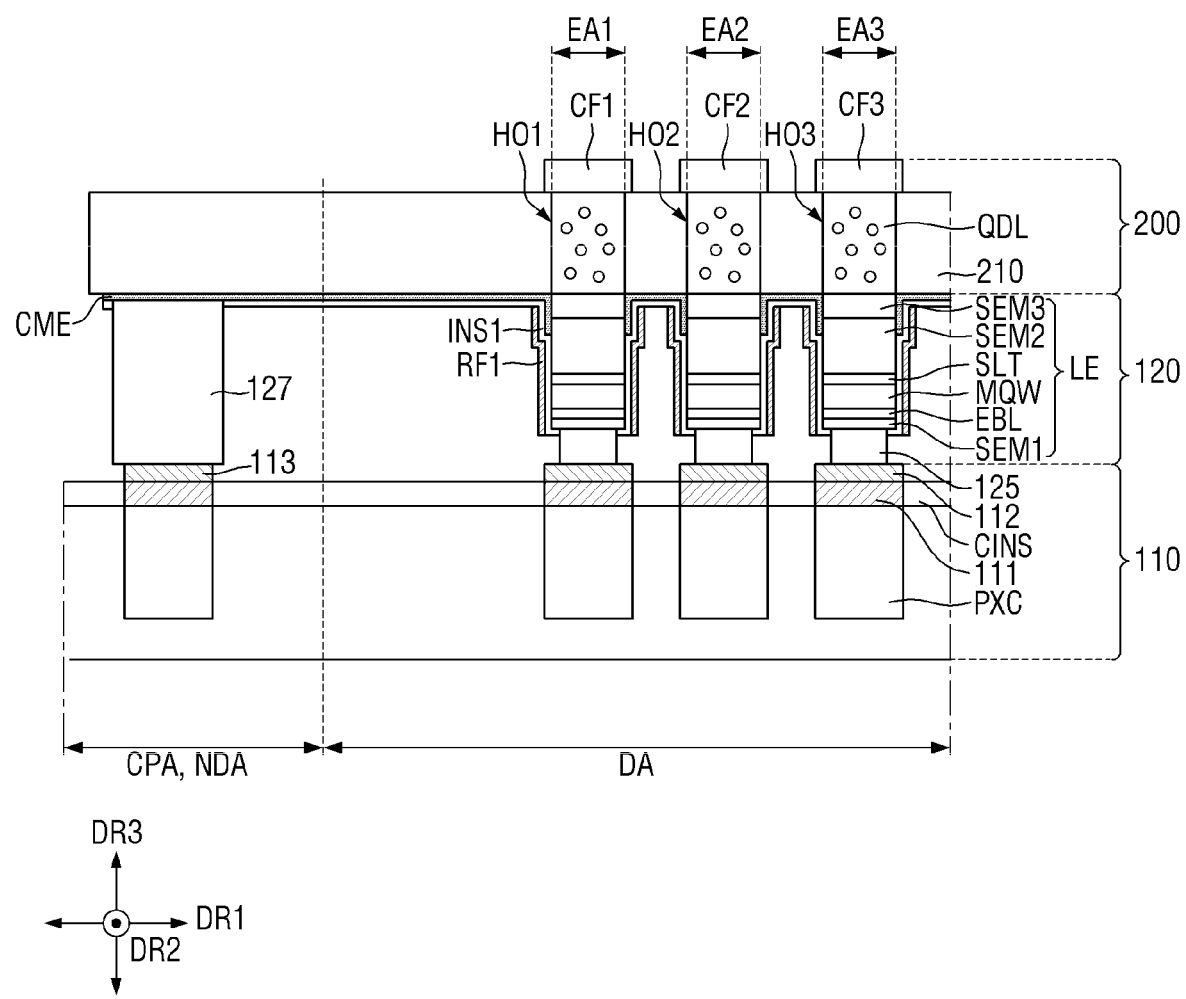

Referring to FIG. 27, the first color filter CF1 is formed on the wavelength conversion layer QDL received to be located in the first hole HO1. The second color filter CF2 is formed on the wavelength conversion layer QDL received to be located in the second hole HO2. The third color filter CF3 is formed on the wavelength conversion layer QDL received to be located in the third hole HO3. The plurality of color filters CF1, CF2, and CF3 may be formed using a photo process. Each of the plurality of color filters CF1, CF2, and CF3 may have a thickness of 1 μm or smaller. However, the present disclosure is not limited thereto.

For example, a first color filter material layer is applied on the base substrate 210 and is patterned using a photo process to form the first color filter CF1 that overlaps with the first hole HO1. Then, a second color filter material layer is applied on the base substrate 210 and is patterned via a photo process to form the second color filter CF2 overlapping the second hole HO2. Then, a third color filter material layer is applied on the base substrate 210 and is patterned via a photo process to form the third color filter CF3 that overlaps with the third hole HO3. Although the first color filter CF1, the second color filter CF2, and the third color filter CF3 are formed in this order in this embodiment, the order may be changed and may not be limited thereto.

As described with reference to FIG. 16 to FIG. 27, in the display device 10 according to one or more embodiments, the plurality of holes HO may be defined in the base substrate 210 including sapphire or silicon. Thus, the high aspect ratio holes HO may be formed. Accordingly, each wavelength conversion layer QDL is received to be located in each of the plurality of holes HO and each of the color filters CF1, CF2, and CF3 is formed on each wavelength conversion layer QDL. Thus, the ultra-high resolution display device 10 may be provided.

FIG. 28 to FIG. 31 are cross-sectional views showing a process for manufacturing a display panel according to one or more embodiments.

Referring to FIG. 28 to FIG. 31, the method of this embodiment is different from the above-mentioned method of FIG. 15 to FIG. 27 in that the base substrate 210 is removed from the intermediate structure and then the partitioning wall PW is additionally formed on the intermediate structure and then the wavelength conversion layer QDL is formed in the partitioning wall PW, and the color filters CF1, CF2, and CF3 are formed on the partitioning wall PW. The wavelength conversion substrate 200 shown in FIG. 28 to FIG. 31 may correspond to the structure shown in FIG. 13 as described above. Hereinafter, a case in which the partitioning wall PW is formed using a plating scheme will be described by way of example. Differences between the above embodiment of FIG. 15 to FIG. 27 and this embodiment will be mainly described, while the same contents therebetween will be omitted.

Figure 28:
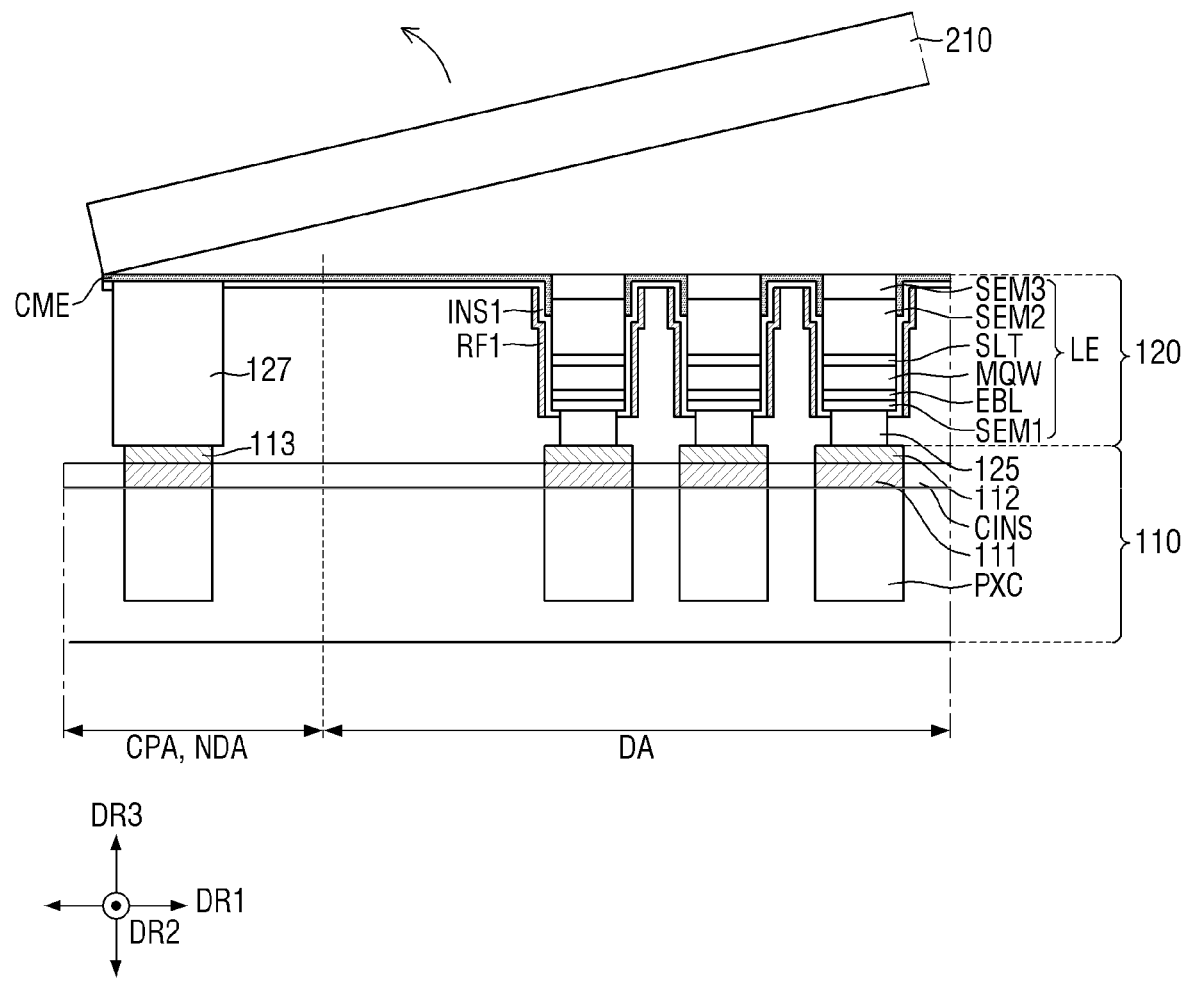
FIG. 28 to FIG. 31 are cross-sectional views showing a process for manufacturing a display panel according to one or more embodiments.

As shown in FIG. 28 as described above, the light-emitting element layer 120 and the semiconductor circuit board 110 are bonded to each other, and then the base substrate 210 is removed from the bonded structure.

Referring to FIG. 28, the base substrate 210 is removed from the light-emitting element layer 120. For example, the base substrate 210 is removed from the third semiconductor layer SEM3 of the light-emitting element layer 120 and the common electrode CME. The process of removing the base substrate 210 may include a laser lift off (LLO) process. The laser lift-off process may use a laser. KrF excimer laser (248 nm wavelength) may be used as a source of the laser. The excimer laser may be irradiated at an energy density in a range of about 550 mJ/cm$^2$ to 950 mJ/cm$^2$, while an incident area thereof may be in a range of 50×50 μm$^2$ to 1×1 cm$^2$. However, the present disclosure is not limited thereto.

Figure 29:
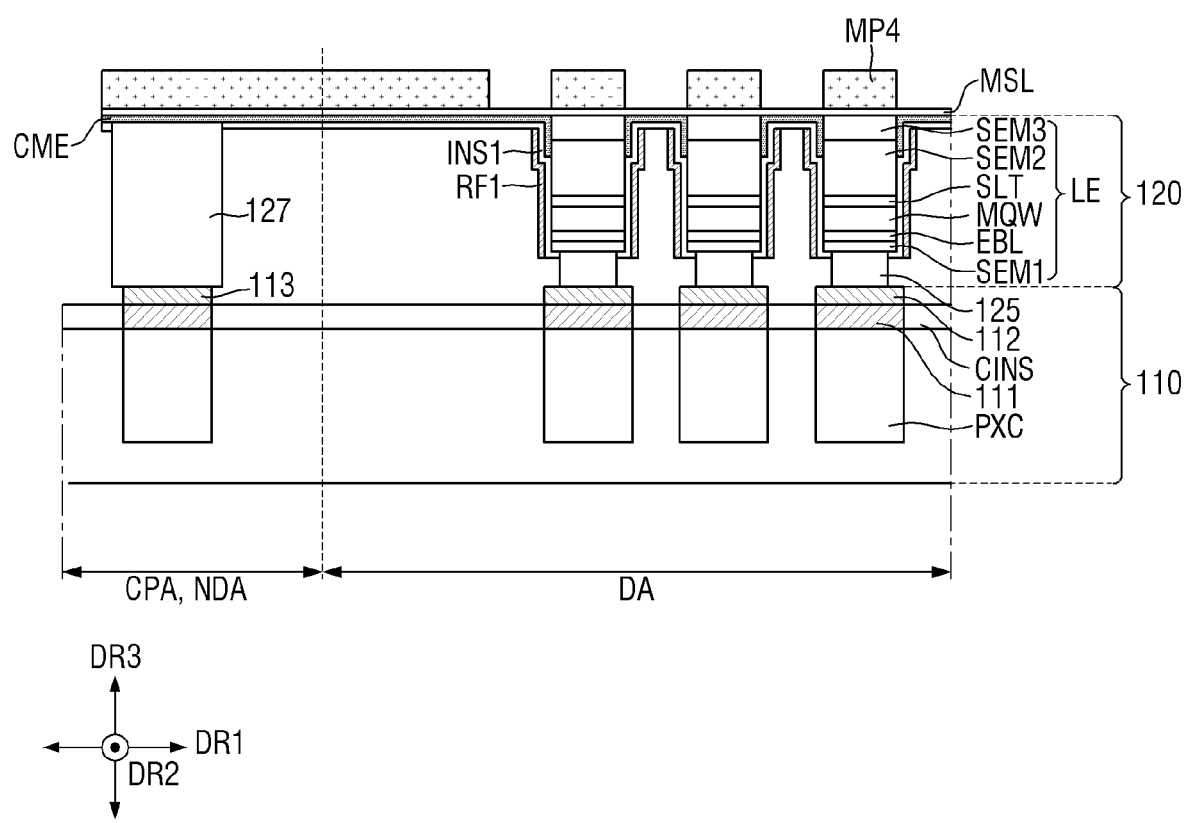

Next, referring to FIG. 29, a metal seed layer MSL is formed on the common electrode CME and the third semiconductor layer SEM3 of the light-emitting element LE. The metal seed layer MSL may act as a seed to allow metal ions to grow into a thin-film during plating. Then, a fourth mask pattern MP4 is formed on the metal seed layer MSL. The fourth mask pattern MP4 has a plurality of openings defined therein, each exposing a portion of the metal seed layer MSL corresponding to each formation position of the partitioning wall. The metal seed layer MSL may be made of the same material as the material of the partitioning wall PW to be formed.

Figure 30:
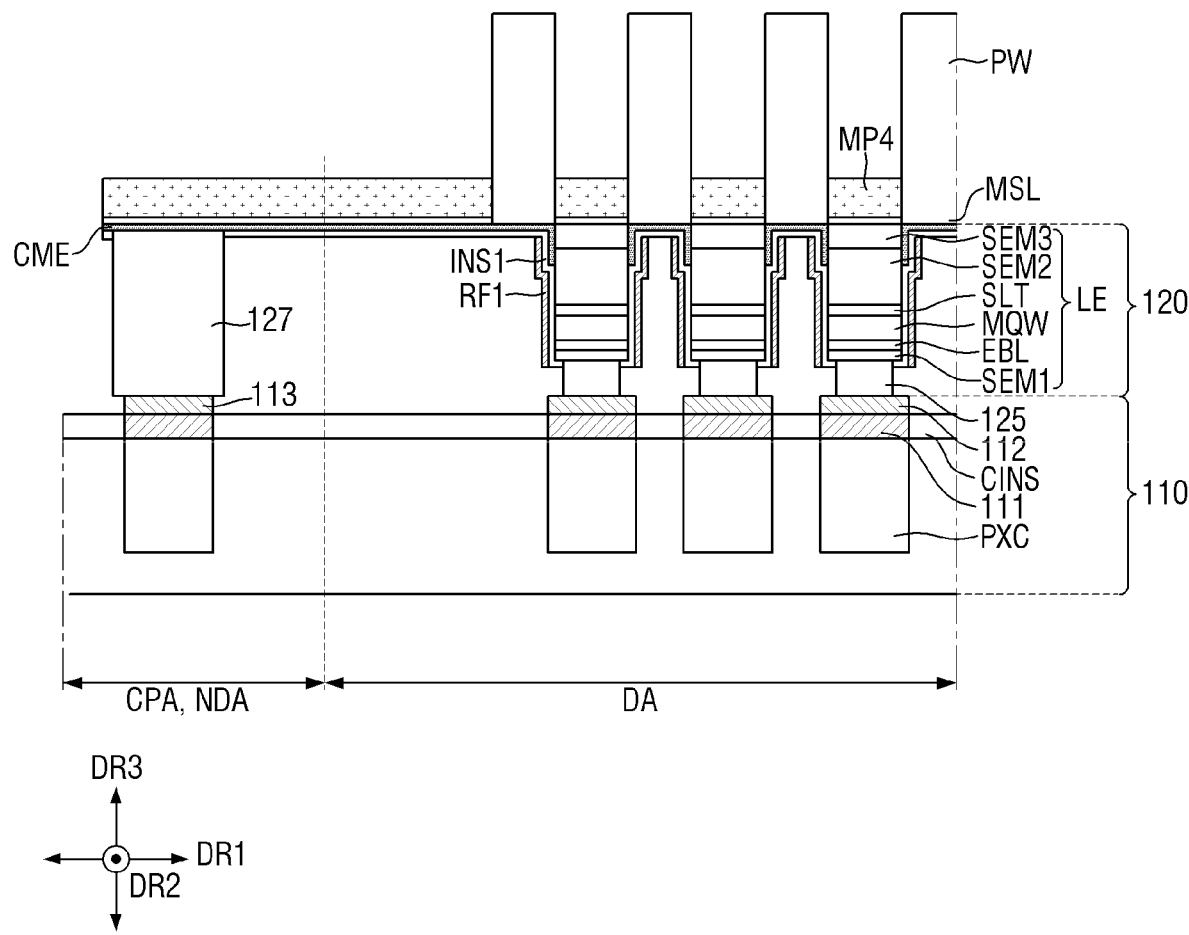

Thereafter, referring to FIG. 30, the display panel 100 on which the fourth mask pattern MP4 is formed is immersed in a solution containing metal ions. Then, a voltage is applied to the metal seed layer MSL such that a metal layer is grown on the exposed portion of the metal seed layer MSL which is not covered with the fourth mask pattern MP4. A scheme of growing the metal layer may include an electroplating or an electroless plating scheme. The grown metal layer acts as the partitioning wall PW.

Figure 31:
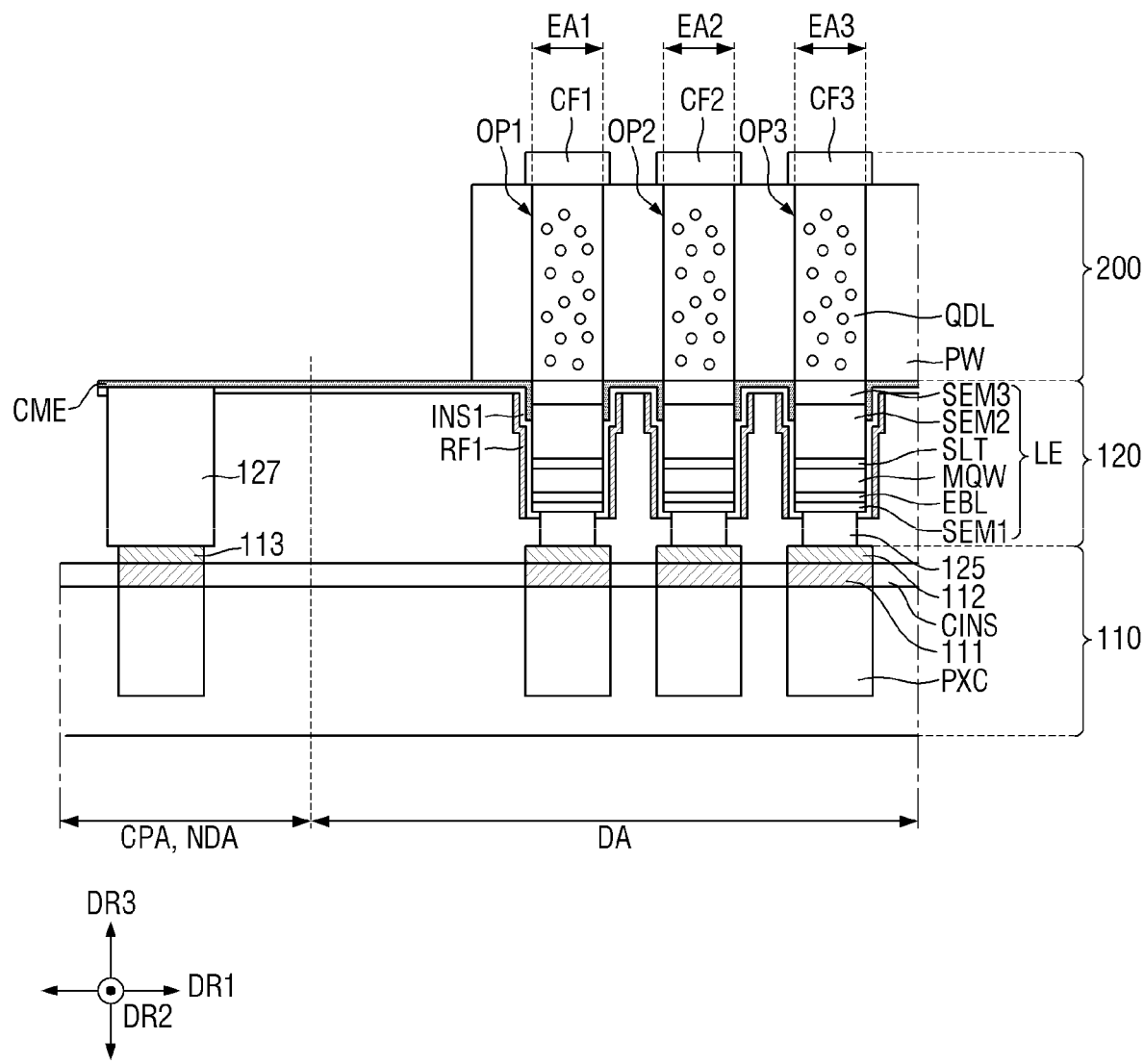

Then, referring to FIG. 31, a portion of the metal seed layer MSL overlapping with the fourth mask pattern MP4 is removed. Thus, the partitioning wall may be finally formed. Then, the wavelength conversion layer QDL and the plurality of color filters CF1, CF2, and CF3 may be formed in the above-described manner. Thus, the display panel 100 may be manufactured.

Although the manufacturing process of the partitioning wall PW using the plating scheme is exemplified in this embodiment, a process of manufacturing the partitioning wall PW is not limited thereto. The partitioning wall PW may be made of an organic insulating material and may be formed using a photolithography process.

As described above, the display device according to embodiments of the present disclosure may include the common electrode around (e.g., surrounding) the light-emitting element, thereby not only applying the common voltage to the light-emitting element, but also preventing light beams from one light-emitting area from being emitted to another light-emitting area adjacent thereto and thus being mixed with light beam in the adjacent light-emitting area.

Further, the display device according to the embodiments of the present disclosure may have the plurality of holes defined in the base substrate. Thus, the plurality of holes having a high aspect ratio may be easily formed using high aspect ratio etching. Accordingly, the ultra-high resolution light-emitting areas may be formed. Thus, the ultra-high resolution display device having the ultra-high resolution light-emitting areas may be manufactured.

Further, the display device according to the embodiments of the present disclosure may include the wavelength conversion layers respectively including the light-transmissive pattern, the first wavelength conversion pattern and the second wavelength conversion pattern, thereby improving light emission efficiency of each of blue light, green light, and red light.

Further, the display device according to the embodiments of the present disclosure may include the first protective layer between the color filter and the wavelength conversion layer, thereby preventing the color filter from being damaged in a subsequent process.

Further, in the display device according to the embodiments of the present disclosure, the hole having a large depth may be formed. Thus, the color filter and the wavelength conversion layer may be disposed in the hole. Thus, alignment between the color filter and the wavelength conversion layer may be accurate. A thickness of the wavelength conversion layer may increase, thereby improving wavelength conversion efficiency.

Figure 32:
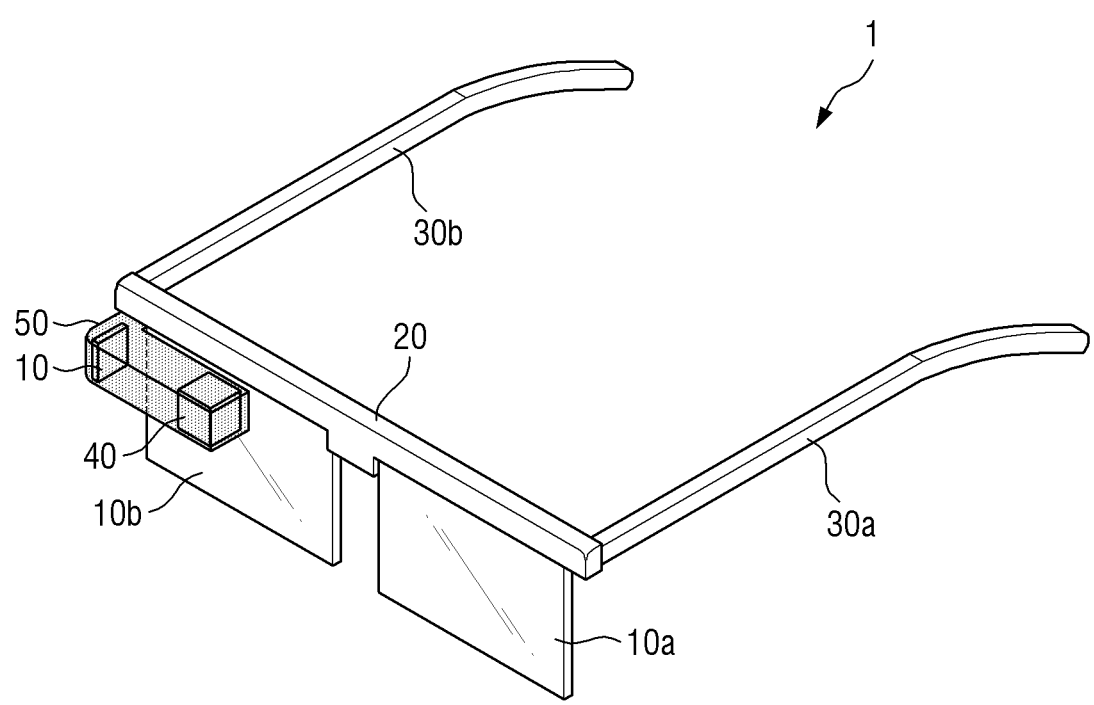
FIG. 32 is an example diagram showing a virtual reality device including a display device according to one or more embodiments.

FIG. 32 is an example diagram showing a virtual reality device including a display device according to one embodiment. FIG. 32 shows a virtual reality device 1 to which a display device 10 according to one or more embodiments is applied.

Referring to FIG. 32, the virtual reality device 1 according to one or more embodiments may be a device in a form of glasses. The virtual reality device 1 according to one or more embodiments may include a display device 10, a left-eye lens 10a, a right-eye lens 10b, a support frame 20, left and right legs 30a and 30b, a reflective member 40, and a display device housing 50.

FIG. 32 exemplifies the virtual reality device 1 including the two legs 30a and 30b. However, the present disclosure is not limited thereto. The virtual reality device 1 according to one or more embodiments may be applied to a head mounted display including a head mounted band that may be mounted on a head instead of the legs 30a and 30b. That is, the virtual reality device 1 according to one or more embodiments may not be limited to the example shown in FIG. 32, and may be applied in various forms and in various electronic devices.

The display device housing 50 may receive the display device 10 and the reflective member 40. An image displayed on the display device 10 may be reflected from the reflective member 40 and provided to a user's right-eye through the right-eye lens 10b. Thus, the user may view a virtual reality image displayed on the display device 10 via the right-eye.

FIG. 32 illustrates that the display device housing 50 is disposed at a right end of the support frame 20. However, the present disclosure is not limited thereto. For example, the display device housing 50 may be disposed at a left end of the support frame 20. In this case, the image displayed on the display device 10 may be reflected from the reflective member 40 and provided to the user's left-eye via the left-eye lens 10a. Thus, the user may view the virtual reality image displayed on the display device 10 via the left-eye. Alternatively, the display device housing 50 may be disposed at each of the left end and the right end of the support frame 20. In this case, the user may view the virtual reality image displayed on the display device 10 via both the left-eye and the right-eye.

Figure 33:
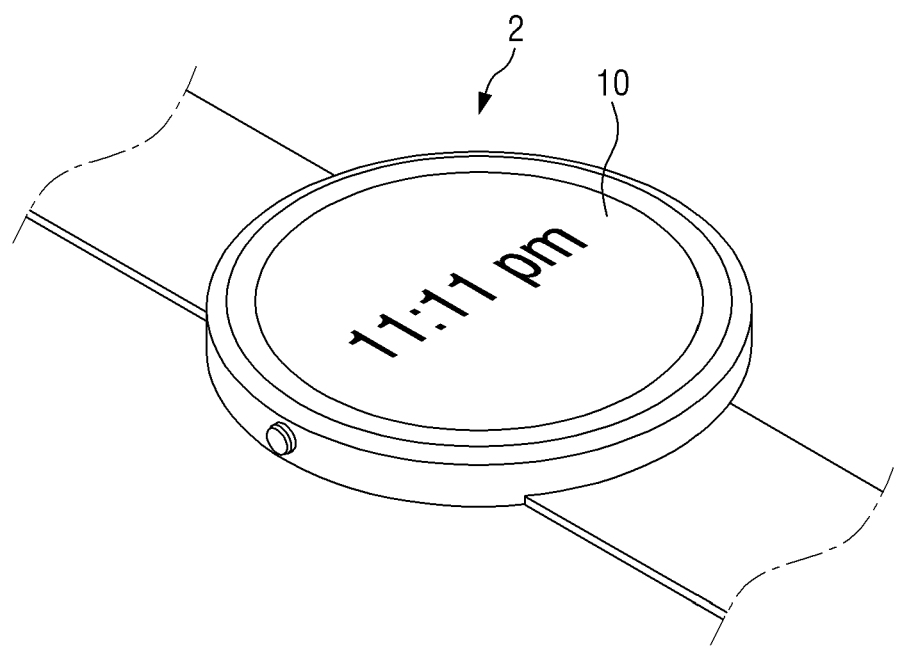
FIG. 33 is an example diagram showing a smart device including a display device according to one or more embodiments.

FIG. 33 is an example diagram showing a smart device including a display device according to one or more embodiments.

Referring to FIG. 33, a display device 10 according to one or more embodiments may be applied to a smart watch 2 as one of smart devices.

Figure 34:
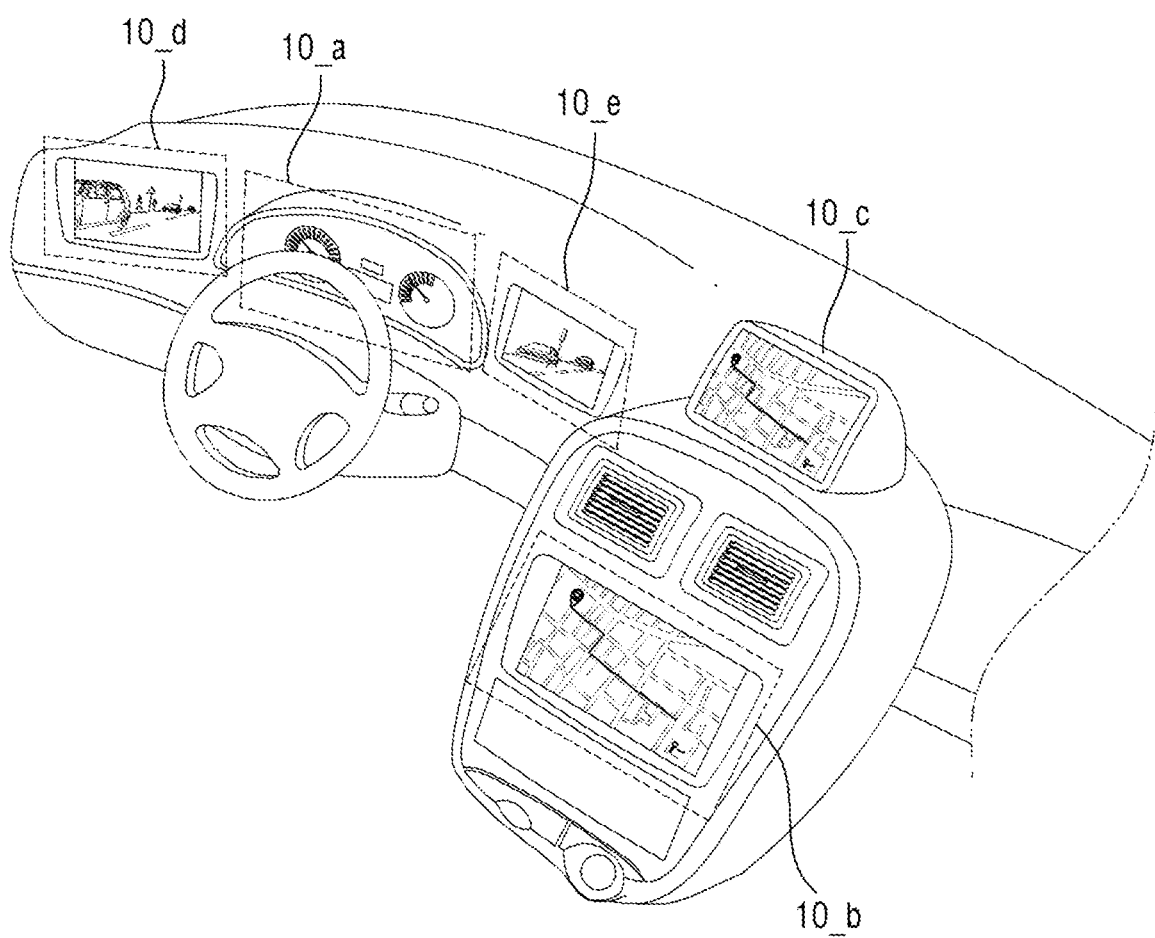
FIG. 34 is an example diagram showing a vehicle including a display device according to one or more embodiments.

FIG. 34 is a diagram showing a vehicle including a display device according to one or more embodiments. FIG. 34 shows a vehicle to which display devices according to one or more embodiments are applied.

Referring to FIG. 34, the display devices 10_a, 10_b, and 10_c according to one or more embodiments may be applied to the dashboard of the vehicle, applied to the center fascia of the vehicle, or applied to a Center Information Display (CID) disposed on the dashboard of the vehicle. Further, each of the display devices 10_d and 10_e according to one or more embodiments may be applied to each room mirror display that replaces each of side mirrors of the vehicle.

Figure 35:
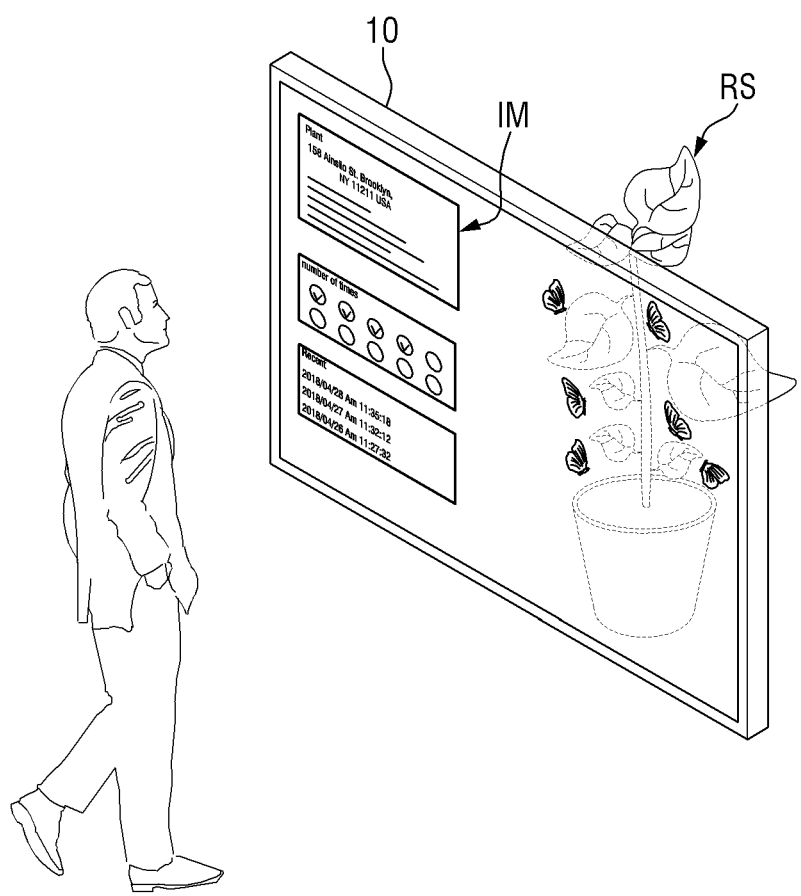
FIG. 35 is an example diagram showing a transparent display device including a display device according to one or more embodiments.

FIG. 35 is one example diagram showing a transparent display device including a display device according to one or more embodiments.

Referring to FIG. 35, a display device according to one or more embodiments may be applied to a transparent display device. The transparent display device may transmit light therethrough while displaying an image IM thereon. Therefore, a user located in front of the transparent display device may not only view the image IM displayed on the display device 10, but also see an object RS or a background located in rear of the transparent display device. When the display device 10 is applied to the transparent display device, a substrate BSUB of the display device 10 shown in FIG. 4 and FIG. 5 may include a light transmitting portion that may transmit light therethrough or may be made of a material that may transmit light therethrough.

Figure 36:
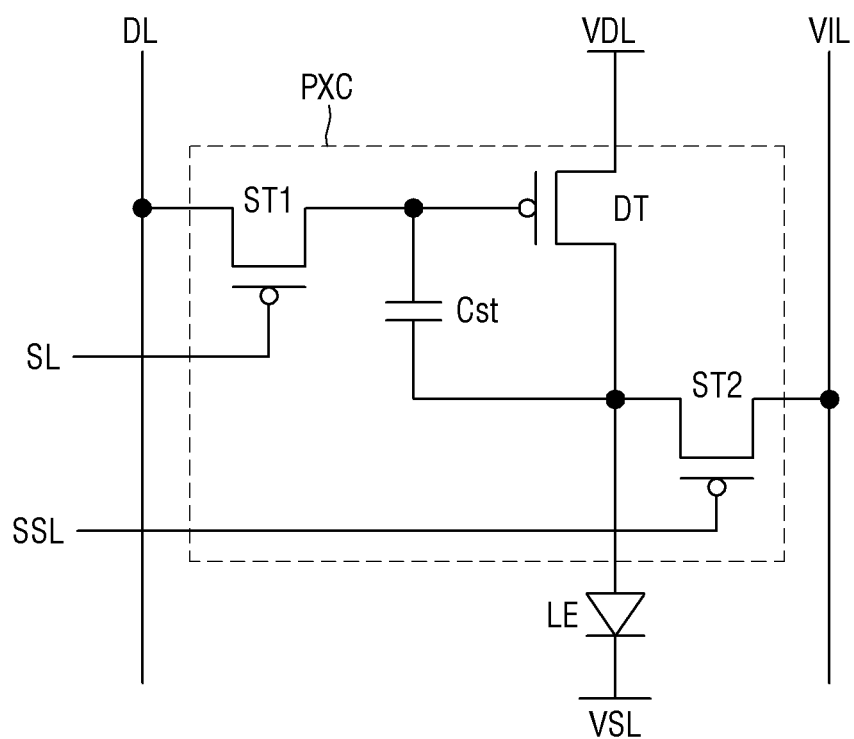
FIG. 36 is a circuit diagram of a pixel circuit and a light-emitting element according to one or more embodiments.

FIG. 36 is a circuit diagram of a pixel circuit and a light-emitting element according to one or more embodiments.

FIG. 36 shows one example of the pixel circuit PXC and the light-emitting element LE of FIG. 5.

Referring to FIG. 36, the light-emitting element LE emits light according to the drive current Ids. An emission amount of the light-emitting element LE may be proportional to the drive current Ids. The light-emitting element LE may be embodied as an inorganic light-emitting element including an anode, a cathode, and an inorganic semiconductor disposed between the anode and the cathode. For example, the light-emitting element LE may be embodied as a micro light-emitting diode.

The anode of the light-emitting element EL may be connected to a source electrode of a driving transistor DT, while the cathode thereof may be connected to a second power line VSL to which a low-potential voltage lower than a high-potential voltage is supplied.

The driving transistor DT adjusts current flowing from a first power line VDL to which a first power voltage is supplied to the light-emitting element EL, based on a voltage difference between voltages of a gate electrode and the source electrode thereof. The gate electrode of the driving transistor DT may be connected to a first electrode of a first transistor ST1, the source electrode thereof may be connected to the anode of the light-emitting element EL, and a drain electrode thereof may be connected to the first power line VDL to which the high-potential voltage is applied.

The first transistor ST1 is turned on based on a scan signal of a scan line SL to connect a data line DL to the gate electrode of the driving transistor DT. A gate electrode of the first transistor ST1 may be connected to the scan line SL, the first electrode thereof may be connected to the gate electrode of the driving transistor DT, and a second electrode thereof may be connected to the data line DL.

The second transistor ST2 is turned on based on a sensing signal of a sensing signal line SSL to connect an initialization voltage line VIL to the source electrode of the driving transistor DT. A gate electrode of the second transistor ST2 may be connected to the sensing signal line SSL, a first electrode thereof may be connected to the initialization voltage line VIL, and a second electrode thereof may be connected to the source electrode of the driving transistor DT.

The first electrode of each of the first and second transistors ST1 and ST2 may act as a source electrode, while the second electrode thereof may act as a drain electrode. However, it should be noted that the present disclosure is not limited thereto. That is, the first electrode of each of the first and second transistors ST1 and ST2 may act as a drain electrode, and the second electrode thereof may act as a source electrode.

A capacitor Cst is formed between the gate electrode and the source electrode of the driving transistor DT. The capacitor Cst stores the difference voltage between the gate voltage and the source voltage of the driving transistor DT.

In FIG. 36, a case in which each of the driving transistor DT and the first and second transistors ST1 and ST2 is embodied as an P-type Metal Oxide Semiconductor Field Effect Transistor (MOSFET) is described by way of example. However, it should be noted that the present disclosure is not limited thereto. Each of the driving transistor DT and the first and second transistors ST1 and ST2 may be embodied as a P-type MOSFET.

Figure 37:
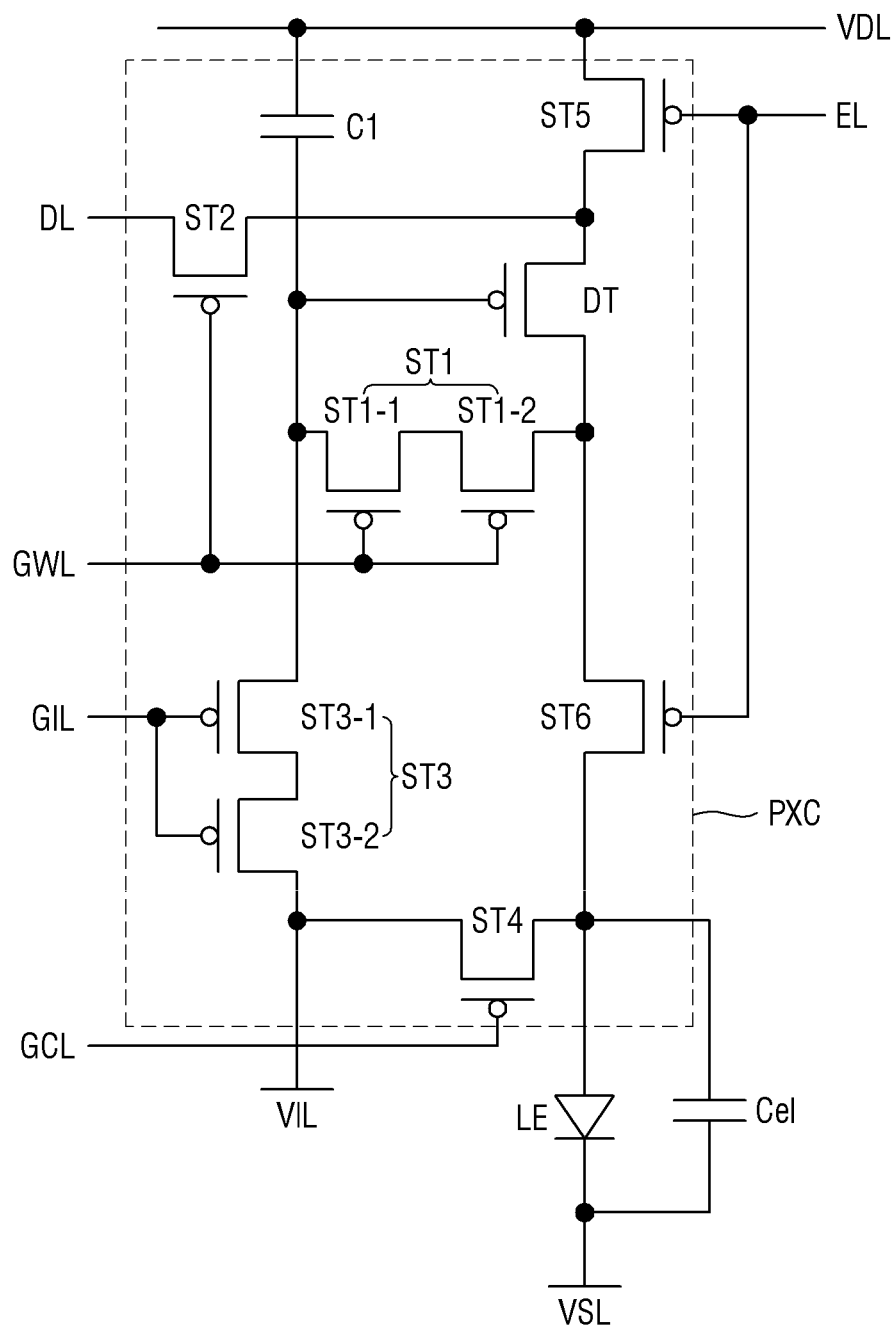
FIG. 37 is a circuit diagram of a pixel circuit and a light-emitting element according to one or more embodiments.

FIG. 37 is a circuit diagram of a pixel circuit and a light-emitting element according to one or more embodiments.

FIG. 37 shows an example of the pixel circuit PXC and the light-emitting element LE of FIG. 5.

Referring to FIG. 37, the light-emitting element LE emits light based on the drive current Ids. An emission amount of the light-emitting element LE may be proportional to the drive current Ids. The light-emitting element LE may be embodied as an inorganic light-emitting element including an anode, a cathode, and an inorganic semiconductor disposed between the anode and the cathode. For example, the light-emitting element LE may be embodied as a micro light-emitting diode.

The anode of the light-emitting element LE may be connected to a first electrode of a fourth transistor ST4 and a second electrode of the sixth transistor ST6, while the cathode of the light-emitting element LE may be connected to a second power line VSL. A parasitic capacitance Cel may be formed between the anode and the cathode of the light-emitting element LE.

The pixel circuit PXC includes a driving transistor DT, switch elements, and a capacitor C1. The switch elements include first to sixth transistors ST1, ST2, ST3, ST4, ST5, ST6.

The driving transistor DT includes a gate electrode, a first electrode, and a second electrode. The driving transistor DT controls a drain-source current Ids (hereinafter referred to as "drive current") flowing between the first electrode and the second electrode, based on a data voltage applied to the gate electrode.

The capacitor C1 is formed between the gate electrode of the driving transistor DT and a first power line VDL. One electrode of the capacitor C1 may be connected to the gate electrode of the driving transistor DT, while the other electrode thereof may be connected to the first power line VDL.

When a first electrode of each of the first to sixth transistors ST1, ST2, ST3, ST4, ST5, ST6, and the driving transistor DT acts as a source electrode, a second electrode thereof may act as a drain electrode. Alternatively, when the first electrode of each of the first to sixth transistors ST1, ST2, ST3, ST4, ST5, ST6, and the driving transistor DT acts as a drain electrode, the second electrode thereof may act as a source electrode.

An active layer of each of the first to sixth transistors ST1, ST2, ST3, ST4, ST5, ST6, and the driving transistor DT may be made of one of polysilicon, polysilicon, amorphous silicon, and oxide semiconductor. When the active layer (semiconductor layer) of each of the first to sixth transistors ST1, ST2, ST3, ST4, ST5, ST6, and the driving transistor DT is made of polysilicon, a process for forming the semiconductor layer may include a Low Temperature Poly Silicon (LTPS) process.

Further, in FIG. 37, a case in which each of the first to sixth transistors ST1, ST2, ST3, ST4, ST5, ST6, and the driving transistor DT is embodied as a P-type MOSFET is described by way of example. However, the present disclosure is not limited thereto. Each of the first to sixth transistors ST1, ST2, ST3, ST4, ST5, ST6, and the driving transistor DT may be embodied as an N-type MOSFET.

Furthermore, a first power voltage of the first power line VDL, a second power voltage of the second power line VSL, and a third power voltage of a third power line VIL may be set in consideration of characteristics of the driving transistor DT and the characteristics of the light-emitting element LE.

Figure 38:
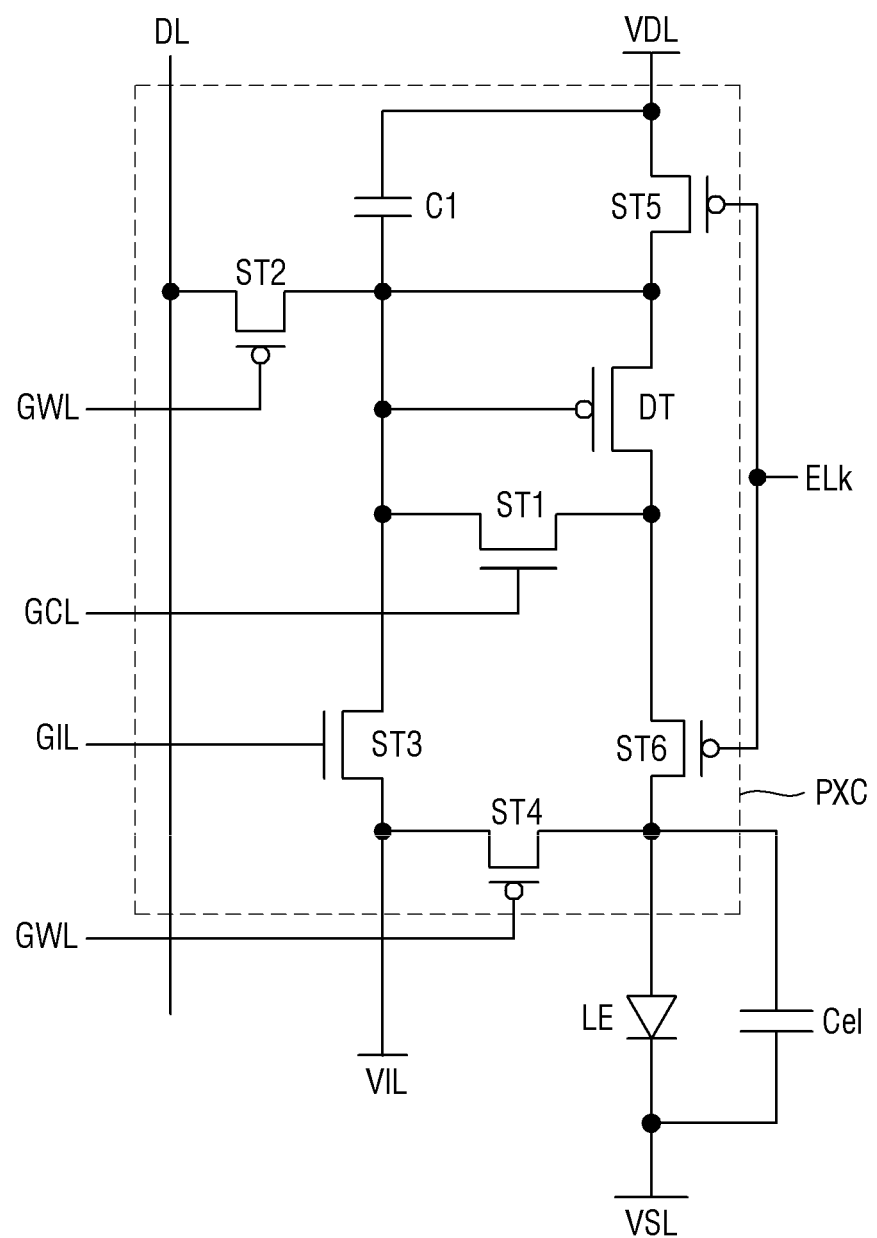
FIG. 38 is a circuit diagram of a pixel circuit and a light-emitting element according to one or more embodiments.

FIG. 38 is a circuit diagram of a pixel circuit and a light-emitting element according to one or more embodiments.

FIG. 38 shows an example of the pixel circuit PXC and the light-emitting element LE of FIG. 5.

The embodiment of FIG. 38 is different from the embodiment in FIG. 37 in that each of the driving transistor DT, the second transistor ST2, the fourth transistor ST4, the fifth transistor ST5, and the sixth transistor ST6 is embodied as a P-type MOSFET, while each of the first transistor ST1 and the third transistor ST3 is embodied as a N-type MOSFET.

Referring to FIG. 38, an active layer of each of the driving transistor DT, the second transistor ST2, the fourth transistor ST4, the fifth transistor ST5, and the sixth transistor ST6 embodied as the P-type MOSFET may be made of polysilicon, while an active layer of each of the first transistor ST1 and the third transistor ST3 embodied as the N-type MOSFET may be made of an oxide semiconductor.

The embodiment of FIG. 38 is different from the embodiment in FIG. 37 in that the gate electrode of the second transistor ST2 and the gate electrode of the fourth transistor ST4 are connected to a write scan line GWL, while the gate electrode of the first transistor ST1 is connected to a control scan line GCL. Further, in FIG. 38, each of the first transistor ST1 and the third transistor ST3 is embodied as the N-type MOSFET. Thus, a scan signal of a gate high voltage may be applied to the control scan line GCL and the initialization scan line GIL. In contrast, each of the second transistor ST2, the fourth transistor ST4, the fifth transistor ST5, and the sixth transistor ST6 is embodied as the P-type MOSFET. Thus, a scan signal of a low gate voltage may be applied to the write scan line GWL and a light-emission line EL.

Further, it should be noted that the pixel circuit PXC according to one or more embodiments of the present disclosure is not limited to configurations as shown in FIG. 36 to FIG. 38. The pixel circuit PXC according to one or more embodiments of the present disclosure may have other known circuit structures employable by those skilled in the art than the embodiments shown in FIG. 36 to FIG. 38.

In concluding the detailed description, those skilled in the art will appreciate that many variations and modifications can be made to the embodiments of the present disclosure without substantially departing from the scope and principles of the present disclosure. Therefore, the embodiments of the present disclosure are used in a generic and descriptive sense only and not for purposes of limitation.

What is claimed is:

1. A display device comprising:
a first substrate;
a plurality of light-emitting elements on the first substrate and spaced from each other, wherein each of the plurality of light-emitting elements extends in a thickness direction of the first substrate;
a common electrode on the first substrate and the plurality of light-emitting elements;
a first insulating layer on the common electrode and the plurality of light-emitting elements; and
a plurality of first reflective layers on side surfaces of corresponding ones of the plurality of light-emitting elements with the first insulating layer therebetween, the first reflective layer being spaced from the common electrode and the plurality of light-emitting elements with the first insulating layer therebetween,
wherein the common electrode is in contact with a portion of the side surface of each of the plurality of light-emitting elements,
wherein adjacent ones of the plurality of first reflective layers respectively around corresponding adjacent ones of the plurality of light-emitting elements are spaced from each other, and
wherein the common electrode, the first insulating layer, and a first reflective layer of the plurality of first reflective layers partially overlap each other in a first direction perpendicular to the thickness direction of the first substrate.

2. The display device of claim 1, wherein the common electrode acts as a common layer commonly connected to the plurality of light-emitting elements.

3. The display device of claim 1, wherein the common electrode and the plurality of first reflective layers comprise a same material.

4. The display device of claim 1, wherein each of the plurality of light-emitting elements comprises:
a first semiconductor layer;
an active layer on the first semiconductor layer;
a second semiconductor layer on the active layer; and
a third semiconductor layer on the second semiconductor layer.

5. The display device of claim 4, wherein the common electrode is in contact with a side surface of the second semiconductor layer and a side surface of the third semiconductor layer.

6. The display device of claim 4, wherein the first insulating layer is on a side surface of each of the first semiconductor layer, the active layer, the second semiconductor layer, and the common electrode,
wherein the first insulating layer covers at least a portion of the common electrode.

7. The display device of claim 4, further comprising a second substrate opposite to the first substrate,
wherein the second substrate comprises:
a plurality of pixel circuits comprising at least one transistor;
a plurality of pixel electrodes located on and connected to corresponding ones of the plurality of pixel circuits;
a circuit insulating layer located between the plurality of pixel circuits and the plurality of pixel electrodes; and
a plurality of contact electrodes located on corresponding ones of the plurality of the pixel electrodes.

8. The display device of claim 7, further comprising a plurality of connection electrodes, each of the plurality of connection electrodes being located between the first semiconductor layer and a corresponding one of the plurality of contact electrodes,
wherein each of the plurality of contact electrodes is in contact with a corresponding one of the plurality of connection electrodes.

9. The display device of claim 7, further comprising:
a common contact electrode on a pixel electrode of the plurality of pixel electrodes; and
a common connection electrode on the common contact electrode,
wherein the common contact electrode and the common connection electrode are in contact with each other.

10. The display device of claim 1, wherein the first substrate has a plurality of holes defined therein, wherein the plurality of holes respectively overlap the plurality of light-emitting elements.

11. The display device of claim 10, further comprising:
a plurality of wavelength conversion layers respectively located in the plurality of holes; and
a plurality of color filters respectively located on the plurality of wavelength conversion layers.

12. The display device of claim 11, wherein the plurality of holes includes a first hole, a second hole, and a third hole spaced from each other,
wherein the plurality of color filters comprises:
a first color filter to transmit therethrough first light emitted from the plurality of light-emitting elements;
a second color filter to transmit therethrough second light having a wavelength band different from a wavelength band of the first light; and
a third color filter to transmit therethrough third light having a wavelength band different from a wavelength band of each of the first light and the second light.

13. The display device of claim 12, wherein the first color filter overlaps the first hole, the second color filter overlaps the second hole, and the third color filter overlaps the third hole.

14. The display device of claim 12, wherein each of the wavelength conversion layers is configured to convert a portion of the first light into fourth light, and to output fifth light, wherein in each of the plurality of wavelength conversion layers, the first light and the fourth light are mixed with each other to produce the fifth light,
wherein the first color filter is configured to convert the fifth light from the plurality of wavelength conversion layers to the first light,
wherein the second color filter is configured to convert the fifth light from the plurality of the wavelength conversion layers to the second light, and
wherein the third color filter is configured to convert the fifth light from the plurality of the wavelength conversion layers to the third light.

15. The display device of claim 12, wherein the wavelength conversion layers comprise:
a light-transmissive pattern for transmitting the first light therethrough;
a first wavelength conversion pattern for converting the first light to the second light; and
a second wavelength conversion pattern for converting the first light to the third light,
wherein the light-transmissive pattern overlaps the first color filter and is located in the first hole,
wherein the first wavelength conversion pattern overlaps the second color filter and is located in the second hole, and
wherein the second wavelength conversion pattern overlaps the third color filter and is located in the third hole.

16. The display device of claim 11, further comprising a second reflective layer on a side surface of each of the plurality of holes,
wherein the second reflective layer is around each of the wavelength conversion layers.

17. The display device of claim 11, further comprising a first protective layer between the first substrate and the color filters,
wherein one surface of the first protective layer is in contact with the wavelength conversion layers and the first substrate, while an opposite surface of the first protective layer is in contact with the color filters.

18. The display device of claim 11, wherein the plurality of color filters are located in corresponding ones of the plurality of holes.

19. A display device comprising:
a partitioning wall having a plurality of openings defined therein, wherein the plurality of openings define a plurality of light-emitting areas;
a plurality of wavelength conversion layers, each of the plurality of wavelength conversion layers being located in a corresponding one of the plurality of openings;
a plurality of light-emitting elements on the partitioning wall and spaced from each other;
a common electrode on the partitioning wall and the plurality of light-emitting elements;
a first insulating layer on the common electrode and the plurality of light-emitting elements; and
a plurality of first reflective layers on side surfaces of each of the plurality of light-emitting elements with the first insulating layer therebetween, the first reflective layer being spaced from the common electrode and the plurality of light-emitting elements with the first insulating layer therebetween,
wherein the common electrode overlaps the partitioning wall and does not overlap the plurality of openings, and contacts at least a portion of the side surfaces of each of the plurality of light-emitting elements,
wherein adjacent ones of the plurality of first reflective layers respectively around corresponding adjacent ones of the plurality of light-emitting elements are spaced from each other, and
wherein the common electrode, the first insulating layer, and a first reflective layer of the plurality of first reflective layers partially overlap each other in a first direction perpendicular to a thickness direction of the display device.

20. The display device of claim 19, wherein the partitioning wall comprises a metal or an organic insulating material.

21. The display device of claim 19, wherein the common electrode does not overlap the plurality of wavelength conversion layers and is in contact with the partitioning wall.

22. The display device of claim 19, further comprising a plurality of color filters on a surface of the partitioning wall that is opposite to one surface of the partition wall on which the plurality of light-emitting elements are located,
wherein one surface of each of the plurality of wavelength conversion layers is contact with corresponding ones of the plurality of light-emitting elements while an opposite surface of each of the plurality of wavelength conversion layers is in contact with a corresponding ones of the plurality of color filters.

23. The display device of claim 22, wherein each of the plurality of light-emitting elements comprises:
a first semiconductor layer;
an active layer on the first semiconductor layer;
a second semiconductor layer on the active layer; and
a third semiconductor layer on the second semiconductor layer.

24. The display device of claim 23, wherein each of the plurality of wavelength conversion layers is in contact with the third semiconductor layer, wherein the common electrode is in contact with the second semiconductor layer and the third semiconductor layer.

25. An electronic device comprising:
a first substrate;
a plurality of light-emitting elements on the first substrate and spaced from each other, wherein each of the plurality of light-emitting elements extends in a thickness direction of the first substrate;
a common electrode on the first substrate and the plurality of light-emitting elements;
a first insulating layer on the common electrode and the plurality of light-emitting elements; and
a plurality of first reflective layers on side surfaces of corresponding ones of the plurality of light-emitting elements with the first insulating layer therebetween, the first reflective layer being spaced from the common electrode and the plurality of light-emitting elements with the first insulating layer therebetween,
wherein the common electrode is in contact with a portion of the side surface of each of the plurality of light-emitting elements,
wherein adjacent ones of the plurality of first reflective layers respectively around corresponding adjacent ones of the plurality of light-emitting elements are spaced from each other, and wherein the common electrode, the first insulating layer, and a first reflective layer of the plurality of first reflective layers partially overlap each other in a first direction perpendicular to the thickness direction of the first substrate.

* * * * *